US012785050B2

(12) United States Patent
Lee et al.

(10) Patent No.: US 12,785,050 B2
(45) Date of Patent: Nov. 3, 2026

(54) ELECTROSTATIC DEVICE AND OPERATION METHOD THEREFOR

(71) Applicant: INNOVATION FOR CREATIVE DEVICES CO., LTD., Anseong-si (KR)

(72) Inventors: Pyung-Woo Lee, Gwacheon-si (KR); Seungho Lee, Yongin-si (KR); Taeho Shin, Yongin-si (KR); Buil Jeon, Seoul (KR); Dooho Lim, Suwon-si (KR); Jungsu Park, Pyeongtaek-si (KR); Jin Won Kong, Seoul (KR); Bumsoo On, Yongin-si (KR)

(73) Assignee: INNOVATION FOR CREATIVE DEVICES CO., LTD., Anseong-si (KR)

( * ) Notice: Subject to any disclaimer, the term of this patent is extended or adjusted under 35 U.S.C. 154(b) by 163 days.

(21) Appl. No.: 18/788,887

(22) Filed: Jul. 30, 2024

(65) Prior Publication Data

US 2024/0387153 A1 Nov. 21, 2024

Related U.S. Application Data

(63) Continuation of application No. PCT/KR2023/001101, filed on Jan. 25, 2023.

(30) Foreign Application Priority Data

Feb. 8, 2022 (KR) ........................ 10-2022-0015872

(51) Int. Cl.
*H01J 37/32* (2006.01)
*H10P 72/72* (2026.01)

(52) U.S. Cl.
CPC . *H01J 37/32715* (2013.01); *H01J 2237/2007* (2013.01); *H10P 72/722* (2026.01)

(58) Field of Classification Search
CPC ........ H01J 37/32715; H01J 2237/2007; H10P 72/722; H10P 72/00; H10P 72/70; H10P 72/0434; B23Q 3/15; H02N 13/00
(Continued)

(56) References Cited

U.S. PATENT DOCUMENTS 1,143,726 A 6/1915 Riegel
5,903,428 A * 5/1999 Grimard ............... H10P 72/722
279/128
(Continued)

FOREIGN PATENT DOCUMENTS

CN 112018021 A 12/2020
JP 2617044 B2 6/1997
(Continued)

OTHER PUBLICATIONS

International Search Report, International application No. PCT/KR2023/001101; May 8, 2023; Korean Intellectual Property Office, Daejeon, Korea.

*Primary Examiner* — Sreeya Sreevatsa
(74) *Attorney, Agent, or Firm* — Central California IP Group, P.C.; Andrew D. Fortney

(57) ABSTRACT

An electrostatic device according to one embodiment of the present invention comprises: an electrostatic electrode layer; a dielectric layer arranged on the electrostatic electrode layer; and a ring-shaped protrusion part arranged and formed on an edge of the dielectric layer, wherein the protrusion part forms a concave area, the concave area is filled with a cooling gas, and the protrusion part comprises a flat area and a surface treatment area to which a roughening treatment has been performed.

15 Claims, 32 Drawing Sheets

(58) Field of Classification Search
USPC .......................................................... 361/234
See application file for complete search history.

(56) References Cited

U.S. PATENT DOCUMENTS

| | | | | |
|---|---|---|---|---|
| 10,497,598 | B2 | 12/2019 | Cooke et al. | |
| 11,538,714 | B2 | 12/2022 | Chen et al. | |
| 2005/0215073 | A1 | 9/2005 | Nakamura et al. | |
| 2009/0284894 | A1* | 11/2009 | Cooke | H02N 13/00 438/700 |
| 2010/0046134 | A1* | 2/2010 | Mizuno | H02N 13/00 361/234 |
| 2015/0294891 | A1* | 10/2015 | Lin | C23C 16/4581 216/48 |
| 2016/0336210 | A1 | 11/2016 | Cooke et al. | |
| 2020/0040282 | A1 | 2/2020 | Aoki et al. | |
| 2021/0366759 | A1 | 11/2021 | Chen et al. | |

FOREIGN PATENT DOCUMENTS

| | | | |
|---|---|---|---|
| JP | 9-232414 | A | 9/1997 |
| JP | 10-14266 | A | 1/1998 |
| JP | 2001-517872 | A | 10/2001 |
| JP | 2002-231799 | A | 8/2002 |
| JP | 2002-270682 | A | 9/2002 |
| JP | 2004-22889 | A | 1/2004 |
| JP | 2004022888 | A * | 1/2004 |
| JP | 2004-172487 | A | 6/2004 |
| JP | 2005-012144 | A | 1/2005 |
| JP | 2007-207842 | A | 2/2009 |
| JP | 2012-230255 | A | 11/2012 |
| JP | 2013-153171 | A | 2/2015 |
| KR | 10-2006-0044706 | A | 5/2006 |
| KR | 10-2009-0115409 | A | 11/2009 |
| KR | 10-2011-0061506 | A | 6/2011 |
| KR | 10-2016-0118259 | A | 10/2016 |
| KR | 10-2020-0145726 | A | 12/2020 |
| KR | 10-2023-0008862 | A | 1/2023 |
| WO | 2021-236355 | A1 | 11/2021 |

* cited by examiner

Prior Art

ELECTROSTATIC DEVICE AND OPERATION METHOD THEREFOR

CROSS-REFERENCE TO RELATED APPLICATIONS

This application is a continuation of and claims priority to PCT/KR2023/001101 filed on Jan. 25, 2023, which claims priority to Korea Patent Application No. 10-2022-0015872 filed on Feb. 8, 2022, the entireties of which are both hereby incorporated by reference.

TECHNICAL FIELD

The present disclosure relates to an electrostatic device and, more particularly, to an electrostatic device and a method of operating the same.

BACKGROUND ART

Electrostatic chuck (ESC) is a device for adsorbing and fixing a substrate using electrostatic force generated by a difference in electrical potential.

ESCs are mainly employed in substrate processing apparatuses and substrate transport apparatuses.

DISCLOSURE OF THE INVENTION

Technical Problem

An aspect of the present disclosure is to provide an electrostatic device for significantly increasing electrostatic force using a difference in dielectric constant.

An aspect of the present disclosure is to provide an electrostatic device for significantly increasing electrostatic force using a difference in electrical conductivity.

An aspect of the present disclosure is to provide an electrostatic device for significantly reducing interface charges.

Technical Solution

An electrostatic device according to an embodiment of the present disclosure includes: an electrostatic electrode layer; a dielectric layer disposed on the electrostatic electrode layer; and a ring-shaped protrusion part formed on an edge of the dielectric layer. The protrusion part may form a concave area, the concave area may be filled with a cooling gas, and the protrusion part may include a flat area and a surface treatment area to which a roughening treatment has been performed.

In an embodiment of the present disclosure, the flat area may be disposed on an outer side and the surface treatment area may be disposed on an inner side.

In an embodiment of the present disclosure, the flat area may be disposed on an inner side and the surface treatment area may be disposed on the outside In an embodiment of the present disclosure, the flat area may include a first flat area and a second flat area, and the surface treatment area may be disposed between the first flat area and the second flat area.

In an embodiment of the present disclosure, roughness of the surface treatment area may be 0.1 μm to 1 μm.

In an embodiment of the present disclosure, a width of the surface treatment area may be greater than a width of the flat area.

In an embodiment of the present disclosure, a height of the protrusion part may be 5 micrometers to 20 micrometers.

An electrostatic device according to an embodiment of the present disclosure includes: an electrostatic electrode layer; a dielectric layer disposed on the electrostatic electrode layer; a first ring-shaped protrusion part formed on an edge of the dielectric layer; and a second ring-shaped protrusion part further protruding from the first protrusion part. The first protrusion part or the second protrusion part may form a concave area, and the concave area may be filled with a cooling gas.

In an embodiment of the present disclosure, the second protrusion part may be disposed on an outer side to surround the first protrusion part.

In an embodiment of the present disclosure, the first protrusion part may be disposed on an outer side to surround the second protrusion part.

In an embodiment of the present disclosure, the second protrusion part may include a second inner protrusion part and a second outer protrusion part that are spaced apart from each other, and the first protrusion part may be disposed between the second inner protrusion part and the second outer protrusion part.

In an embodiment of the present disclosure, a height of the first protrusion part may be ½ to 19/20 of a height of the second protrusion part.

In an embodiment of the present disclosure, a height of the second protrusion part may be 5 micrometers to 20 micrometers.

An electrostatic device according to an embodiment of the present disclosure includes: an electrostatic electrode layer; a first dielectric layer disposed on the electrostatic electrode layer; and a second dielectric layer having a ring shape and disposed on an edge of the first dielectric layer. The second dielectric layer may form a concave area in the form of an air gap, and the concave area may be filled with a cooling gas.

In an embodiment of the present disclosure, a second dielectric constant of the second dielectric layer may be smaller than a first dielectric constant of the first dielectric layer.

In an embodiment of the present disclosure, second electrical conductivity of the second dielectric layer may be smaller than first electrical conductivity of the first dielectric layer, and the second electrical conductivity of the second dielectric layer may be smaller than electrical conductivity of the air gap.

An electrostatic device according to an embodiment of the present disclosure includes: an electrostatic electrode layer; a dielectric layer disposed on the electrostatic electrode layer; and a light-providing unit providing visible light or ultraviolet light to the dielectric layer.

In an embodiment of the present disclosure, the electrostatic device may include at least one optical fiber disposed in an air gap space through the electrostatic electrode layer and the dielectric layer.

In an embodiment of the present disclosure, the optical fiber may transmit ultraviolet light.

In an embodiment of the present disclosure, a core and cladding of the optical fiber may be formed of quartz.

In an embodiment of the present disclosure, a surface of the dielectric layer, providing a lower surface of the gap space, may be roughened for light diffusion.

An electrostatic device according to an embodiment of the present disclosure includes: an electrostatic electrode layer; a dielectric layer disposed on the electrostatic electrode layer; and a light-providing unit providing ultraviolet light to the dielectric layer. A method of dechucking the electrostatic device comprises: applying a first voltage to the electrostatic electrode layer; removing the first voltage applied to the electrostatic electrode layer; providing light to the dielectric layer through the light-providing unit; and removing charges accumulated on the dielectric layer a rear surface of the substrate disposed on the dielectric layer by the light.

In an embodiment of the present disclosure, the removing the first voltage applied to the electrostatic electrode layer and the providing the light may be simultaneously performed.

In an embodiment of the present disclosure, the light may be provided after removing the first voltage applied to the electrostatic electrode layer.

In an embodiment of the present disclosure, a voltage pulse of opposite polarity and the light may be provided sequentially or simultaneously after removing the first voltage applied to the electrostatic electrode layer.

An electrostatic device according to an embodiment of the present disclosure includes: an electrostatic electrode layer; first and second dielectric layers disposed sequentially on the electrostatic electrode layer; and a power supply applying a voltage to the electrostatic electrode layer. The power supply may apply a first voltage to adsorb a substrate on the second dielectric layer and accumulate a first interface charge between the first dielectric layer and the second dielectric layer. The power supply may apply a second voltage of polarity opposite to the polarity of the first voltage to accumulate interface charge of opposite polarity to the first interface charge and adsorb the substrate.

In an embodiment of the present disclosure, the first voltage and the second voltage are alternately repeated, application time of the first voltage is smaller than a time constant of the first interface charge, and the application time of the first voltage may be the same as application time of the second voltage.

An electrostatic device according to an embodiment of the present disclosure comprises: an electrostatic electrode layer; first and second dielectric layers disposed sequentially on the electrostatic electrode layer; and a power supply applying a voltage to the electrostatic electrode layer. A method of operating the electrostatic device includes: applying a first voltage by the power supply to adsorb a substrate on the second dielectric layer and accumulate a first interface charge between the first dielectric layer and the second dielectric layer; and applying a second voltage of polarity opposite to the polarity of the first voltage to remove the first interface charge accumulated between the first dielectric layer and the second dielectric layer with a charge of opposite polarity.

In an embodiment of the present disclosure, the second dielectric layer may be an air gap.

In an embodiment of the present disclosure, the first voltage and the second voltage may be alternately repeated, and application time of the first voltage may be smaller than a time constant of the first interface charge.

In an embodiment of the present disclosure, application time of the first voltage may be the same as application time of the second voltage, and the time constant of the first interface charge may be 10 seconds or more.

In an embodiment of the present disclosure, at the first voltage, the substrate is charged with a first charge and the first interface charge may be charged with a charge having the same sign as the first charge.

An electrostatic device according to an embodiment of the present disclosure comprises: an electrostatic electrode layer; first and second dielectric layers disposed sequentially on the electrostatic electrode layer; and a power supply applying a voltage to the electrostatic electrode layer. A method of operating the electrostatic device includes: applying a first voltage by the power supply to adsorb a substrate and accumulate a first interface charge between the first dielectric layer and the second dielectric layer; and applying a second voltage of polarity opposite to the polarity of the first voltage to accumulate an interface charge of polarity opposite to the polarity of the first interface charge and adsorb the substrate.

In an embodiment of the present disclosure, application time of the first voltage may be smaller than a time constant of the first interface charge.

In an embodiment of the present disclosure, application time of the first voltage may be the same as application time of the second voltage, and a time constant of the first interface charge may be 10 seconds or more.

In an embodiment of the present disclosure, the first voltage and the second voltage may be alternately repeated.

An electrostatic device according to an embodiment of the present disclosure comprises: an electrostatic electrode layer; a dielectric layer disposed on the electrostatic electrode layer and having a gap space; and a power supply applying a voltage to the electrostatic electrode layer. A method of dechucking the electrostatic device includes: applying a first voltage by the power supply to adsorb a substrate and accumulate a first interface charge between the dielectric layer and the gap space; and applying a second voltage of polarity opposite to polarity of the first voltage to remove the first interface charge between the gap space and the dielectric layer to perform the dechucking.

In an embodiment of the present disclosure, if the first voltage is V0, the second voltage is V1, a relaxation time is r, and the application time of the second voltage is t, then they may be given as follows:

$$t = \tau \ln\left[\frac{V_1 - V_0}{V_1}\right]$$

In an embodiment of the present disclosure, relaxation time defined by resistances and capacitances of the dielectric layer and the gap space may be greater than the application time of the second voltage.

In an embodiment of the present disclosure, an absolute value of the second voltage may be greater than an absolute value of the first voltage.

In an embodiment of the present disclosure, an absolute value of the second voltage may be the same as an absolute value of the first voltage, and the application time of the second voltage may be 0.69 times a characteristic relaxation time defined by the resistance and capacitance of the gap space.

In an embodiment of the present disclosure, an absolute value of the second voltage may be twice an absolute value of the first voltage, and the application time of the second voltage may be 0.40 times a characteristic relaxation time defined by the resistance and the capacitance of the gap space.

In an embodiment of the present disclosure, an absolute value of the second voltage may be three times an absolute value of the first voltage, and the application time of the second voltage may be 0.287 times a characteristic relaxation time defined by the resistance and the capacitance of the gap space.

An electrostatic device according to an embodiment of the present disclosure includes: an electrostatic electrode layer; a dielectric layer disposed on the electrostatic electrode layer and having a gap space; and a power supply applying a voltage to the electrostatic electrode layer. A method of dechucking the electrostatic device includes: applying a first voltage by the power supply to adsorb a substrate and accumulate a first interface charge between the dielectric layer and the gap space; and applying a second voltage, greater than the first voltage, to induce discharge in the gap space to reduce the first interface charge to perform the dechucking.

In an embodiment of the present disclosure, a ratio of electrical conductivity of the gap space to electrical conductivity of the dielectric layer may be greater than a ratio of a dielectric constant of the gap space to a dielectric constant of the dielectric layer.

An electrostatic device according to an embodiment of the present disclosure includes: an electrostatic electrode layer; a dielectric layer disposed on the electrostatic electrode layer; and a power supply applying a voltage to the electrostatic electrode layer. The power supply may apply a first voltage to adsorb a substrate, and the power supply may apply a second voltage of polarity opposite to polarity of the first voltage to perform dechucking.

In an embodiment of the present disclosure, if the first voltage is V0, the second voltage is V1, a relaxation time is r, and an application time of the second voltage is t, then they may be given as follows:

$$t = \tau \ln\left[\frac{V_1 - V_0}{V_1}\right]$$

An electrostatic device according to an embodiment of the present disclosure includes: an electrostatic electrode layer; a first dielectric layer disposed on the electrostatic electrode layer; and a second dielectric layer disposed on the second dielectric layer. The first dielectric layer may have a first dielectric constant and first electrical conductivity, the second dielectric layer may have a second dielectric constant and second electrical conductivity, and a ratio of the second dielectric constant to the first dielectric constant may be the same as a ratio of the second electrical conductivity to the first electrical conductivity.

In an embodiment of the present disclosure, a thickness of the second dielectric layer may be 0.01 to 0.2 with respect to a total thickness of the first dielectric layer and the second dielectric layer.

In an embodiment of the present disclosure, the ratio of the second electrical conductivity to the first electrical conductivity may be less than or equal to 0.5.

An electrostatic device according to an embodiment of the present disclosure comprises: an electrostatic electrode layer; a first dielectric layer disposed on the electrostatic electrode layer; and an air gap formed at the first dielectric layer. The air gap may be filled with a cooling gas, the first dielectric layer may have a first dielectric constant and first electrical conductivity, the cooling gas may have a second dielectric constant and second electrical conductivity, and a ratio of the second dielectric constant to the first dielectric constant may be the same as a ratio of the second electrical conductivity to the first electrical conductivity.

In an embodiment of the present disclosure, a thickness of the air gap may be 0.01 to 0.2 with respect to a total thickness of the first dielectric layer and the air gap.

In an embodiment of the present disclosure, a ratio of the second electrical conductivity to the first electrical conductivity may be less than or equal to 0.5.

An electrostatic device according to an embodiment of the present disclosure includes: an electrostatic electrode layer; a first dielectric layer disposed on the electrostatic electrode layer; a substrate disposed on the first dielectric layer; and a second dielectric layer disposed between a lower surface of the substrate and the first dielectric layer. The first dielectric layer may have a first dielectric constant and first electrical conductivity, the second dielectric layer may have a second dielectric constant and second electrical conductivity, and a ratio of the second dielectric constant to the first dielectric constant may be the same as a ratio of the second electrical conductivity to the first electrical conductivity.

In an embodiment of the present disclosure, a thickness of the second dielectric layer may be 0.01 to 0.2 with respect to a total thickness of the first dielectric layer and the second dielectric layer.

In an embodiment of the present disclosure, a ratio of the second electrical conductivity to the first electrical conductivity may be less than or equal to 0.5.

An electrostatic device according to an embodiment of the present disclosure comprises. an electrostatic electrode layer; a first dielectric layer disposed on the electrostatic electrode layer; a second dielectric layer disposed on the first dielectric layer; a substrate disposed on the second dielectric layer; and a third dielectric layer disposed between a lower surface of the substrate and the second dielectric layer. The first dielectric layer may have a first dielectric constant and first electrical conductivity, the second dielectric layer may have a second dielectric constant and second electrical conductivity, and the third dielectric layer may have a third dielectric constant and third electrical conductivity. A ratio of the second dielectric constant to the first dielectric constant may be the same as a ratio of the second electrical conductivity to the first electrical conductivity.

In an embodiment of the present disclosure, a ratio of the third dielectric constant to the second dielectric constant may be equal to a ratio of the third electrical conductivity to the second electrical conductivity.

An electrostatic device according to an embodiment of the present disclosure includes: an electrostatic electrode layer; a first dielectric layer disposed on the electrostatic electrode layer; a second dielectric layer disposed on the first dielectric layer; a substrate disposed on the second dielectric layer; and a third dielectric layer disposed between a lower surface of the substrate and the second dielectric layer. The first dielectric layer may have a first dielectric constant and first electrical conductivity, the second dielectric layer may have a second dielectric constant and second electrical conductivity, and the third dielectric layer may have a third dielectric constant and third electrical conductivity. A ratio of the third dielectric constant to the second dielectric constant is equal to the ratio of the third electrical conductivity to the second electrical conductivity.

In an embodiment of the present disclosure, the third dielectric layer and the second dielectric layer may have the same dielectric constant and electrical conductivity.

An electrostatic device according to an embodiment of the present disclosure includes: an electrostatic electrode layer; a first dielectric layer disposed on the electrostatic electrode layer; a substrate disposed on the first dielectric layer; and a second dielectric layer disposed between a lower surface of the substrate and the first dielectric layer. The first dielectric layer may have a first dielectric constant and first electrical conductivity, the second dielectric layer may have a second dielectric constant and second electrical conductivity, and an interface surface charge between the first dielectric layer and the second dielectric layer may be 0.1 [Vε2] or less, where V is a voltage applied between the electrostatic electrode layer and the substrate and ε2 is a second dielectric constant of the second dielectric layer.

An electrostatic device according to an embodiment of the present disclosure comprises: an electrostatic electrode layer; a first dielectric layer disposed on the electrostatic electrode layer; a substrate disposed on the first dielectric layer; and a second dielectric layer disposed between a lower surface of the substrate and the first dielectric layer. The first dielectric layer may have a first dielectric constant and first electrical conductivity, the second dielectric layer may have a second dielectric constant and second electrical conductivity, and an electric field of the second dielectric layer may not change over time.

In an embodiment of the present disclosure, a ratio of the second electrical conductivity to the first electrical conductivity may be less than or equal to 0.5, and a ratio of the first dielectric constant to the second dielectric constant may be less than or equal to 0.5.

An electrostatic device according to an embodiment of the present disclosure includes: an electrostatic electrode layer; a first dielectric layer disposed on the electrostatic electrode layer; a temperature controller controlling a temperature of the first dielectric layer; and an air gap formed at the first dielectric layer. The air gap may be filled with a gas, the first dielectric layer may have a first dielectric constant and first electrical conductivity, the gas may have a second dielectric constant and second electrical conductivity, the temperature controller may heat the first dielectric layer in a state in which an external voltage is applied to the electrostatic electrode layer, and the temperature controller may cool the first dielectric layer in the state in which the external voltage is applied to the electrostatic electrode layer.

In an embodiment of the present disclosure, in a cooling operation, a ratio of the second dielectric constant to the first dielectric constant may be equal to a ratio of the second electrical conductivity to the first electrical conductivity.

In an embodiment of the present disclosure, in a heating operation, a ratio of the second dielectric constant to the first dielectric constant may be greater than a ratio of the second electrical conductivity to the first electrical conductivity.

In an embodiment of the present disclosure, the temperature controller may include at least one of a resistive heater, hot air, and an infrared generator.

In an embodiment of the present disclosure, the first dielectric layer may be aluminum oxide containing titanium oxide.

An electrostatic device according to an embodiment of the present disclosure includes: an electrostatic electrode layer; a first dielectric layer having a first dielectric constant and a first electrical conductivity disposed on the electrostatic electrode layer; a second dielectric layer having a second dielectric constant and second electrical conductivity disposed on the first dielectric layer; and a temperature controller controlling a temperature of the first dielectric layer. A method of operating the electrostatic device includes: heating the first dielectric layer such that a ratio of the second dielectric constant to the first dielectric constant is greater than a ratio of the second electrical conductivity to the first electrical conductivity; and cooling the first dielectric layer such that a ratio of the second dielectric constant to the first dielectric constant is equal to a ratio of the second electrical conductivity to the first electrical conductivity.

In an embodiment of the present disclosure, in the heating operation, a voltage may be applied to the electrostatic electrode layer to adsorb the substrate on the second dielectric layer, and in the cooling operation, the voltage may be removed at the electrostatic electrode layer to dechuck the substrate from the second dielectric layer.

In an embodiment of the present disclosure, the second dielectric layer may be an air gap.

An electrostatic device according to an embodiment of the present disclosure includes: an electrostatic electrode layer; a first dielectric layer disposed on the electrostatic electrode layer; a resistance layer disposed on the first dielectric layer; and an air layer disposed on the resistance layer, a protrusion part formed on the first dielectric layer may form the air layer between an adsorbate and the first dielectric layer, and the resistance layer may have an electrical conductivity increased by light.

In an embodiment of the present disclosure, the resistance layer may be CdS.

In an embodiment of the present disclosure, the resistance layer may be connected to ground through a switch.

In an embodiment of the present disclosure, the electrostatic device may further include a light source providing light to the resistance layer.

An electrostatic device according to an embodiment of the present disclosure includes: a first electrode provided with a first voltage; a second electrode provided with a second voltage; a first dielectric layer disposed on the first electrode and the second electrode; a first conductive layer disposed on the first dielectric layer in a location corresponding to the first electrostatic electrode; and a second conductive layer disposed on the first dielectric layer in a location corresponding to the second electrostatic electrode.

In an embodiment of the present disclosure, the first conductive layer and the second conductive layer may be electrically connected to each other.

In an embodiment of the present disclosure, the electrostatic device may further include a resistance layer connecting the first conductive layer and the second conductive layer, and the resistance layer may have an electrical conductivity increased by light.

In an embodiment of the present disclosure, the electrostatic device may include an air layer is disposed on the first conductive layer and the second conductive layer, a protrusion part formed on the first dielectric layer may form an air layer between an adsorbate and the first dielectric layer, and the resistance layer may have an electrical conductivity increased by light.

An electrostatic device according to an embodiment of the present disclosure includes: an electrostatic electrode layer; a first dielectric layer disposed on the electrostatic electrode layer; a conductive layer disposed on the first dielectric layer; and an air layer disposed on the conductive layer. A protrusion part formed on the first dielectric layer may form an air layer between an adsorbate and the first dielectric layer.

In an embodiment of the present disclosure, the conductive layer may be electrically connected to a conductive material coated on an inner side of a flow path penetrating through the first dielectric layer supplying a cooling gas to the air layer.

In an embodiment of the present disclosure, the conductive layer may be exposed to the air layer.

In an embodiment of the present disclosure, the conductive layer may be selectively connected to ground through a switch.

An electrostatic device according to an embodiment of the present disclosure includes: an electrostatic electrode layer; a dielectric layer disposed on the electrostatic electrode layer; a protrusion part and a concave area formed on the dielectric layer; and a conductive layer formed on a lower surface of the concave area. A method of operating the electrostatic device includes: applying a first voltage by a power supply to adsorb a substrate onto the dielectric layer; and removing the first voltage and then grounding the conductive layer to remove the interface charge accumulated on the conductive layer and dechuck the substrate.

In an embodiment of the present disclosure, the method may further include applying a second voltage of polarity opposite to polarity of the first voltage by the power supply to remove the interface charge.

An electrostatic device according to an embodiment of the present disclosure includes: an electrostatic electrode layer; a first dielectric layer disposed on the electrostatic electrode layer; and a second dielectric layer disposed on the first dielectric layer. The first dielectric layer may have a first dielectric constant and first electrical conductivity. The second dielectric layer may have a second dielectric constant ε2 and a second electrical conductivity ρ2, a ratio of the second electrical conductivity to the first electrical conductivity may be less than a ratio of the second dielectric constant to the first dielectric constant, the ratio of the second dielectric constant to the first dielectric constant may be less than or equal to 0.1, and the ratio of the second electrical conductivity to the first electrical conductivity may be less than or equal to 0.1.

In an embodiment of the present disclosure, the second electrical conductivity may be a reciprocal of resistivity, and second resistivity that is a reciprocal of the second electrical conductivity may be less than or equal to 10^2 Ωm.

In an embodiment of the present disclosure, a thickness of the second dielectric layer may be 0.01 to 0.2 with respect to a total thickness of the first dielectric layer and the second dielectric layer.

In an embodiment of the present disclosure, the ratio of the second electrical conductivity to the first electrical conductivity may be less than or equal to 0.01.

In an embodiment of the present disclosure, relaxation time may be less than or equal to 0.5 [2ρ2].

In an embodiment of the present disclosure, the second dielectric layer may be an air gap.

Advantageous Effects

The present disclosure may provide an electrostatic device for significantly increasing electrostatic force using a difference in dielectric constant.

The present disclosure may provide an electrostatic device for significantly increasing electrostatic force using a difference in electrical conductivity.

The present disclosure may provide an electrostatic device for significantly reducing interface charges.

MODE FOR CARRYING OUT THE INVENTION

Figure 1:
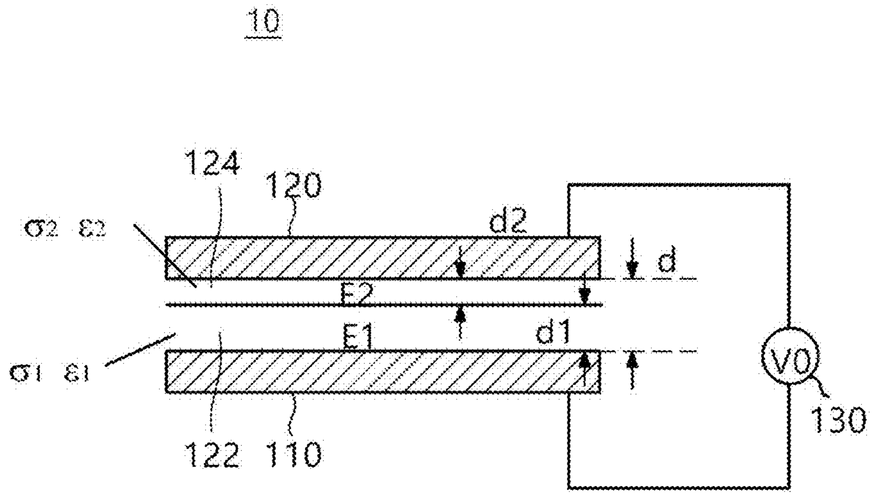
FIG. 1 is a conceptual diagram illustrating a basic structure of an electrostatic device according to an embodiment of the present disclosure.

The present discloses provides an electrostatic device for increasing electrostatic force, changing interface charge density, and adjusting relaxation time. A substrates or an adsorbate may include a semiconductor wafer, a glass substrate, a plastic substrate, or a metal substrate. A dielectric substrate may have one surface on which a conductive layer is coated. In the present disclosure, an air gap may include atmospheric air, low-pressure gas, or an extreme vacuum state Hereinafter, example embodiments will now be described more fully with reference to the accompanying drawings, in which some example embodiments are shown. Example embodiments may, however, be embodied in many different forms and should not be construed as being limited to the embodiments set forth herein. Rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements.

An operation principle of an electrostatic device having a double structure according to an embodiment of the present disclosure will be described.

FIG. 1 is a conceptual diagram illustrating a basic structure of an electrostatic device according to an embodiment of the present disclosure.

Referring to FIG. 1, a first dielectric layer 122 and a second dielectric layer 124 may be stacked between a first electrode 110 and a second electrode 120.

A first region may be formed by the first dielectric layer 122, and may have a first dielectric constant ε1, a first electrical conductivity σ1, and a thickness d1. The second region may be formed by the second dielectric layer 124, and may have a second dielectric constant ε2, a second electrical conductivity σ2, and a thickness d2.

A power supply 130 may apply a voltage between a first electrode and a second electrode. The power supply may be a DC power supply, a DC pulse power supply, an AC power supply, or a DC-biased AC power supply.

The first electrode 110 may an electrostatic electrode for providing electrostatic force, and the second electrode 120 may be a substrate, a conductive adsorbate, or a conductive layer coated on an adsorbate. The first electrode 110 may be a conductor or a semiconductor. The second electrode 120 may be a conductive substrate or a semiconductor substrate. The conductive layer may be a conductor or a semiconductor.

When the first electrical conductivity σ1 and the second electrical conductivity σ2 are ignored, electric fields E1 and E2 in the first and second regions are given as follows.

$$E_1 = \frac{\varepsilon_2 V_0}{(\varepsilon_1 d_2 + \varepsilon_2 d_1)};\ E_2 = \frac{\varepsilon_1 V_0}{(\varepsilon_1 d_2 + \varepsilon_2 d_1)} \quad \text{[Equation 1]}$$

where $V_0$ is a potential difference applied between the first electrode 110 and the second electrode 120.

An electrostatic pressure f of the second electrode, generated the second region, is given as follows.

$$f = \frac{1}{2}\varepsilon_2 E_2^2 \quad \text{[Equation 2]}$$

When the first electrical conductivity σ1 and the second electrical conductivity σ2 are taken into consideration, the electric fields E1 in the first region and the electric field E2 in the second region are given in a steady state, as follows.

$$E_1 = \frac{\sigma_2 V_0}{(\sigma_1 d_2 + \sigma_2 d_1)};\ E_2 = \frac{\sigma_1 V_0}{(\sigma_1 d_2 + \sigma_2 d_1)} \quad \text{[Equation 3]}$$

An interface surface charge density psi between the first region and the second region in the steady state is given as follows.

$$\rho_{si} = \frac{(\varepsilon_2\sigma_1 - \varepsilon_1\sigma_2)V_0}{(\sigma_1 d_2 + \sigma_2 d_1)} \quad \text{[Equation 4]}$$

An electrostatic pressure f of the second electrode in the second region is given as follows.

$$f = \frac{1}{2}\varepsilon_2 E_2^2 \quad \text{[Equation 5]}$$

The first electric field E1 in the first region and the second electric field E2 in the second region are given depending on time in a transient state, as follows.

$$E_1(t) = \frac{-d_2\rho_{si}(t) + \varepsilon_2 V_0}{(\varepsilon_1 d_2 + \varepsilon_2 d_1)}; \quad E_2(t) = \frac{d_1\rho_{si}(t) + \varepsilon_1 V_0}{(\varepsilon_1 d_2 + \varepsilon_2 d_1)} \qquad \text{[Equation 6]}$$

That is, an electric field is determined by a dielectric constant in the initial state, determined by a dielectric constant and a surface charge density in the transient state, and determined by electrical conductivity alone in the steady state.

The interface surface charge density psi may be given in the transient state, as follows.

$$\rho_{si}(t) = \frac{(\varepsilon_2\sigma_1 - \varepsilon_1\sigma_2)V_0}{(\sigma_1 d_2 + \sigma_2 d_1)}\left(1 - e^{-t/\tau}\right) \qquad \text{[Equation 7]}$$

$$\tau = \frac{(\varepsilon_1 d_2 + \varepsilon_2 d_1)}{(\sigma_1 d_2 + \sigma_2 d_1)}$$

where τ is a relaxation time or a time constant.

[Temperature Dependence of Dielectric Constant]

A dielectric constant of a dielectric material may increase depending on a temperature. As the dielectric constant changes depending on the temperature, an electric field may change and electrostatic force may change depending on the temperature.

[Temperature Dependence of Resistivity]

A resistivity of a dielectric material may decrease depending on temperature. Electrostatic force may change depending on the temperature.

[Change in Resistivity Depending on Composition]

For example, alumina may be formed by adding TiO2, and the resistivity may change depending on the amount of $TiO_2$ added. The first dielectric layer 122 may be a high-dielectric material such as alumina, and the second dielectric layer 124 may be a low-dielectric material such as an air gap.

The first dielectric layer 122 may include at least one of aluminum oxide, aluminum nitride, magnesium oxide, iridium oxide, tantalum oxide, hafnium oxide (HfO2), zirconium oxide ($ZrO_2$), barium oxide, and titanium oxide.

The second dielectric layer 124 has a second dielectric constant. The second dielectric layer 124 may be a low-dielectric material. The second dielectric layer may include at least one of a vacuum layer, a gas layer, an air layer, silicon oxide, silicon nitride, silicon oxynitride, polyimide, poly(arylene ether) (PAE), cyclobutane derivative, polysilsesquioxane, fluorinated amorphous carbon, Xorogel, and nanoporous organic silicate.

[Electric Field in Second Region According to Dielectric Constant Ratio Ignoring Resistivity]

Figure 2:
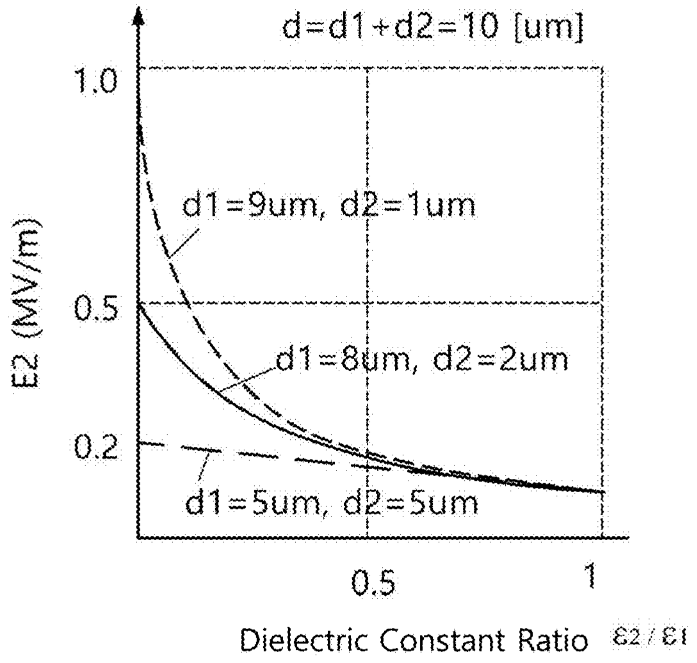
FIG. 2 is a diagram illustrating an electric field in a second region of an electrostatic device according to an embodiment of the present disclosure.

FIG. 2 is a diagram illustrating an electric field in a second region of an electrostatic device according to an embodiment of the present disclosure.

FIG. 2 illustrates a total thickness d is 10 μm, and an electric field E2 of a second region for different dielectric constant ratios ε2/ε1 for the cases in which a thickness d2 of the second dielectric layer 124 is of 1 μm, 2 μm, and 5 μm. When the dielectric constant ratio ε2/ε1 is less than or equal to 0.5, the electric field E2 of the second region may increase rapidly. The smaller the thickness d2 of the second dielectric layer 124, the smaller the dielectric constant ratio ε2/ε1 and the greater the magnitude of the electric field E2. Accordingly, the electrostatic force increases. The second dielectric layer 124 may be air or vacuum to significantly increase the dielectric constant ratio.

[Electric Field in Second Region According to Thickness of Second Dielectric Layer Ignoring Resistivity]

Figure 3:
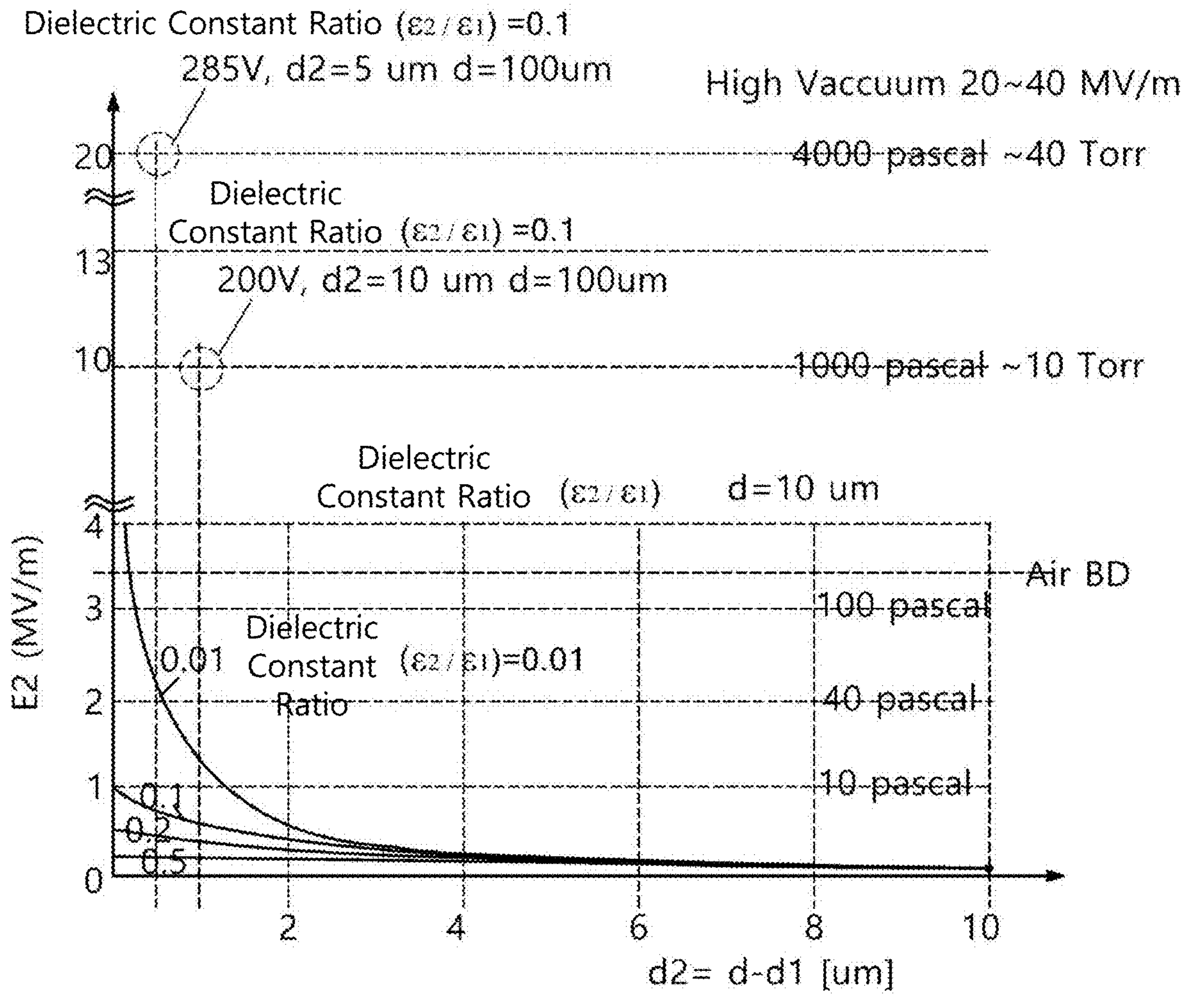
FIG. 3 is a diagram illustrating an electric field in a second region of an electrostatic device according to an embodiment of the present disclosure.

FIG. 3 illustrates an electric field in a second region of an electrostatic device according to an embodiment of the present disclosure.

FIG. 3 illustrates a magnitude of an electric field E2 of a second region depending on a thickness d2 of a second dielectric layer 124 when a dielectric constant ratio ε2/ε1 is 0.01, 0.1, 0.2, and 0.5. When a thickness ratio d2/d of the second dielectric layer is 0.4 or less (4 μm when the total thickness is 10 μm), the magnitude of the electric field E2 of the second region may increase rapidly. Preferably, the thickness ratio d2/d of the second dielectric layer may be 0.2 or less. For example, when the dielectric constant ratio ε2/ε1 is 0.1, the magnitude of the electric field E2 of the second region may increase by a factor of 10 as the thickness d2 of the second dielectric layer decreases to 0. That is, the smaller the thickness d2 of the second dielectric layer, the greater the magnitude of the electric field E2 of the second region.

The magnitude of the electric field E2 of the second region may be less than a dielectric breakdown field. For example, when the second dielectric layer 124 is air at atmospheric pressure, the breakdown field may be about 3 MV/m.

For example, when the second dielectric layer 124 is an ultra-high vacuum layer, the breakdown field may be about 20 MV/m.

For example, when the dielectric constant ratio ε2/ε1 is 0.1 and the second dielectric layer 124 is a vacuum layer, an electric field of 10 MV/m may be required in the second region to achieve an electrostatic pressure of about 10 Torr. When the total thickness d is 100 μm and the thickness d2 of the second dielectric layer 124 is 10 μm, a voltage of about 200 V may be required.

When the dielectric constant ratio ε2/ε1 is 0.1 and the second dielectric layer 124 is a vacuum layer, an electric field of 20 MV/m may be required in the second region to achieve an electrostatic pressure of about 40 Torr. When the total thickness d is 100 μm and the thickness d2 of the second dielectric layer 124 may be 10 μm, a voltage of about 285 V may be required.

Even if the thickness d2 of the second dielectric is reduced when the dielectric constant ratio ε2/ε1 is 0.1, the second electric field E2 does not increase infinitely and converges to a constant value. Accordingly, when the dielectric constant ratio ε2/ε1 is 0.1 or more and a thickness ratio d2/d of the second dielectric layer is 0.05 or less, the second electric field E2 may be almost constant.

When the first dielectric constant ε1 of the first dielectric layer 122 is greater than the second dielectric constant ε2 of the second dielectric layer 124 and when the second dielectric layer 124 replaces part of the first dielectric layer 122, the electrostatic force may increase compared to the case in which the first dielectric layer is alone. However, the thickness d2 of the second dielectric layer may be less than a certain value for the given total thickness d, as follows.

$$d_2 = \frac{d\sqrt{\varepsilon_2}}{\sqrt{\varepsilon_1} + \sqrt{\varepsilon_2}} \qquad \text{[Equation 8]}$$

en the relative dielectric constant of the first dielectric layer is 10 and the relative dielectric constant of the second dielectric layer is 1, the thickness d2 of the second dielectric layer may be 0.25 d.

When the resistivity is ignored, it may be substantially difficult to achieve a dielectric constant ratio ε2/ε1 of 0.01 or more. Accordingly, the thickness of the second dielectric layer may be reduced to increase the magnitude of the second electric field E2.

Characteristics of the case, in which the resistivity is taken into consideration, will now be described.

[Electric Field According to Conductivity Ratio Considering Resistivity]

Figure 4:
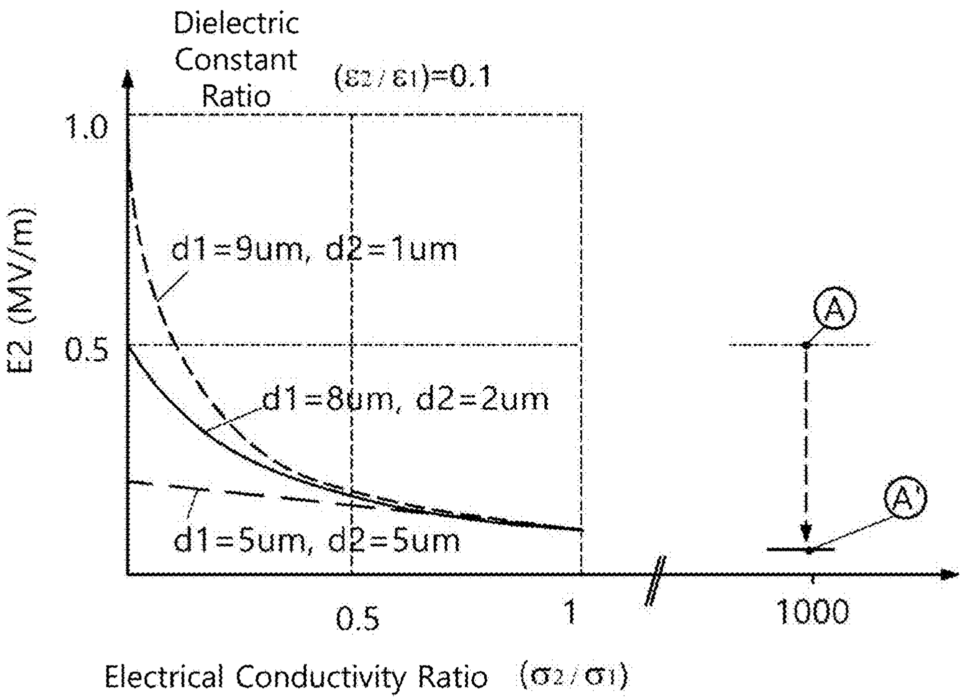
FIG. 4 is a diagram illustrating an electric field in a second region of an electrostatic device according to an embodiment of the present disclosure.

FIG. 4 is a diagram illustrating an electric field in a second region of an electrostatic device according to an embodiment of the present disclosure.

Referring to FIG. 4, a first dielectric layer 122 has a first dielectric constant ε1 and first electrical conductivity 61, and the second dielectric layer 124 has a second dielectric constant ε2 and second electrical conductivity σ2. In a steady state, an electric field E2 of a second region does not depend on a dielectric constant but depends only on electrical conductivity.

For a case in which a total thickness d is 10 μm and a thickness d2 of a second dielectric layer is 1 μm, 2 μm, and 5 μm, the electric field E2 of the second dielectric layer is illustrated for different conductivity ratios σ2/σ1. In the case in which the dielectric constant ratio ε2/ε1 is 0.1, the electric field of the second region may increase rapidly when the conductivity ratio σ2/σ1 is 0.5 or less. The smaller the thickness of the second dielectric layer, the smaller the conductivity ratio σ2/σ1 and the greater the magnitude of the second electric field E2. Accordingly, the electrostatic force may increase.

When an external voltage is applied between the first electrode and the second electrode, an initial second electric field is determined by a dielectric constant (a dielectric constant ratio=0.1) at point A. Then, due to a conductivity ratio (σ2/σ1=1,000) resulting from the first dielectric layer and the second dielectric layer, the second electric field E2 may reach a steady state and may reach a new second electric field E2 at point A'. Accordingly, a relaxation time may be preferably large enough to use a high second electric field.

In the steady state, the conductivity ratio σ2/σ1 may be 0.5 or less to increase the second electric field E2. Preferably, the conductivity ratio σ2/σ1 may be 0.1 or less.

On the other hand, when the conductivity ratio σ2/σ1 is small, less than 0.1, the relaxation time be preferably small enough to use a high second electric field.

[Electric Field According to Thickness Considering Resistivity]

Figure 5:
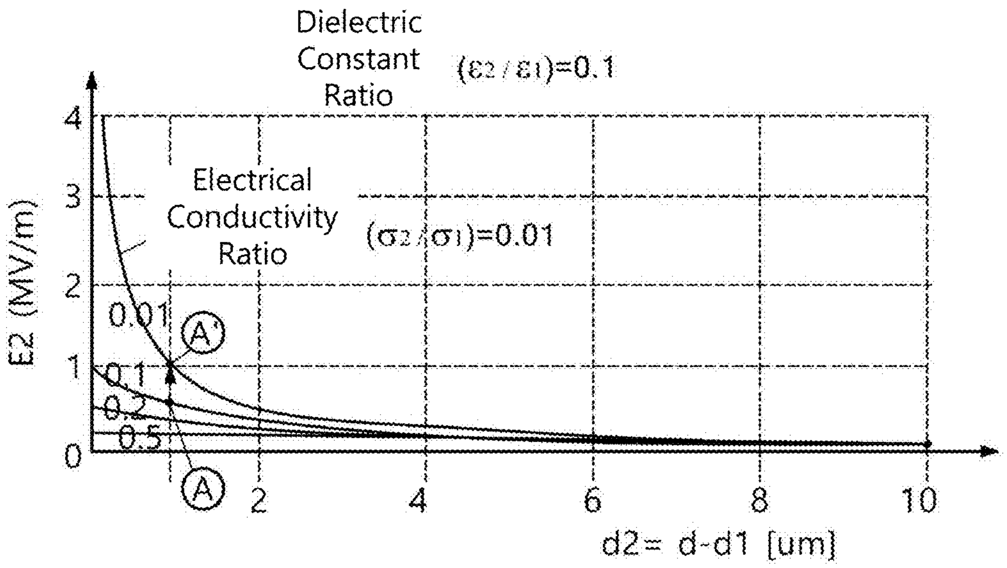
FIG. 5 is a diagram illustrating an electric field in a second region of an electrostatic device according to an embodiment of the present disclosure.

FIG. 5 is a diagram illustrating an electric field in a second region of an electrostatic device according to an embodiment of the present disclosure.

FIG. 5 illustrates a magnitude of an electric field E2 of a second region depending on a thickness d2 of the second dielectric layer 124 for cases in which a conductivity ratio σ2/σ1 is 0.01, 0.1, 0.2, and 0.5. A dielectric constant ratio ε2/ε1 is 0.1. When a thickness ratio d2/d of the second dielectric layer 124 is 0.4 (a total thickness d is 10 μm, d2=4 μm) or less, the magnitude of the electric field E2 of the second region may increase rapidly. The thickness ratio d2/d of the second dielectric may be preferably 0.2 (2 μm) or less.

For example, when the conductivity ratio σ2/σ1 is 0.1, the magnitude of the electric field E2 of the second region may increase by a factor of 10 as the thickness d2 of the second dielectric decreases to 0. However, when the conductivity ratio σ2/σ1 is 0.1, the magnitude of the electric field may not change significantly when the thickness ratio d2/d of the second dielectric is less than 0.05.

A conductivity ratio σ2/σ1 of 0.1 or less may be easily achieved. For example, adding impurities to the first dielectric layer may lead to a change in electrical conductivity of the first dielectric layer.

For example, when the conductivity ratio σ2/σ1 is 0.01, the magnitude of the electric field may change significantly when the thickness ratio d2/d of the second dielectric is less than 0.05.

Point A is the magnitude of the electric field determined by the dielectric constant ratio (0.1) immediately after the external voltage is applied. Point A' is the magnitude of the electric field determined by the conductivity ratio in the steady state. A transition from the initial state A to the steady state A' may be determined by a relaxation time. The relaxation time may be within a few seconds. Preferably, the relaxation time be within a few hundred milliseconds.

The second dielectric layer 124 may be an air gap (or a vacuum gap), and a thickness d2 of the air gap may be 0.01 to 0.2 with respect to a total thickness of the first dielectric layer and the air gap.

When a high electric field (or electrostatic force) intends to be obtained using the conductivity ratio σ2/σ1, the conductivity ratio σ2/σ1 may be less than the dielectric constant ratio. Additionally, the thickness ratio d2/d of the second dielectric layer may be less than 0.1.

The conductivity ratio σ2/σ1 may be less than 0.01, and the thickness ratio d2/d of the second dielectric layer may be less than 0.1. However, the magnitude of the second electric field E2 may be significantly sensitive to the thickness ratio d2/d of the second dielectric layer. A high second electric field may exceed the dielectric breakdown field. Accordingly, it may not be preferable that the thickness ratio d2/d of the second dielectric layer is less than 0.01.

[Interface Surface Charge Density According to Conductivity Ratio Considering Resistivity]

Figure 6:
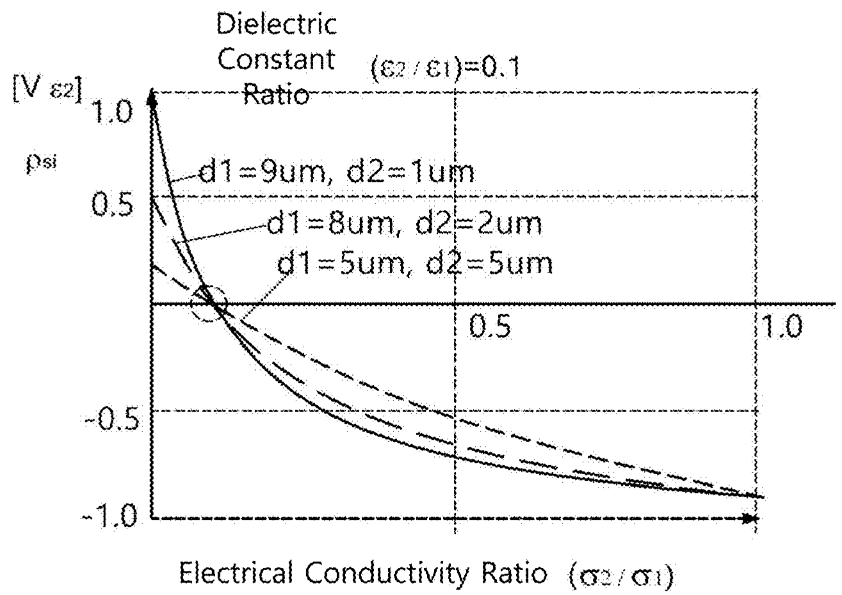
FIG. 6 is a diagram illustrating an interface surface charge density of the electrostatic device according to an embodiment of the present disclosure.

FIG. 6 is a diagram illustrating an interface surface charge density of the electrostatic device according to an embodiment of the present disclosure.

Referring to FIG. 6, an interface surface charge density psi may depend on a conductivity ratio σ2/σ1 in a steady state. FIG. 6 illustrates a conductivity ratios σ2/σ1 according to an electrical conductivity ratio σ2/σ1 for cases in which a total thickness d is 10 m and a thickness d2 of a second dielectric layer 124 is 1 μm, 2 μm, and 5 μm. A dielectric constant ratio ε2/ε1 is 0.1.

A unit of the interface surface charge density psi may be represented as the product of an applied voltage V and a second dielectric constant of the second dielectric layer.

The first electrode may be charged with a positive voltage, and the second electrode may be grounded. In this case, the interface surface charge density psi between the first dielectric layer and the second dielectric layer may increase rapidly to a positive value when the conductivity ratio σ2/σ1 is less than 0.1. On the other hand, when the conductivity ratio σ2/σ1 is 0.1 or more, the interface surface charge density psi may increase slowly to a negative value.

Conventionally, when the second electrode is grounded and a positive voltage is applied to the first electrode, it is known that the interface surface charge density ρsi has a positive value. However, according to the present disclosure, a sign of the interface surface charge density ρsi may depend on the dielectric constant ratio and the conductivity ratio.

When the conductivity ratio σ2/σ1 is 0.1 and the dielectric constant ratio ε2/ε1 is 0.1, the interface surface charge density ρsi is zero. Such a condition is a condition in which the interface surface charge is not accumulated, and may be used for fast dechucking. Additionally, since the interface surface charge density $\rho si$ is zero, the second electric field E2 may not change over time.

The smaller the thickness d2 of the second dielectric layer 124 and the smaller the conductivity ratio $\sigma2/\sigma1$, the greater the interface surface charge density $\rho si$ may increase to a positive value. When an external voltage is removed, the interface surface charge density $\rho si$ may be discharged to the outside with a characteristic time constant (or relaxation time).

According to an embodiment of the present disclosure, when the conductivity ratio $\sigma2/\sigma1$ is equal to the dielectric constant ratio $\varepsilon2/\varepsilon1$, the interface surface charge density $\rho si$ is zero. Therefore, the interface surface charge does not need to be separately removed.

Referring to FIGS. 1 and 6, the electrostatic device 10 may include an electrostatic electrode layer 110; a first dielectric layer 122 disposed on the electrostatic electrode layer; and a second dielectric layer 124 disposed on the first dielectric layer 122. The first dielectric layer 122 may have a first dielectric constant $\varepsilon1$ and first electrical conductivity 61, the second dielectric layer 124 may have a second dielectric constant $\varepsilon2$ and second electrical conductivity $\sigma2$, and a ratio of the second dielectric constant to the first dielectric constant $\varepsilon2/\varepsilon1$ may be equal to a ratio of the second electrical conductivity to the first electrical conductivity $\sigma2/\sigma1$.

The thickness d2 of the second dielectric layer 124 may be 0.01 to 0.2 with respect to the total thickness d of the first dielectric layer and the second dielectric layer. That is, the thickness ratio d2/d may be 0.01 to 0.2. The ratio of the second electrical conductivity to the first electrical conductivity may be 0.5 or less.

Referring to FIGS. 1 and 6, the electrostatic device 10 may include an electrostatic electrode layer 110; a first dielectric layer 122 disposed on the electrostatic electrode layer; and an air gap 124 formed at the first dielectric layer. The air gap may be filled with gas, the first dielectric layer 122 may have a first dielectric constant $\varepsilon1$ and first electrical conductivity 61, the gas may have a second dielectric constant $\varepsilon2$ and second electrical conductivity $\sigma2$, and a ratio of the second dielectric constant to the first dielectric constant $\varepsilon2/\varepsilon1$ may be equal to a ratio of the second electrical conductivity to the first electrical conductivity $\sigma2/\sigma1$.

A thickness of the air gap may be 0.01 to 0.2 with respect to a total thickness of the first dielectric layer and the air gap. The ratio of the second electrical conductivity to the first electrical conductivity may be 0.5 or less.

Referring to FIGS. 1 and 6, the electrostatic device 10 may include an electrostatic electrode layer 110; a first dielectric layer 122 disposed on the electrostatic electrode layer; a substrate 120 disposed on the first dielectric layer; and a second dielectric layer 124 disposed between a lower surface of a substrate and the first dielectric layer. The first dielectric layer may have a first dielectric constant $\varepsilon1$ and first electrical conductivity 61, the second dielectric layer may have a second dielectric constant $\varepsilon2$ and second electrical conductivity $\sigma2$, and a ratio of the second dielectric constant to the first dielectric constant $\varepsilon2/\varepsilon1$ may be equal to a ratio of the second electrical conductivity to the first electrical conductivity $\sigma2/\sigma1$.

A thickness d2 of the second dielectric layer may be 0.01 to 0.2 with respect to a total thickness d of the first dielectric layer and the second dielectric layer. A ratio of the second electrical conductivity to the first electrical conductivity may be 0.5 or less.

[Interface Charge According to Thickness Considering Resistivity]

Figure 7:
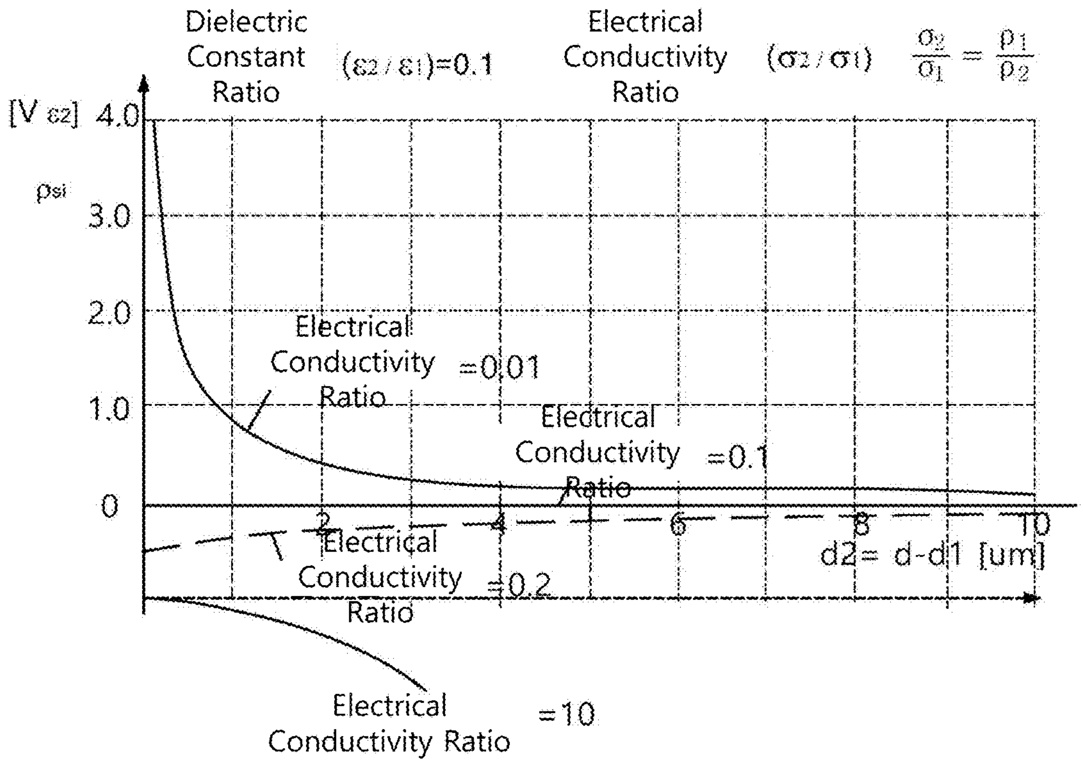
FIG. 7 is a diagram illustrating an interface surface charge density of the electrostatic device according to an embodiment of the present disclosure.

FIG. 7 is a diagram illustrating an interface surface charge density of the electrostatic device according to an embodiment of the present disclosure.

FIG. 7 illustrates an interface surface charge density $\rho si$ depending on a thickness d2 of a second dielectric layer 124 for cases in which a conductivity ratio $\sigma2/\sigma1$ is 0.01, 0.1, 0.2, and 10. A dielectric constant ratio $\varepsilon2/\varepsilon1$ is 0.1.

When the conductivity ratio $\sigma2/\sigma1$ is 0.01 (i.e., less than the dielectric constant ratio $\varepsilon2/\varepsilon1$), the interface surface charge density $\rho si$ may increase rapidly as a thickness ratio d2/d of the second dielectric decreases to 0.4 (4 μm) or less.

When the conductivity ratio $\sigma2/\sigma1$ is 0.1 (i.e., equal to the dielectric constant ratio), the interface surface charge density $\rho si$ may be zero. When the interface surface charge density $\rho si$ is zero, there is no residual interface surface charge density even if the external voltage is removed. Accordingly, there is no charge to escape from an interface.

When the conductivity ratio $\sigma2/\sigma1$ is 0.2 (i.e., greater than the dielectric constant ratio), the interface surface charge density $\rho si$ may have a negative value.

The thickness d2 of the second dielectric layer may be 0.01 to 0.2 with respect to the total thickness d of the first dielectric layer and the second dielectric layer.

[Relaxation Time According to Resistivity Ratio ($\rho\mathbf{2}/\rho\mathbf{1}=\sigma1/\sigma2$) Considering Resistivity]

Figure 8:
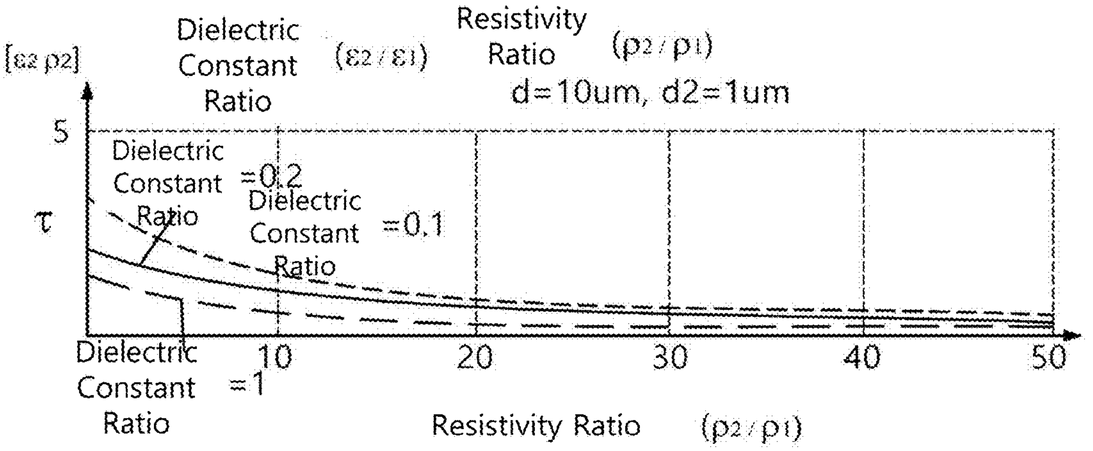
FIG. 8 is a diagram illustrating a relaxation time τ of an electrostatic device according to an embodiment of the present disclosure.

FIG. 8 is a diagram illustrating a relaxation time $\tau$ of an electrostatic device according to an embodiment of the present disclosure.

FIG. 8 illustrates a relaxation time (or a time constant r) depending on a resistivity ratio ($\rho2/\mu1=\sigma1/\sigma2$) for a case in which a total thickness d is 10 μm and a thickness d2 of a second dielectric layer 124 is 1 μm. A dielectric constant ratio $\varepsilon2/\varepsilon1$ may be 0.1. The relaxation time may decrease as the dielectric constant ratio $\varepsilon2/\varepsilon1$ decreases. Additionally, the relaxation time may decrease as the resistivity ratio $\rho2/\rho1$ increases. A unit of the relaxation time is represented as the product of a second dielectric constant $\varepsilon2$ and second resistivity $\rho2$.

The relaxation time may decrease as the resistivity ratio increases. For Johnson-Rahbek type having a high resistivity ratio of 10 or more, the relaxation time may decrease. On the other hand, for Coulomb type having a low resistivity ratio of 10 or less, the relaxation time may increase. For the Johnson-Rahbek type, the relaxation time may be preferably short to achieve a high electric field in the steady state. On the other hand, for the Coulomb type, the relaxation time may be preferably long enough because a low electric field is reached in the steady state.

[Relaxation Time According to Thickness Considering Resistivity]

Figure 9:
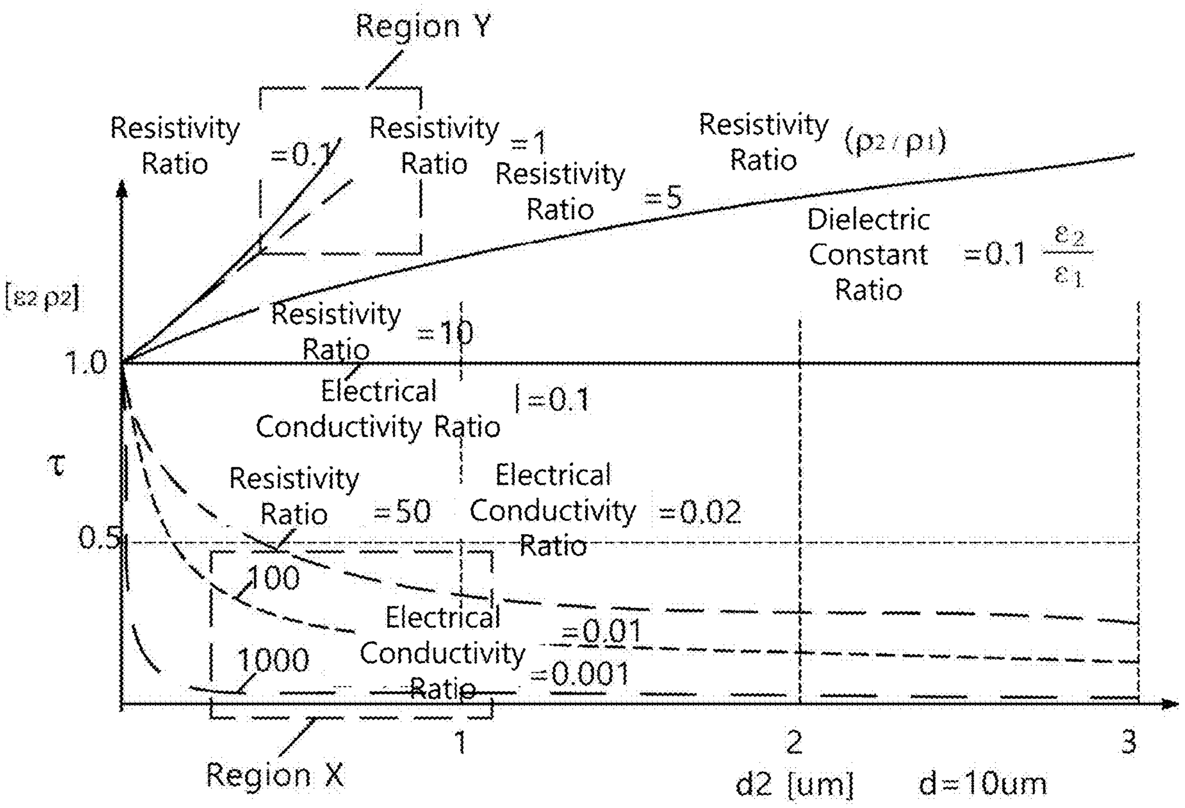
FIG. 9 is a diagram illustrating a relaxation time τ of an electrostatic device according to an embodiment of the present disclosure.

FIG. 9 is a diagram illustrating a relaxation time $\tau$ of an electrostatic device according to an embodiment of the present disclosure.

FIG. 9 illustrates a relaxation time (or a time constant) depending on a resistivity ratio ($\rho2/\rho1=\sigma1/\sigma2$). A dielectric constant ratio $\varepsilon2/\varepsilon1$ is fixed to be 0.1. The relaxation time may decrease as the resistivity ratio $\rho2/\rho1$ increases.

When the resistivity ratio $\rho2/\rho1$ is 10 (a conductivity ratio is 0.1), the relaxation time $\tau$ may be constant without depending on a thickness d2 of a second dielectric.

When the resistivity ratio $\rho2/\rho1$ is 10 or less, the relaxation time $\tau$ may increase with the thickness d2 of the second dielectric.

When the resistivity ratio $\rho2/\rho1$ is greater than 10, the relaxation time $\tau$ may decrease with the thickness d2 of the second dielectric.

When the conductivity ratio $\sigma2/\sigma1$ decreases to 0.1 or less (Johnson-Rahbek type), the relaxation time may decrease and the interface charge density may increase. In addition, a magnitude of the second electric field E2 may increase. The relaxation time may depend on a second resistivity and second dielectric constant of a second dielectric layer. For example, in region X of FIG. 9, the thickness ratio d2/d of the second dielectric layer may be 0.01 to 0.1 to reduce the relaxation time when the relaxation time is taken into consideration.

When the conductivity ratio $\sigma2/\sigma1$ increases to 0.1 or more (Coulomb type), the relaxation time may increase, the interface charge density may increase to a negative value, and the magnitude of the second electric field E2 may decreases over time. Accordingly, the relaxation time may be preferably long enough to maintain the high electric field of the initial state. The relaxation time may depend on the second resistivity and second dielectric constant of the second dielectric layer. For example, in region Y of FIG. 9, the thickness ratio d2/d of the second dielectric layer may be 0.01 or more when the relaxation time and the magnitude of the second electric field are taken into consideration. Preferably, the thickness ratio d2/d of the second dielectric layer may be 0.01 to 0.1. However, when the relaxation time is too long, the interface charges may not be removed during removal. Accordingly, an appropriate thickness ratio may be selected to achieve an appropriate level of relaxation time.

When a high-resistivity material is deposited on a rear surface of the substrate to be adsorbed, a relaxation time may increase rapidly due to the resistivity of the deposited material. Accordingly, a system having a stable relaxation time may be required even when the high-resistivity material is deposited on the rear surface of the substrate.

For example, the ratio of the second electrical conductivity to the first electrical conductivity ($\sigma2/\sigma1$) may be less than the ratio of the second dielectric constant to the first dielectric constant ($\varepsilon2/\varepsilon1$). Accordingly, positive interface charges may be accumulated. In this case, the thickness ratio d2/d of the second dielectric layer may be 0.01 to 0.1 to reduce the relaxation time.

On the other hand, when the ratio of the second electrical conductivity to the first electrical conductivity is 0.01 or less, the relaxation time may be reduced. The thickness ratio d2/d of the second dielectric layer may be 0.01 or more to further reduce the relaxation time.

On the other hand, when the conductivity ratio is 0.1 or more, the relaxation time may increase. The thickness ratio d2/d of the second dielectric layer may be 0.01 to 0.2 to increase the relaxation time. The thickness of the second dielectric layer may be 0.01 to 0.2 with respect to the total thickness of the first and second dielectric layers.

The second electrical conductivity may be a reciprocal of the second resistivity, and the second resistivity may be 10^2 Ωm or less. In the case of the air gap, the second resistivity may be 10^10 Ωm to 10^2 Ωm depending on pressure and gas.

When the ratio of the second dielectric constant to the first dielectric constant is 0.1, and the ratio of the second electrical conductivity to the first electrical conductivity is 0.1 or less, positive interface charges may be accumulated.

In conclusion, the relaxation time may be set according to the purpose. For example, in the case of Coulomb type having an air gap as the second dielectric layer (for example, the conductivity ratio $\sigma2/\sigma1$ is 10 or more), an adsorption time may be set to 30 seconds or more. In this case, when the thickness ratio d2/d of the second dielectric layer is reduced to 0.01 or less, the relaxation time may decrease, and adsorption force may decrease during the adsorption time, resulting in unintended removal. To prevent the unintended removal, the thickness ratio d2/d of the second dielectric layer may be set to a large value such that the relaxation time is longer than the adsorption time.

For example, in the case of Johnson-Rahbek type having an air gap as the second dielectric layer (for example, the conductivity ratio $\sigma2/\sigma1$ is 0.1 or less), when the adsorption time is several tens of seconds or more, the thickness ratio d2/d of the second dielectric layer may decrease to 0.01 or less. In this case, the relaxation time may increase, so that the magnitude of the second electric field may insufficiently increase during the adsorption time. Thus, it may be difficult to perform initial adsorption. To prevent this, the thickness ratio d2/d of the second dielectric layer may be set to a relatively large value such that the relaxation time is smaller than the adsorption time.

[Relaxation Time According to Dielectric Constant Ratio Considering Resistivity]

Figure 10:
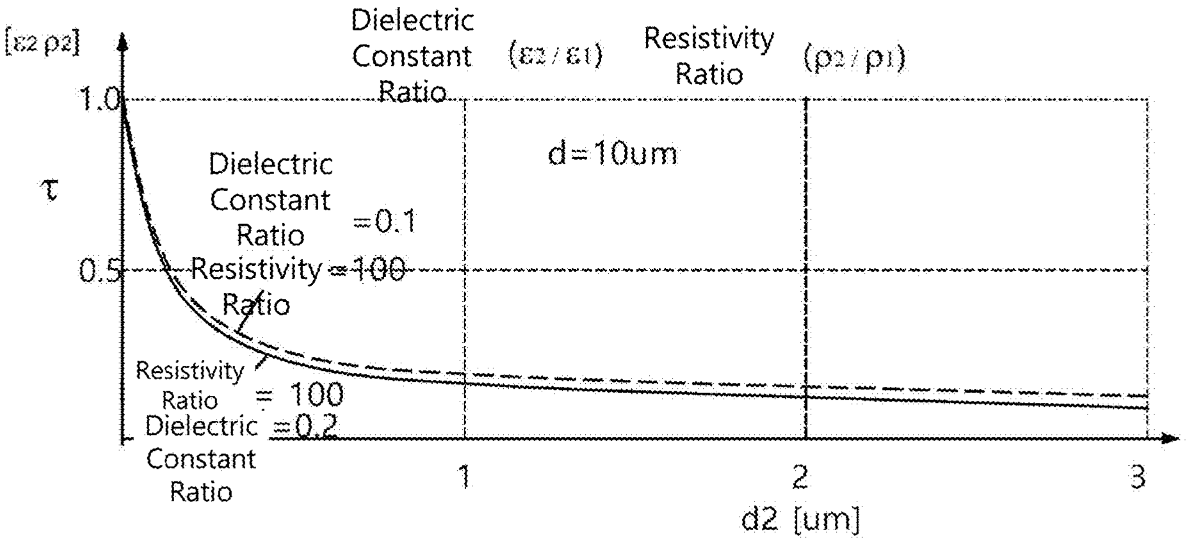
FIG. 10 is a diagram illustrating a relaxation time τ of an electrostatic device according to an embodiment of the present disclosure.

FIG. 10 is a diagram illustrating a relaxation time $\tau$ of an electrostatic device according to an embodiment of the present disclosure.

Referring to FIG. 10, the relaxation time $\tau$ may slightly decrease for the same resistivity ratio $\rho2/\rho1$ as the dielectric constant ratio $\varepsilon2/\varepsilon1$ increases. That is, the relaxation time is mainly dependent on the resistivity ratio $\rho2/\rho1$ rather than the dielectric constant ratio.

[Johnson-Rahbek Type Electric Field Over Time]

TABLE 1

| Case I | |
|---|---|
| d1 = 9 [um] | d2 = 1 [um] |
| $\varepsilon1$ = 10 [$\varepsilon_0$] | $\varepsilon2$ = 1 [$\varepsilon_0$] |
| $\sigma1$ = 100 [10^(−12)/Ωm] | $\sigma2$ = 1 [10^(−12)/Ωm] |

Figure 11:
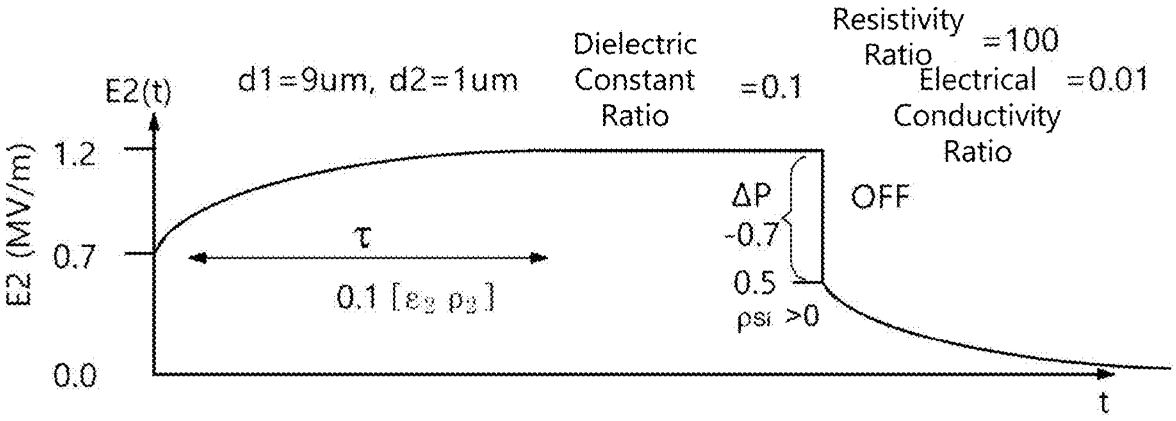
FIG. 11 is a diagram illustrating a magnitude of an electric field in a second region over time.

FIG. 11 is a diagram illustrating a magnitude of an electric field in a second region over time. FIG. 11 illustrates the electric field E2 of the second dielectric layer 124 over time under the conditions of Case I. Case I may be Johnson-Rahbek type. In this case, the second electric field E2 may increase over time from an initial value (0.7). The initial value (0.7) of the second electric field E2 may be determined by characteristics of a dielectric. When the dielectric constant ratio $\varepsilon2/\varepsilon1$ is 0.1, the conductivity ratio $\sigma2/\sigma1$ may be 0.01, the thickness d1 of the first dielectric layer is 9 μm, and the thickness d2 of the second dielectric layer is 1 μm, the second electric field E2 may increase over time with a relaxation time T.

For example, when the dielectric constant ratio $\varepsilon2/\varepsilon1$ is 0.1 and the conductivity ratio $\sigma2/\sigma1$ is 0.01 (resistivity ratio=100), the relaxation time $\tau$ may be about 0.1 [$\varepsilon2\rho2$]. For example, when the second dielectric layer is a weak vacuum layer, $\varepsilon2$ may be $\varepsilon0$ (a vacuum dielectric constant) and $\rho2$ may be about 10^2 Ωm. In this case, the relaxation time $\tau$ may be about 1 second. The second electric field E2 may increase from about 0.7 MV/m to about 1.2 MV/m. In this case, the interface surface charge density ρsi may have a positive value and may be accumulated at an interface.

Next, when the external voltage is removed, the interface surface charge density ρsi may be removed and polarization charges ΔP generated by the dielectric may be removed, and positive interface surface charge density ρsi may decrease over time.

[Coulomb Type Electric Field Over Time]

TABLE 2

| Case II | |
|---|---|
| d1 = 9 [um] | d2 = 1 [um] |
| ε1 = 10 [$\varepsilon_0$] | ε2 = 1 [$\varepsilon_0$] |
| σ1 = 0.5 | σ2 = 1 [10^(−12)/Ωm] |
| σ1 = 10^(−4) [10^(−12)/Ωm] | |

Figure 12:
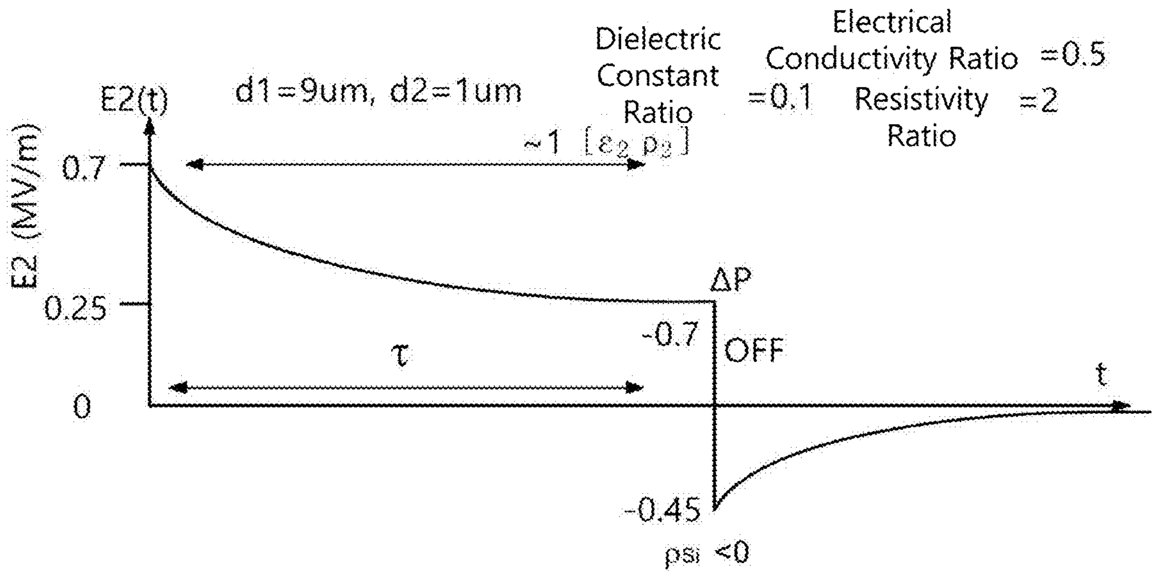
FIG. 12 is a diagram illustrating a magnitude of an electric field in a second region over time.

FIG. 12 is a diagram illustrating a magnitude of an electric field in a second region over time.

FIG. 12 illustrates the electric field E2 of the second dielectric layer 124 over time under the conditions of Case II. Case II may be Coulomb type. In this case, the second electric field E2 may decrease over time from the initial value. An initial value of the second electric field E2 may be determined by characteristics of a dielectric. When the dielectric constant ratio ε2/ε1 is 0.1, the conductivity ratio σ2/σ1 is 0.5, the thickness d1 of the first dielectric layer is 9 m, and the thickness d2 of the second dielectric layer is 1 μm, the second electric field E2 may decrease over time with a relaxation time T.

For example, when the dielectric constant ratio ε2/ε1 is 0.1 and the conductivity ratio σ2/σ1 is 0.5 (resistivity ratio=2), the relaxation time τ may be about 1 [ε2ρ2]. For example, when the second dielectric layer is a weak vacuum layer, ε2 may be ε0 and ρ2 may be about 10^12 Ωm. In this case, the relaxation time τ may be about 10 seconds. The second electric field E2 may decrease from about 0.7 MV/m to about 0.25 MV/m in a steady state. In this case, the interface surface charge density ρsi may have a negative value and may be accumulated at an interface.

Next, when the external voltage is removed, the interface surface charge density ρsi may be removed and polarization charge ΔP generated by the dielectric may be removed, and the negative interface surface charge density ρsi may decrease over time. Also, an absolute value of the second electric field E2 may decrease over time with a relaxation time T.

[Interface Surface Charge Density ($\rho_{si}$)=0 Type Electric Field Over Time]

TABLE 3

| Case III | |
|---|---|
| d1 = 9 [um] | d2 = 1 [um] |
| ε1 = 10 [$\varepsilon_0$] | ε2 = 1 [$\varepsilon_0$] |
| σ1 = 10 [10^(−12)/Ωm] | σ2 = 1 [10^(−12)/Ωm] |

Figure 13:
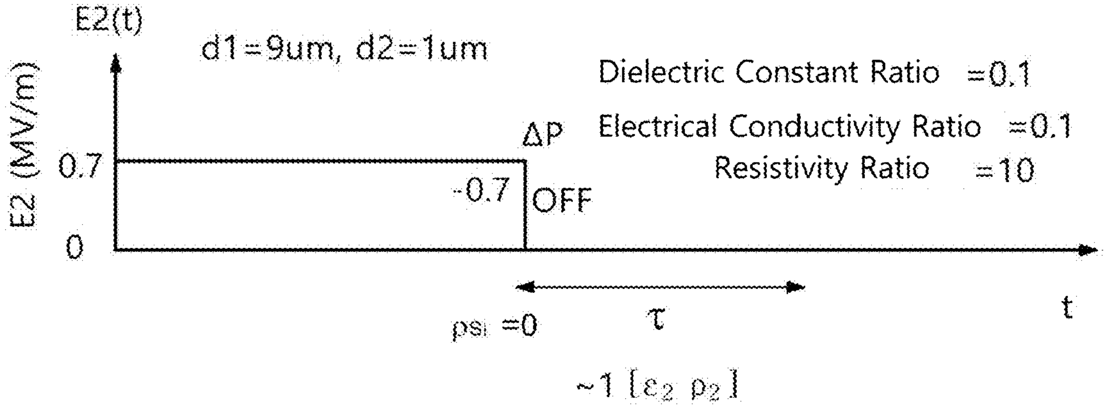
FIG. 13 is a diagram illustrating a magnitude of an electric field in a second region over time.

FIG. 13 is a diagram illustrating a magnitude of an electric field in a second region over time. FIG. 13 illustrates the electric field E2 of the second dielectric layer 124 over time under the conditions of Case III. Case III may be a case in which the interface surface charge density ρsi is zero. In this case, the second electric field E2 may be constant over time from an initial value. The initial value of the second electric field E2 may be determined by characteristics of a dielectric. When the dielectric constant ratio ε2/ε1 is 0.1, the conductivity ratio σ2/σ1 is 0.1, the thickness d1 of the first dielectric layer is 9 μm, and the thickness d2 of the second dielectric layer is 1 μm, the second electric field E2 may have a relaxation time τ but be constant.

For example, when the dielectric constant ratio ε2/ε1 is 0.1 and the conductivity ratio σ2/σ1 is 0.1 (resistivity ratio=10), the relaxation time τ may be about 1 [ε2ρ2]. For example, when the second dielectric layer is a weak vacuum layer, ε2 may be ε0 and ρ2 may be about 10^12 Ωm. In this case, the relaxation time τ may be about 10 seconds. The second electric field E2 may be maintained at the same value over time from 0.7 MV/m. In this case, the interface surface charge density ρsi may be zero and no charge may be accumulated at an interface.

Next, when the external voltage is removed, the interface surface charge density ρsi may be removed and polarization charges ΔP generated by the dielectric may be removed, and the interface surface charge density ρsi may be zero. Also, the second electric field E2 may be zero.

[Comparison of Characteristics]

TABLE 4

| Steady State | Case I | Case II | Case III |
|---|---|---|---|
| E2 | 1.2 [MV/m] | 0.25 [MV/m] | 0.7 [MV/m] |
| $\rho_{si}$ | Positive Value | Negative Value | 0 |
| τ | ~0.1 [ε2ρ2 sec] | ~1 [ε2ρ2 sec] | ~1 [ε2ρ2 sec] |

[Electric Field Under Bipolar Voltage or Voltage Increase]

Figure 14A:
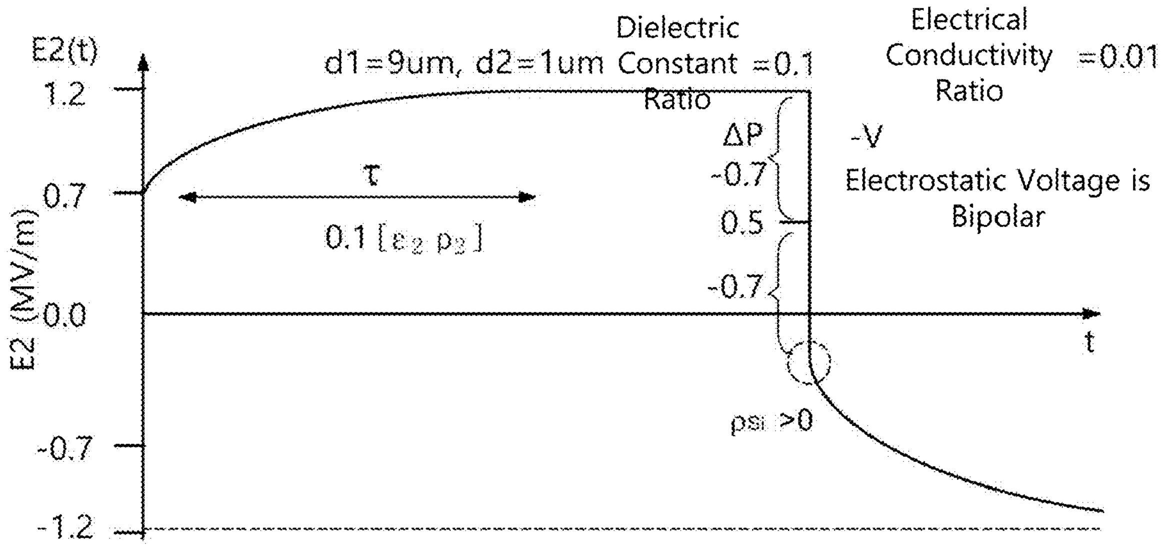
FIG. 14A is a diagram illustrating a magnitude of an electric field in a second region over time.

FIG. 14A is a diagram illustrating a magnitude of an electric field in a second region over time.

FIG. 14A illustrates the electric field E2 of the second dielectric layer 124 over time under the conditions of Case I.

When an external voltage is applied, the interface surface charge density ρsi may have a positive value and the electric field E2 in the second region may increase over time.

Next, when the electric field E2 in the second region is saturated, polarity of the external voltage may be changed. In this case, the electric field E2 may have a negative value and an absolute value of the electric field E2 may increase over time. At a time point at which the polarity of the externally applied voltage is changed, the absolute value of the electric field E2 may have a relatively small value and low electrostatic force.

Figure 14B:
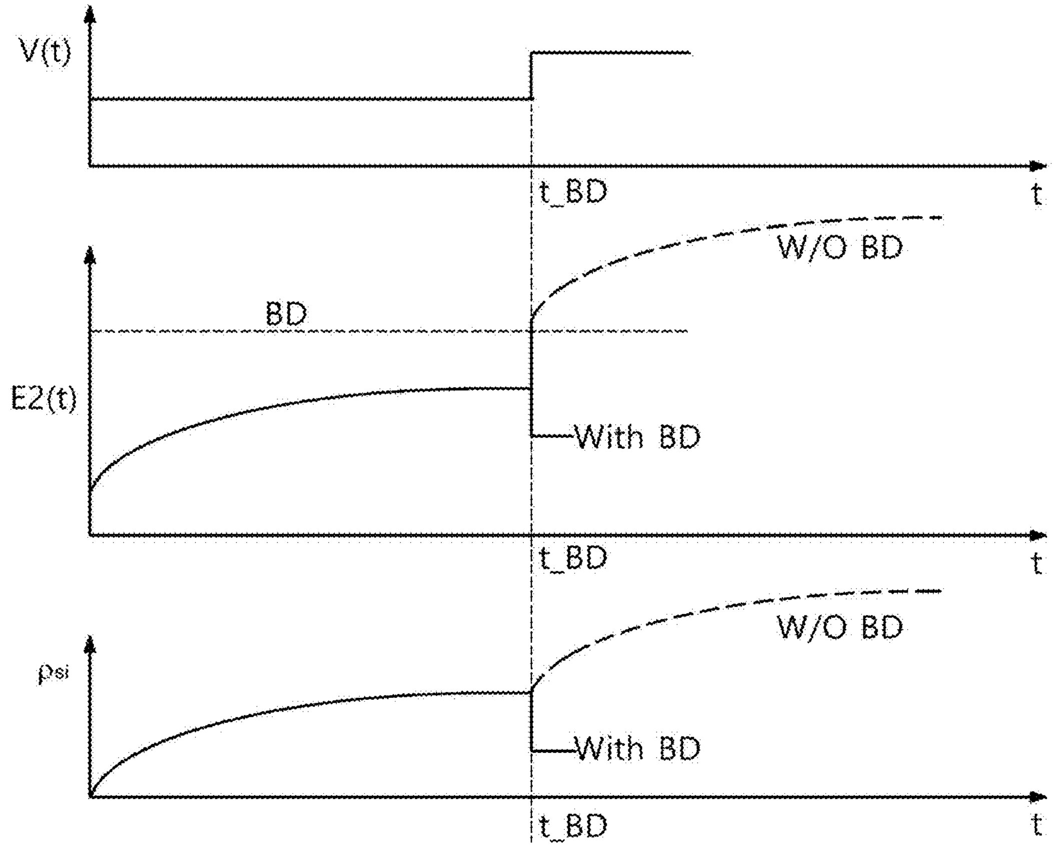
FIG. 14B is a diagram illustrating a magnitude of an electric field in a second region over time.

FIG. 14B is a diagram illustrating a magnitude of an electric field in a second region over time.

FIG. 14B illustrates the electric field E2 of the second dielectric layer 124 over time under the conditions of Case I.

When an external voltage is applied, the interface surface charge density ρsi may have a positive value and the electric field E2 in the second region may increase over time.

Next, when the electric field E2 in the second region is saturated, the external voltage may further increase. In this case, the electric field E2 may further increases instantaneously and the electric field E2 may be greater than a breakdown (BD) electric field. Accordingly, when the second dielectric is an air gap, charges may be discharged and the interface charges may be reduced by the discharged charges, and the electric field E2 may decrease. However, the discharge may lead to an arc discharge.

TABLE 5

| Case IV | |
|---|---|
| d1 = 9.5 [um] | d2 = 0.5 [um] |
| ε1 = 10 [$\varepsilon_0$] | ε2 = 1 [$\varepsilon_0$] |
| σ1 = 100 [10^(−12)/Ωm] | σ2 = 1 [10^(−12)/Ωm] |

Figure 15:
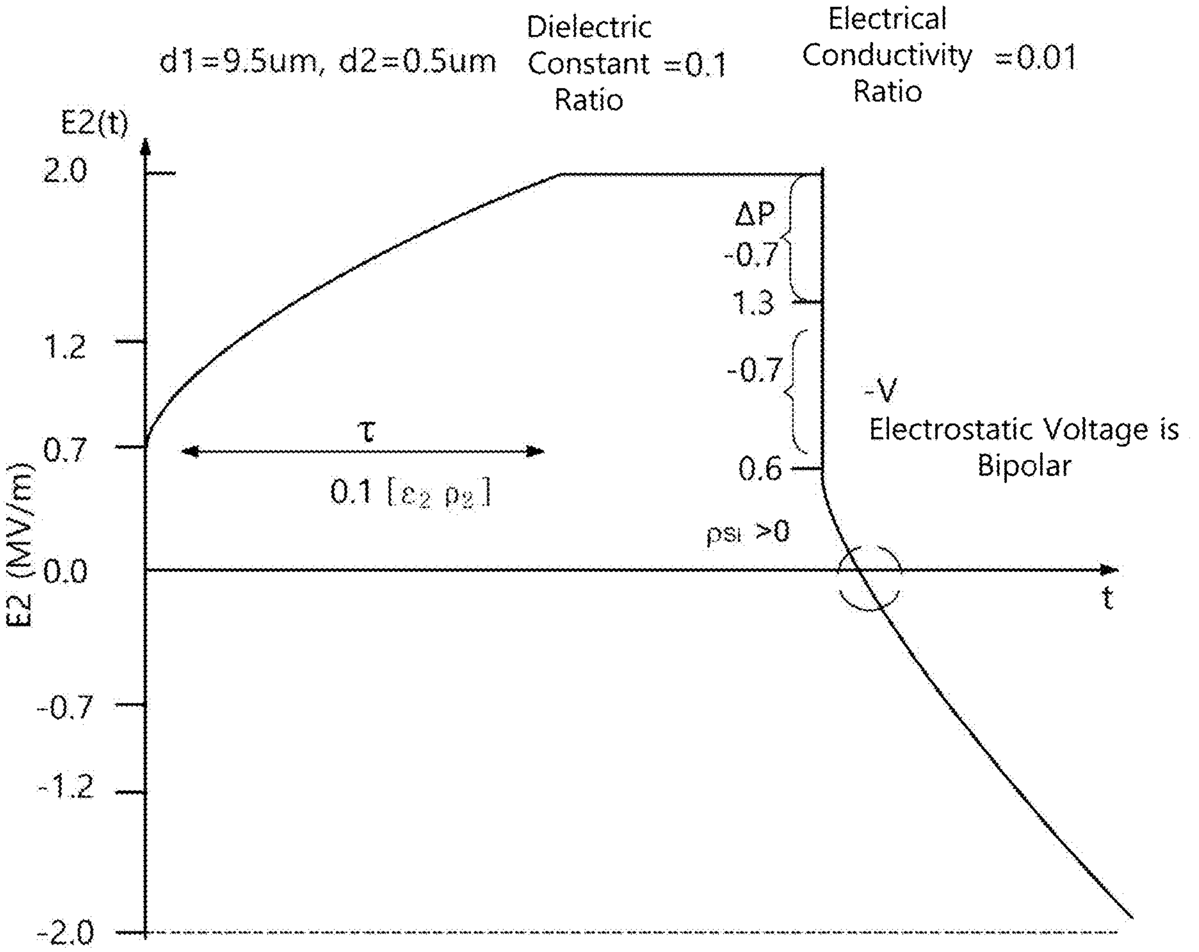
FIG. 15 is a diagram illustrating a magnitude of an electric field in a second region over time.

FIG. 15 is a diagram illustrating a magnitude of an electric field in a second region over time. FIG. 15 illustrates the electric field E2 of the second dielectric layer 124 over time under the conditions of Case IV.

When an external voltage is applied, the interface surface charge density ρsi may have a positive value and the electric field E2 in the second region may increase over time.

Next, when the electric field E2 in the second region is saturated, polarity of the external voltage is changed. In this case, the electric field E2 may have a positive value, the electric field E2 may decrease and pass through a zero point, and an absolute value of the electric field E2 may increase over time. At a time point at which the polarity of the external voltage is changed, the absolute value of the electric field E2 may have a relatively small value and the electric field E2 may have a time, which is zero, over time.

Figure 16A:
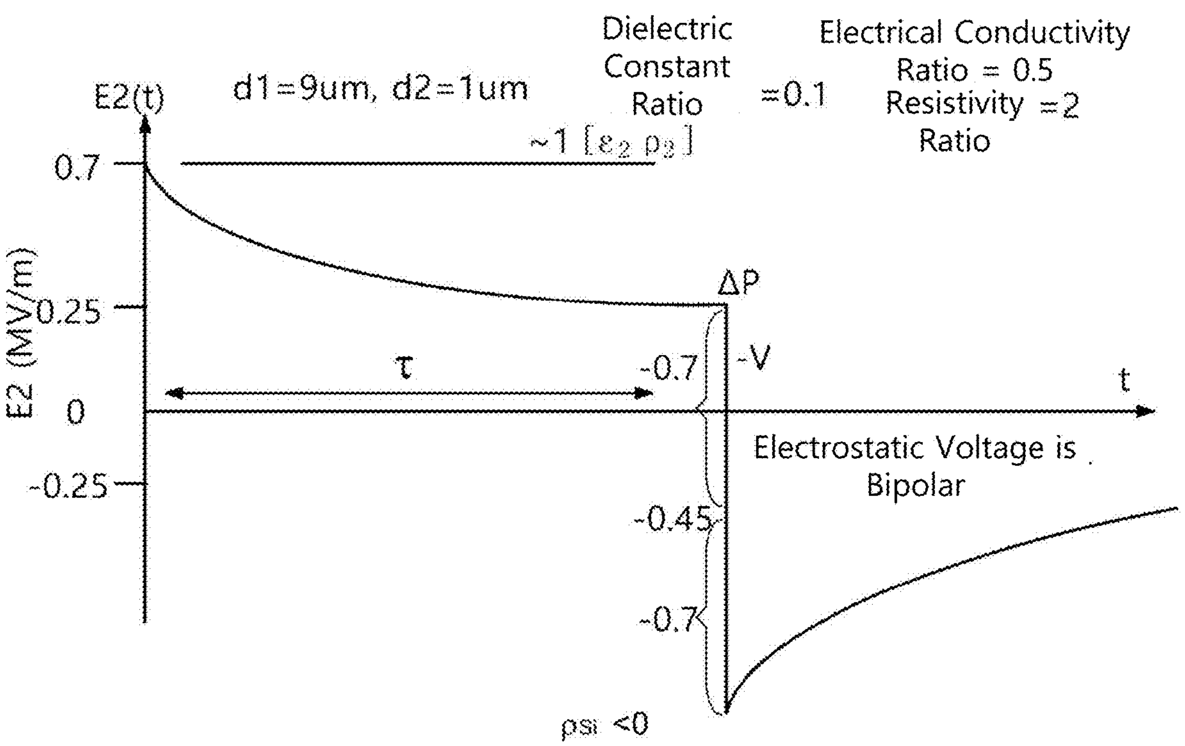
FIG. 16A is a diagram illustrating a magnitude of an electric field in a second region over time.

FIG. 16A is a diagram illustrating a magnitude of an electric field in a second region over time.

FIG. 16A illustrates the electric field E2 of the second dielectric layer 124 over time under the conditions of Case II.

When an external voltage is applied, the interface surface charge density ρsi may have a negative value and the electric field E2 in the second region may decrease over time.

Next, when the electric field E2 in the second region is saturated, polarity of the external voltage may be changed. In this case, the electric field E2 may have a negative value and an absolute value of the electric field E2 may decrease over time. At a time point at which the polarity of the external voltage is changed, the absolute value of the electric field E2 may have a relatively large value and the absolute value of the electric field E2 may decrease over time.

Figure 16B:
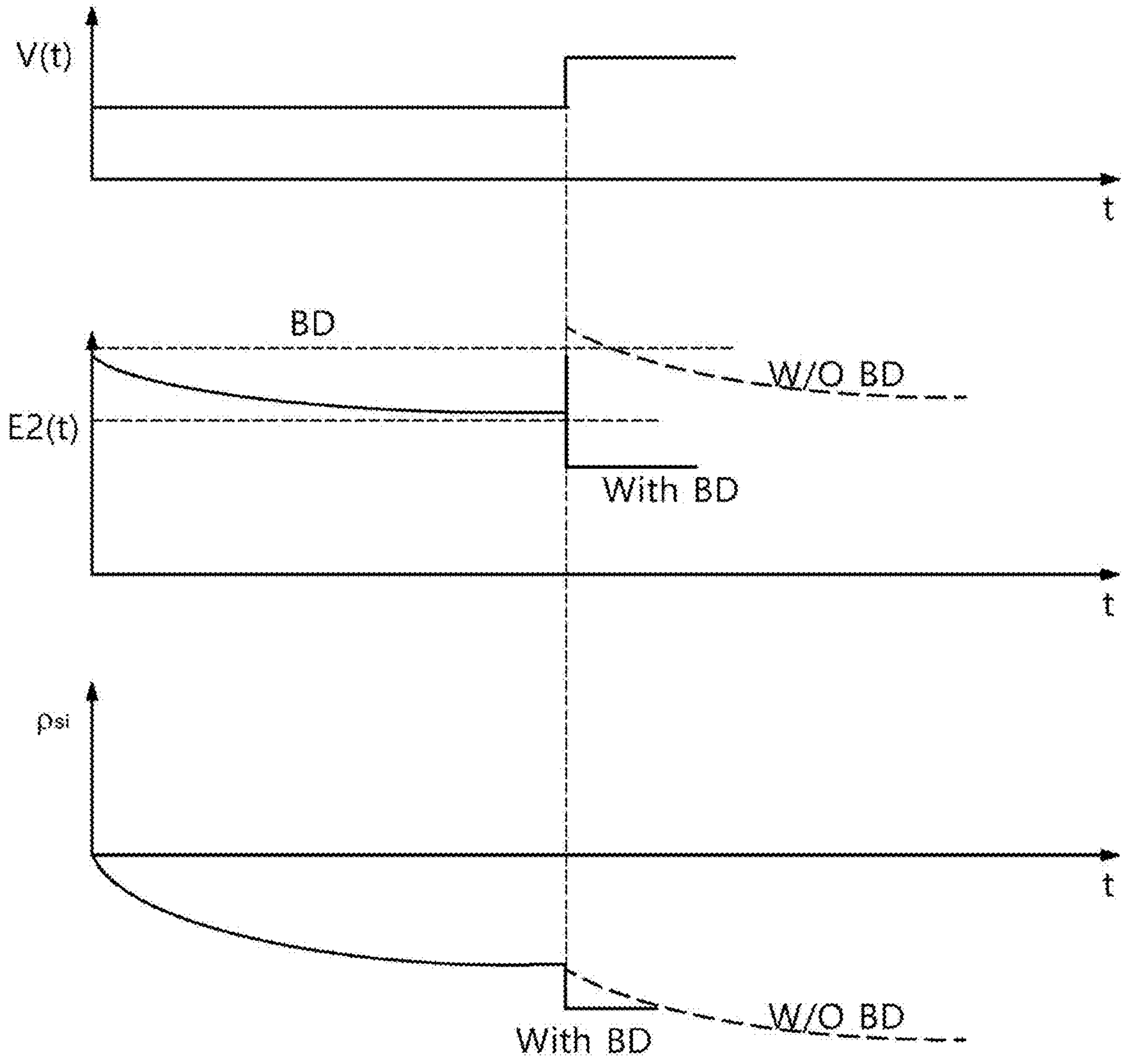
FIG. 16B is a diagram illustrating a magnitude of an electric field in a second region over time.

FIG. 16B is a diagram illustrating a magnitude of an electric field in a second region over time.

FIG. 16B illustrates the electric field E2 of the second dielectric layer 124 over time under the conditions of Case II.

When an external voltage is applied, the interface surface charge density ρsi may have a negative value and the electric field E2 in the second region may decrease over time.

Next, when the electric field E2 in the second region is saturated, the external voltage may further increase. In this case, the electric field E2 may exceed a breakdown (BD) electric field. Accordingly, when the second dielectric is an air gap, charges may be discharged and interface charges may be increased by the discharged charges and the electric field E2 may decrease. However, the discharge may lead to an arc discharge. An absolute value of the interface charge may further increase. However, an absolute value of the electric field E2 may decrease.

[Parallel Connection Structure of Second Dielectric Layer when Ignoring Conductivity]

Figure 17:
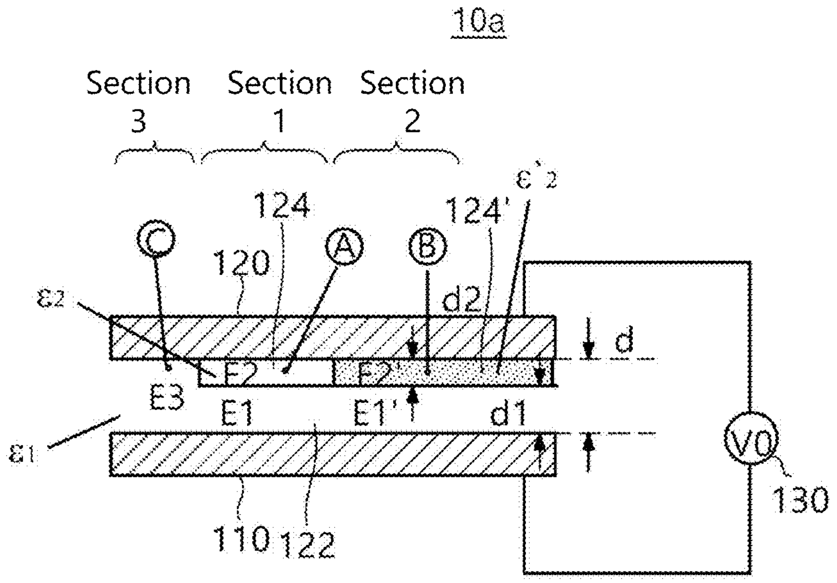
FIG. 17 is a conceptual diagram illustrating a parallel connection structure of a second dielectric layer according to an embodiment of the present disclosure.
Figure 17:
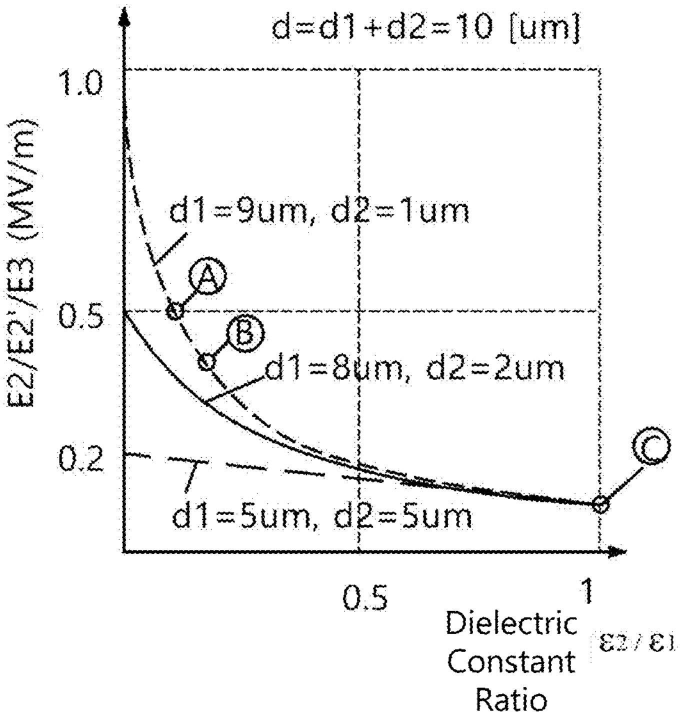

FIG. 17 is a conceptual diagram illustrating a parallel connection structure of a second dielectric layer according to an embodiment of the present disclosure.

Referring to FIG. 17, in the electrostatic device 10*a*, a first dielectric layer 122 and a second dielectric layer 124 may be stacked between a first electrode 110 and a second electrode 120. A first region may be formed as the first dielectric layer 122, have a first dielectric constant ε1 and a first electrical conductivity 61, and have a thickness d1.

The second region may be formed as a plurality of second dielectrics 124 and 124' having the same thickness d2. The second region may be divided into a plurality of sections based on a dielectric constant (or electrical conductivity). For example, a third section may have the same material properties as the first dielectric, a first section may be the second main dielectric layer 124 and have a second main dielectric constant ε2 and a second main electrical conductivity σ2, and have a thickness d2. A second section may be a second preliminary dielectric 124' and have a second preliminary dielectric constant ε'2 and second preliminary electrical conductivity σ'2, and have a thickness d2.

When the electrical conductivity is ignored, different electric fields may be obtained for each section. For example, the third section may have a lowest electric field at point C. In the first section, when the second main dielectric 124 is an air gap, a high electric field may be obtained at point A. In the second section, the second preliminary dielectric may be a silicon oxide layer and have a value, smaller than a first dielectric constant (a dielectric constant of alumina). In this case, an electric field of the second section may have the magnitude, slightly reduced compared to the magnitude of an electric field in the second main dielectric.

Ultimately, the second dielectric layers may be connected in parallel to secure desired physical properties. That is, when the third section is removed and only the first and second sections are used, the magnitude of the electric field may relatively increase.

[Parallel Connection Structure of Second Dielectric Layer Considering Electrical Conductivity]

Figure 18:
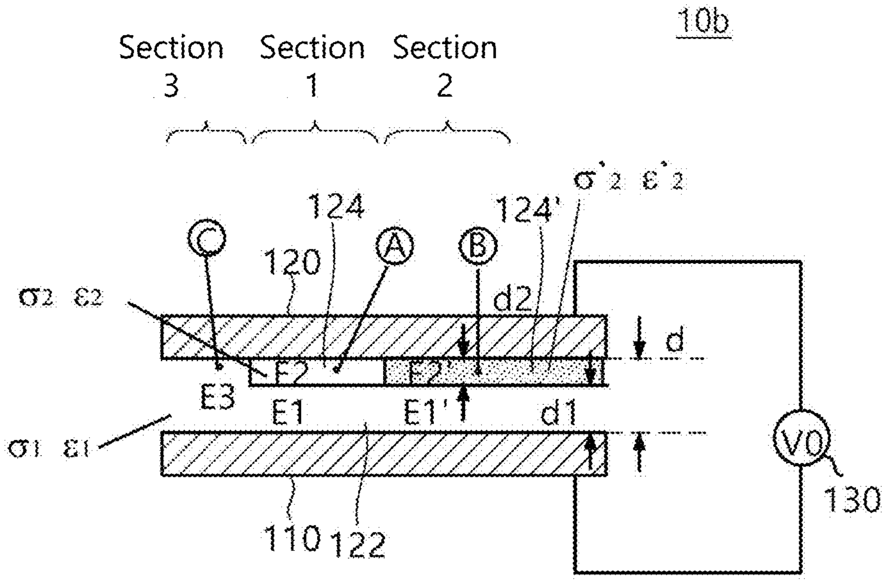
FIG. 18 is a conceptual diagram illustrating a parallel connection structure of a second dielectric layer according to an embodiment of the present disclosure.
Figure 18:
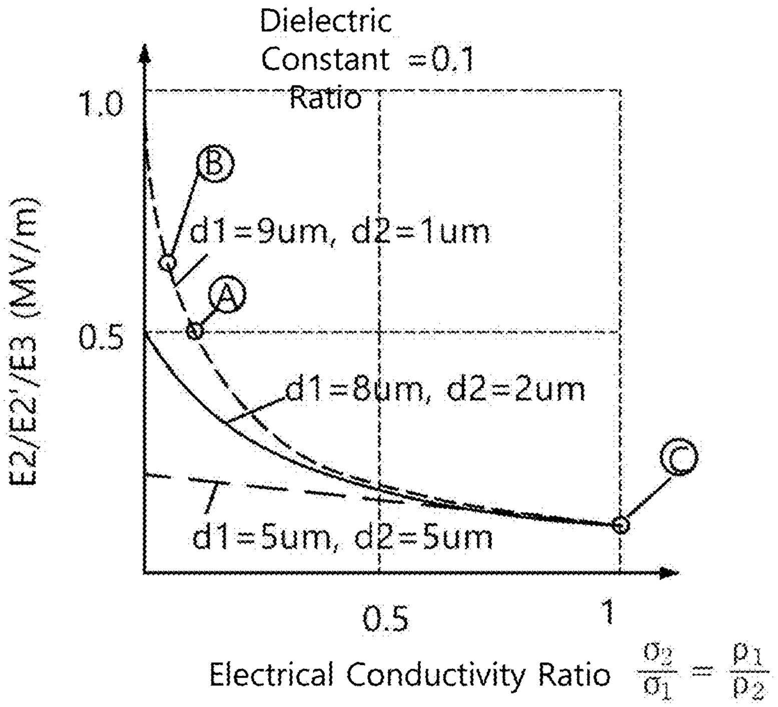

FIG. 18 is a conceptual diagram illustrating a parallel connection structure of a second dielectric layer according to an embodiment of the present disclosure.

Referring to FIG. 18, in an electrostatic device 10*a*, a first dielectric layer 122 and a second dielectric layer 124 may be stacked between a first electrode 110 and a second electrode 120. A first region may be formed as the first dielectric layer 122, have a first dielectric constant ε1 and a first electrical conductivity 61, and have a thickness d1.

A second region may be formed as a plurality of second dielectrics 124 and 124' having the same thickness. The second region may be divided into a plurality of sections based on electrical conductivity (or dielectric constant). For example, a third section may have the same material properties as the first dielectric, the first section may be the second main dielectric layer 124 having a second main dielectric constant ε2 and a second main electrical conductivity σ2, and have a thickness d2. A second section may be a second preliminary dielectric 124' having a second preliminary dielectric constant ε'2 and a second preliminary electrical conductivity σ'2, and may have a thickness d2.

When the electrical conductivity is taken into consideration, different electric fields may be obtained for each section. For example, the third section may have a lowest electric field at point C. In the first section, when the second main dielectric 124 is an air gap, a high electric field may be obtained at point A. In the second section, the second preliminary dielectric 124' may be a silicon oxide film and have a smaller value than a first dielectric constant (dielectric constant of alumina) of the first dielectric. In this case, an electric field E2' of the second section may increase to a value greater than the electric field E2 in the second main dielectric at point B.

Ultimately, the second dielectric layers may be connected in parallel to secure desired physical properties. That is, the magnitude of an electric field may increase or decrease for each section.

For example, in the third section, large current may flow due to low resistance. Accordingly, the third section may be removed and only the second and third sections may be used. As a result, the desired physical properties (increasing the magnitude of an electric field while reducing overall current) may be achieved.

Such a concept may be performed in a multilayer structure, including two or more layers, in a serial-parallel mixture manner.

Figure 19:
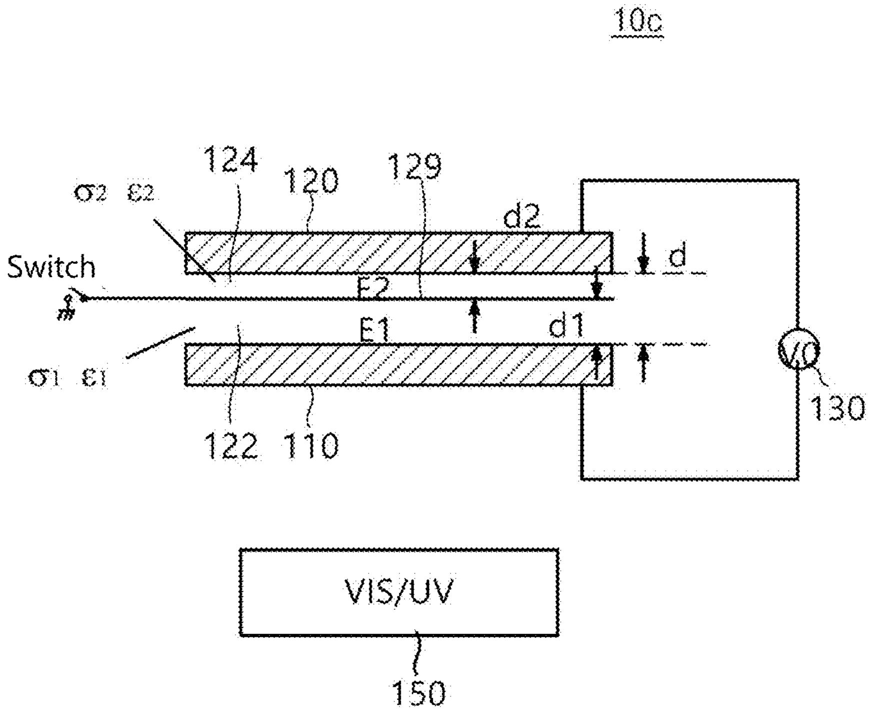
FIG. 19 is a conceptual diagram illustrating an electrostatic device according to an embodiment of the present disclosure.

FIG. 19 is a conceptual diagram illustrating an electrostatic device according to an embodiment of the present disclosure.

Referring to FIG. 19, a first dielectric layer 122 and a second dielectric layer 124 are stacked between a first electrode 110 and a second electrode 120. A first region may be formed as the first dielectric layer 122, have a first dielectric constant ε1 and first electrical conductivity 61, and have a thickness d1.

A conductive layer 129 may be disposed between the first dielectric layer 122 and the second dielectric layer 124. The conductive layer 129 may be significantly thin compared to the first dielectric layer 122 or the second dielectric layer 122. Even when the conductive layer 129 is present, an electric field and an interface surface charge density operate in the same manner.

The conductive layer 129 accumulates interface surface charges. The accumulated interface charges may be connected to ground through a switch to be removed. The conductive layer 129 may be a semiconductor or a conductor.

The conductive layer 129 may be disposed between a first dielectric layer and a second dielectric layer. The conductive layer may be a semiconductor or a conductor. The conductive layer may accumulate interface charges. A thickness of the conductive layer may be smaller than the second dielectric layer.

The interface charges accumulated on the conductive layer may be connected to an external ground through a switch to be removed.

Alternatively, the first and second dielectric layers may receive light from an optical source 150 to generate electrons and holes, and the electrons or holes may move to the conductive layer 129 to control the interface charges.

Referring to FIG. 19, an electrostatic device 10*c* according to an embodiment of the present disclosure may include an electrostatic electrode layer 110; a first dielectric layer 122 disposed on the electrostatic electrode layer; a conductive layer 129 disposed on the first dielectric layer; and an air layer 124 disposed on the conductive layer. A protrusion part (not illustrated) formed on the first dielectric layer may form an air layer between adsorbate 120 and the first dielectric layer 122. The conductive layer is not embedded in the first dielectric layer.

Figure 27:
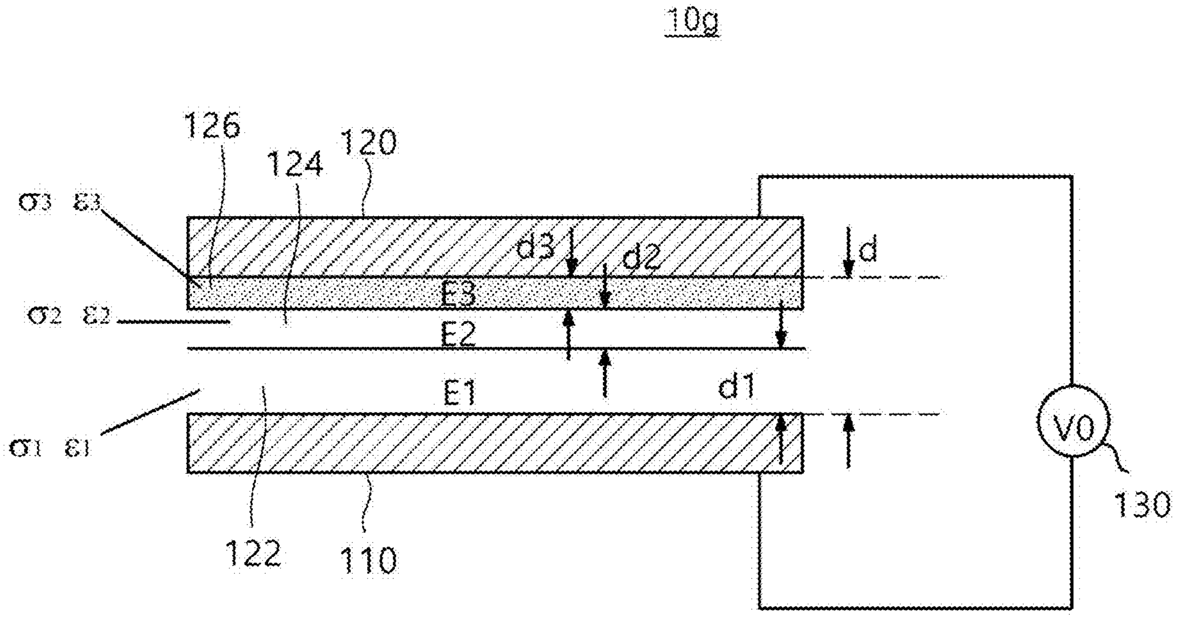
FIG. 27 is a conceptual diagram illustrating a structure of an electrostatic device according to an embodiment of the present disclosure.

Referring to FIG. 27, when the conductive layer is embedded in the first dielectric layer or covered with another dielectric, another interface charges may be generated. Therefore, the conductive layer may be exposed to an air gap.

The conductive layer 129 may be selectively connected to ground through a switch. The conductive layer 129 may be electrically connected to a conductive material coated on an inner side of a flow path (not illustrated) through which a cooling gas is supplied to the air layer. The conductive layer may be a semiconductor or metal. The conductive layer may be a photoresist layer CdS receiving light to have conductivity.

Referring to FIG. 19, the electrostatic device 10*c* according to an embodiment of the present disclosure may include an electrostatic electrode layer 110; a dielectric layer 122 disposed on the electrostatic electrode layer; a protrusion part (not illustrated) and a recess 124 formed on the dielectric layer; and a conductive layer 129 formed on a lower surface of the recess. The power supply 130 may include applying a first voltage to adsorb a substrate (or an static electrode layer) on the dielectric layer; and removing the first voltage and then grounding the conductive layer 129 to remove interface charges accumulated on the conductive layer and desorb the substrate (or the electrostatic electrode layer). The method may further include applying a second voltage of polarity opposite to polarity of the first voltage to remove the interface charges.

[Electric Field According to Temperature Control (Heating Means)]

Figure 20:
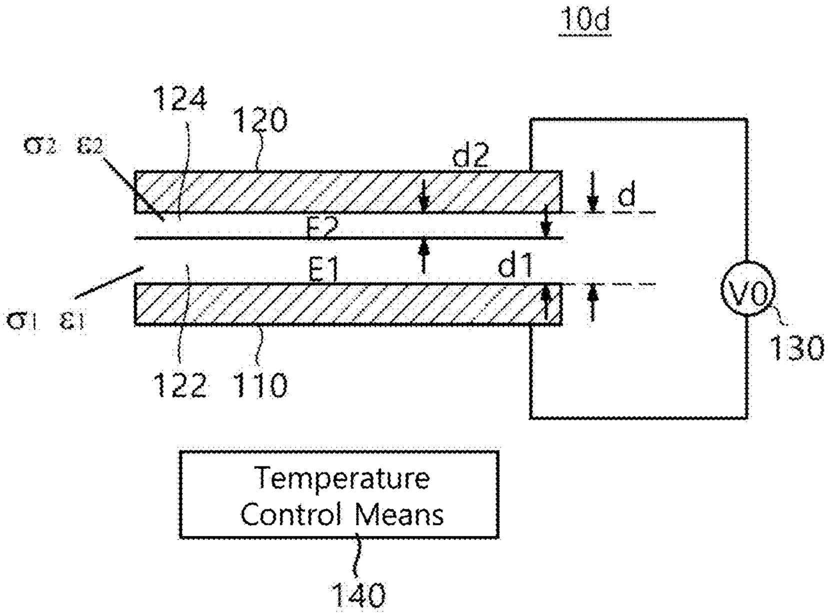
FIG. 20 is a conceptual diagram illustrating an electrostatic device according to an embodiment of the present disclosure.

FIG. 20 is a conceptual diagram illustrating an electrostatic device according to an embodiment of the present disclosure.

Figure 21:
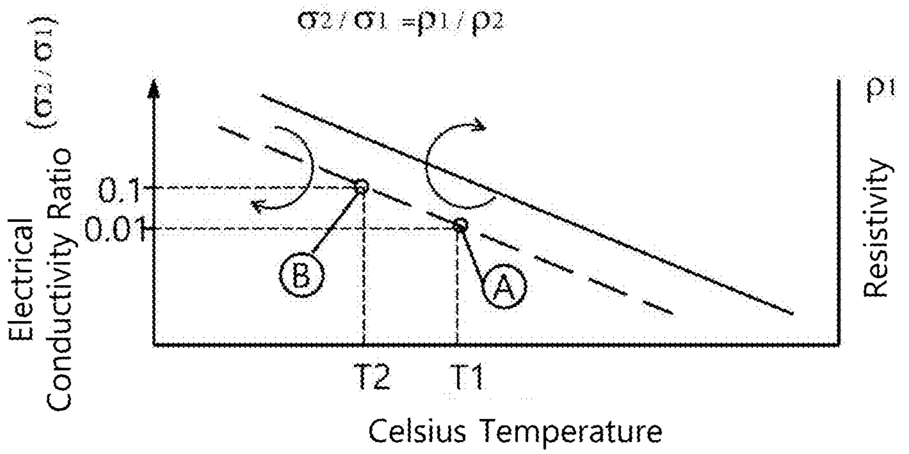
FIG. 21 is a diagram illustrating an electric field of the electrostatic device according to an embodiment of the present disclosure.
Figure 21:
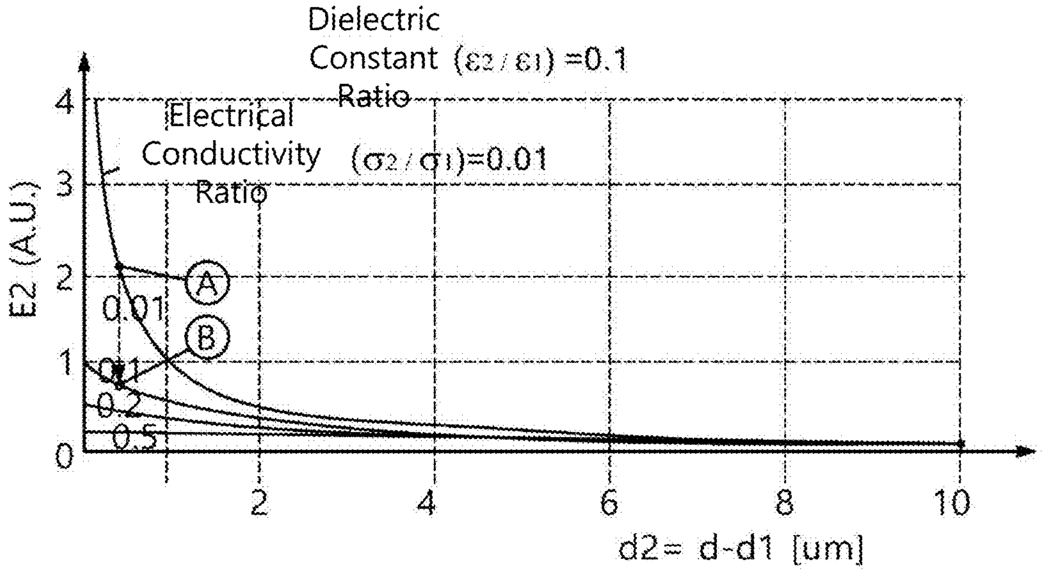

FIG. 21 is a diagram illustrating an electric field of the electrostatic device according to an embodiment of the present disclosure.

Figure 22:
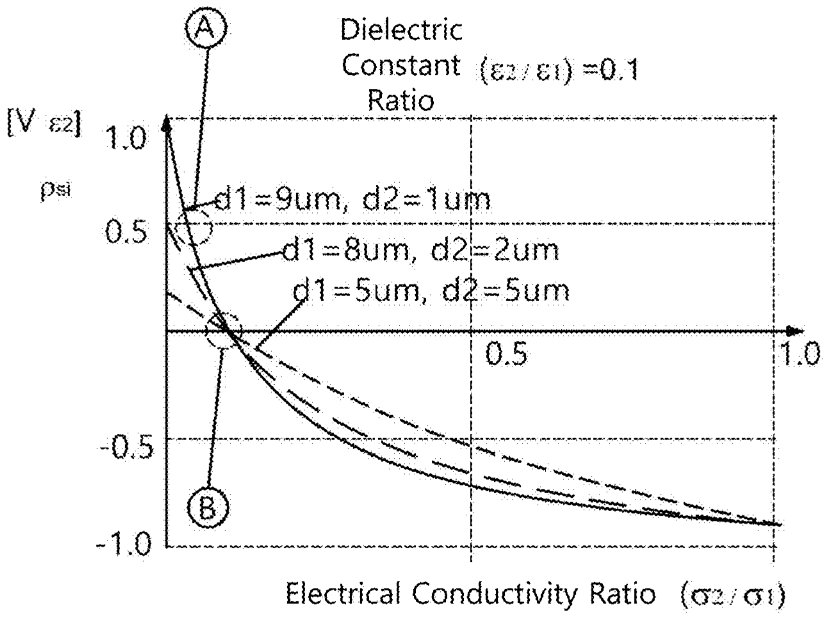
FIG. 22 is a diagram illustrating an interface surface charge density of an electrostatic device according to an embodiment of the present disclosure.

FIG. 22 is a diagram illustrating an interface surface charge density of an electrostatic device according to an embodiment of the present disclosure.

Referring to FIGS. 20 to 22, a first dielectric layer 122 and a second dielectric layer 124 are stacked between a first electrode 110 and a second electrode 120. The first region may be formed by the first dielectric layer 122, have a first dielectric constant ε1 and a first electrical conductivity 61, and have a thickness d1. The second region may be formed by the second dielectric layer 124, have a second dielectric constant ε2 and a second electrical conductivity σ2, and have a thickness d2.

A temperature control means 140 may be disposed above, below, or around the first dielectric layer 122 to control a temperature of the first dielectric layer 122 and/or the second dielectric layer 124. For example, when the second dielectric layer 124 is an air or vacuum layer, electrical conductivity of the second dielectric layer 124 may be substantially constant with temperature. On the other hand, when the first dielectric layer 122 is a high-k dielectric material such as alumina, the electrical conductivity of the first dielectric layer 122 may depend on temperature. The temperature control means 140 may include at least one of a resistive heater, hot air, or an infrared generator.

At a first temperature T1, a conductivity ratio σ2/σ2 is 0.01 and a dielectric constant ratio ε2/ε1 is 0.1. At a second temperature T2 lower than the first temperature, the dielectric constant ratio ε2/ε1 is 0.1 and the conductivity ratio (σ2/σ2) is 0.1.

For example, since the conductivity ratio σ2/σ2 is 0.01 at the first temperature T1, when a thickness of the first dielectric d1 is 9 μm and a thickness of the second dielectric d2 is 1 μm, a magnitude of the electric field E2 of the second region may be about 2 MV/m and interface surface charge density may be 0.5 [Vε2]. On the other hand, the magnitude of the electric field E2 of the second region at the second temperature T2 may be about 0.8 MV/m and interface surface charge density ρsi may be 0 [Vε2]. Accordingly, when the temperature of the first dielectric layer 122 is modulated over time, a strong second electric field may be obtained at high temperature, and the interface surface charge density ρsi may be set to zero at low temperature at a desired time.

Alternatively, the temperature control means 140 may change the temperature of the first dielectric layer 122 and/or the second dielectric layer 124 to change operating characteristics.

Referring to FIGS. 20 to 22, an electrostatic device 10*d* according to an embodiment of the present disclosure includes an electrostatic electrode layer 110; a first dielectric layer 122 disposed on the electrostatic electrode layer; and a temperature controller 140 adjusting a temperature of the first dielectric layer. The first dielectric layer may include an air gap 124 formed at the first dielectric layer, the air gap may be filled with a gas, and the first dielectric layer 122 may have a first dielectric constant ε1 and first electrical conductivity σ1, and the gas may have a second dielectric constant ε2 and second electrical conductivity σ2.

The temperature controller 140 may heat the first dielectric layer 122 while an external voltage is applied to the electrostatic electrode layer, and the temperature controller 140 may cool the first dielectric layer 122 while an external voltage is applied to the electrostatic electrode layer. The first dielectric layer 122 may have electrical conductivity varying depending on temperature.

A ratio of the second dielectric constant to the first dielectric constant (ε2/ε1) may be the same as a ratio of the second electrical conductivity to the first electrical conductivity (σ2/σ1).

In the cooled state, the first dielectric layer may have a first dielectric constant and first electrical conductivity, and the second dielectric layer may have a second dielectric constant and second electrical conductivity. A ratio of the second dielectric constant to the first dielectric constant may be the same as a ratio of the second electrical conductivity to the first electrical conductivity. Accordingly, in the cooled state, the interface charges may be removed. That is, during substrate processing, the first dielectric layer may be maintained at a high temperature to increase the electrical conductivity and maintain high electrostatic force. The substrate processing may include substrate transfer, plasma etching, and deposition processes. On the other hand, when the substrate processing is completed, the first dielectric layer may be set to a low temperature to reduce the electrical conductivity and reduce the interface charges. Accordingly, the substrate may be desorbed immediately when an external power supply is removed.

The present disclosure may also be applied to a case of another dielectric rather than an air gap.

[Interface Surface Charge Density According to Opposite Voltage Pulses]

Figure 23:
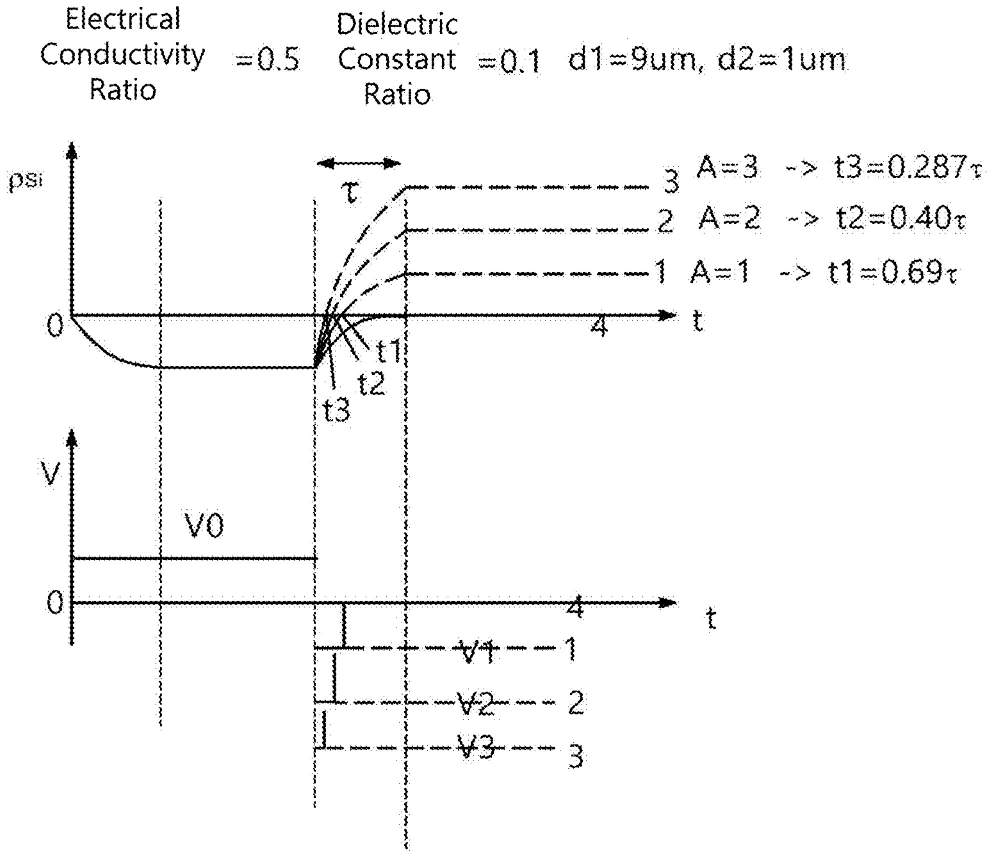
FIG. 23 is a conceptual diagram illustrating an electrostatic device according to an embodiment of the present disclosure.

FIG. 23 is a conceptual diagram illustrating an electrostatic device according to an embodiment of the present disclosure.

Referring to FIG. 23, in Case II, a first voltage may be applied to operate the electrostatic device. An electric field E2 of a second region may be changed to be saturated over time. When the electric field E2 of the second region is saturated, an interface may be charged at negative interface surface charge density. The negative interface surface charge density may have a relatively large relaxation time T.

When the negative interface surface charge density intends to be removed, a second voltage of polarity opposite to polarity of the first voltage may be applied. When a second voltage of polarity opposite to polarity of the first voltage is applied, a time τ at which the interface charge becomes zero is given as follows.

$$t = \tau \ln\left[\frac{V_1 - V_0}{V_1}\right] \quad \text{[Equation 9]}$$

When a magnitude of the second voltage is the same as a magnitude of the first voltage, a time t1 at which the interface surface charge density becomes zero may be 0.69 τ.

When the magnitude of the second voltage is twice the magnitude of the first voltage, the time t1 at which the interface surface charge density becomes zero may be 0.40 τ. When the magnitude of the second voltage is three times the magnitude of the first voltage, the time t1 at which the interface surface charge density becomes zero may be 0.287 τ.

However, an application time of the opposite voltage to remove the interface surface charge density may be relatively long due to the large relaxation time r.

The above description may be equally applied to Case I and Johnson-Rahbek type.

Referring to FIGS. 1 and 23, an electrostatic device 10 includes an electrostatic electrode layer 110; a dielectric layer 122 disposed on the electrostatic electrode layer and having a gap space 124; and a power supply 130 applying a voltage to the electrostatic electrode layer. A method of dechucking the electrostatic device includes applying a first voltage V0 to the power supply 130 to adsorb a substrate 120 and accumulate first interface charges between a dielectric layer and the gap space; and applying a second voltage V1~V3 of polarity opposite to polarity of the first voltage to the power supply 130 to remove the first interface charges between the gap space and the dielectric layer and perform dechucking.

A relaxation time defined by resistance and capacitance of the dielectric layer and the gap space may be greater than application times t1, t2, and t3 of the second voltage V1~V3.

An absolute value of the second voltage may be greater than an absolute value of the first voltage.

For example, the absolute value of the second voltage may be the same as the absolute value of the first voltage, and an application time of the second voltage may be 0.69 times a characteristic relaxation time defined by resistance and capacitance of the gap space.

For example, the absolute value of the second voltage may be twice the absolute value of the first voltage, and the application time of the second voltage may be 0.40 times the characteristic relaxation time defined by the resistance and capacitance of the gap space.

For example, the absolute value of the second voltage may be three times the absolute value of the first voltage, and the application time of the second voltage may be 0.287 times the characteristic relaxation time defined by the resistance and capacitance of the gap space.

Referring to FIGS. 1 and 14B, an electrostatic device 10 includes an electrostatic electrode layer 110; a dielectric layer 122 disposed on the electrostatic electrode layer and having a gap space 124; and a power supply 130 applying a voltage to the electrostatic electrode layer. A method of dechucking the static device includes applying a first voltage to the power supply to adsorb a substrate and accumulate first interface charges between a dielectric layer and a gap space; and applying a second voltage, greater than the first voltage, to the power supply to induce discharge to the gap space and reduce the first interface charges.

A ratio of electrical conductivity of the gap space to electrical conductivity of the dielectric layer (σ2/σ1) may be greater than a ratio of a dielectric constant of the gap space to a dielectric constant of the dielectric layer (ε2/ε1).

[Interface Charge According to Bipolar Voltage]

Figure 24:
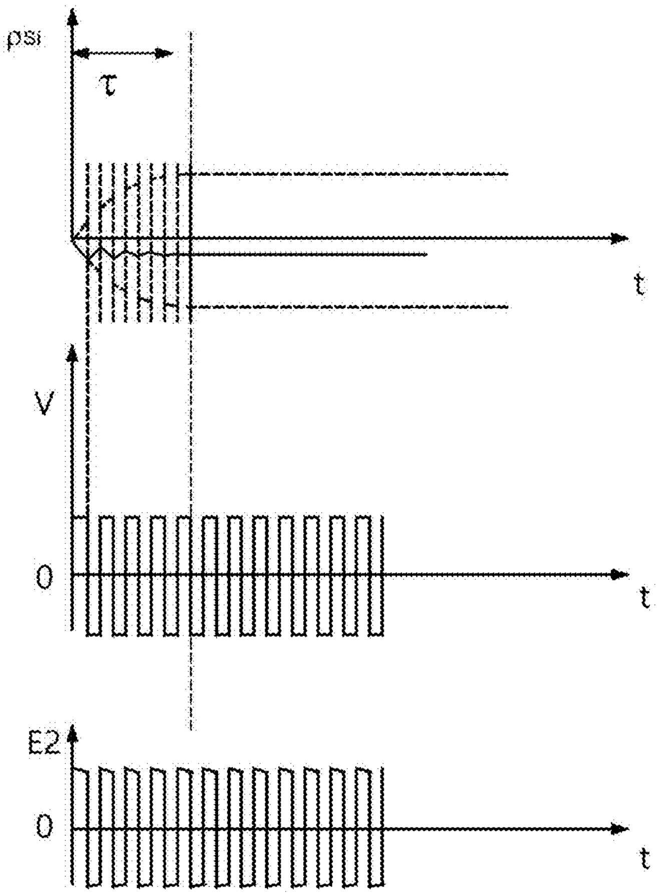
FIG. 24 is a conceptual diagram illustrating an electrostatic device according to an embodiment of the present disclosure.

FIG. 24 is a conceptual diagram illustrating an electrostatic device according to an embodiment of the present disclosure.

Referring to FIG. 24, in Case II, a first voltage may be applied to operate an electrostatic device. An electric field E2 of a second region may be changed to be saturated over time. Negative interface surface charge density may have a relatively large relaxation time Tr.

After dividing the relaxation time τ into a plurality of sections, a positive first voltage and a negative second voltage may be alternately applied. Accordingly, the interface surface charge density may not be accumulated over time and may be maintained at a value close to zero. Preferably, the relaxation time τ may be divided into 10 or more sections.

Accordingly, when an external voltage is removed at a time at which electrostatic force intends to be removed, the interface surface charge density may be reduced to almost zero and the electrostatic force may be removed immediately.

Even in Cases I, III, and IV, a positive first voltage and a negative second voltage may be alternately applied after dividing the relaxation time τ into a plurality of sections. Accordingly, the interface surface charge density may not be accumulated over time and may be maintained at a value close to zero.

Referring to FIGS. 1 and 24, an electrostatic device 10 according to an embodiment of the present disclosure includes an electrostatic electrode layer 110; first and second dielectric layers 122 and 124 disposed on the electrostatic electrode layer; and a power supply 130 applying a voltage to the electrostatic electrode layer.

A method of operating the electrostatic device includes applying a first voltage to the power supply 130 to adsorb a substrate 120 on the dielectric layer and accumulate a first interface charge; and applying a second voltage of polarity opposite to polarity of the first voltage to remove first interface charges accumulated between a first dielectric layer and a second dielectric layer with charges of opposite polarities.

The first voltage and the second voltage may be alternately repeated, and an application time of the first voltage may be smaller than a time constant of the first interface charge.

The application time of the first voltage is the same as the application time of the second voltage, and the time constant of the first interface charge may be 10 seconds or more. For example, this may be effective in the Coulomb type.

The first voltage may have a positive value, and the substrate 120 may be charged with negative charges at the first voltage, and the first interface charge may have a negative value.

Referring to FIGS. 1 and 24, an electrostatic device 10 according to an embodiment of the present disclosure includes an electrostatic electrode layer 110; a first dielectric layer 122 and a second dielectric layer 124 disposed on the electrostatic electrode layer; and a power supply 130 applying a voltage to the electrostatic electrode layer. A method of operating the electrostatic device includes applying a first voltage to the power supply 130 to adsorb a substrate 120 and accumulate first interface charges between the first dielectric layer 122 and the second dielectric layer 124; and applying a second voltage of polarity opposite to polarity of the first voltage to accumulate interface charges of opposite polarity and adsorb the substrate 120.

The application time of the first voltage may be smaller than the time constant of the first interface charge. The application time of the first voltage may be the same as the application time of the second voltage, and the time constant of the first interface charge may be 10 seconds or more. The first voltage and the second voltage may be alternately repeated.

[Interface Charge According to Irradiation of Ultraviolet/Visible Light]

Figure 25A:
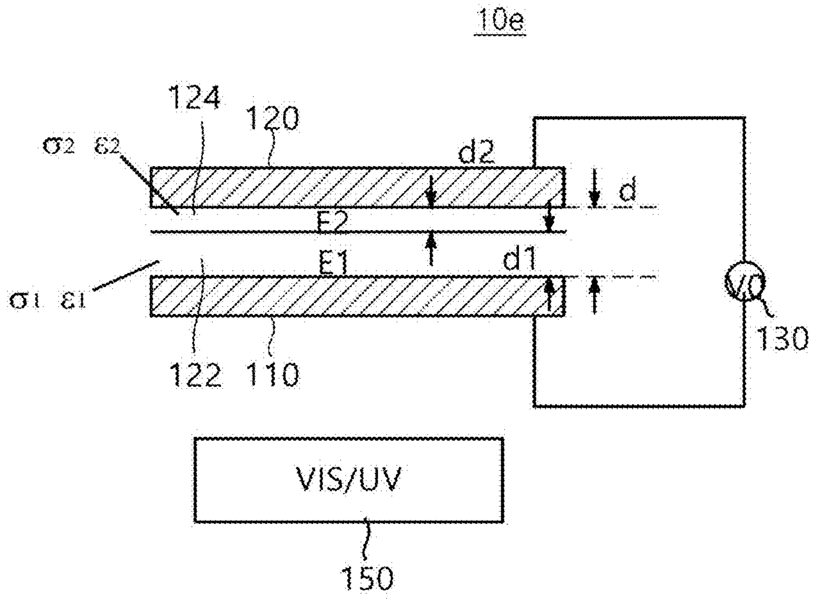
FIG. 25A is a conceptual diagram illustrating an electrostatic device according to an embodiment of the present disclosure.

FIG. 25A is a conceptual diagram illustrating an electrostatic device according to an embodiment of the present disclosure.

Figure 25B:
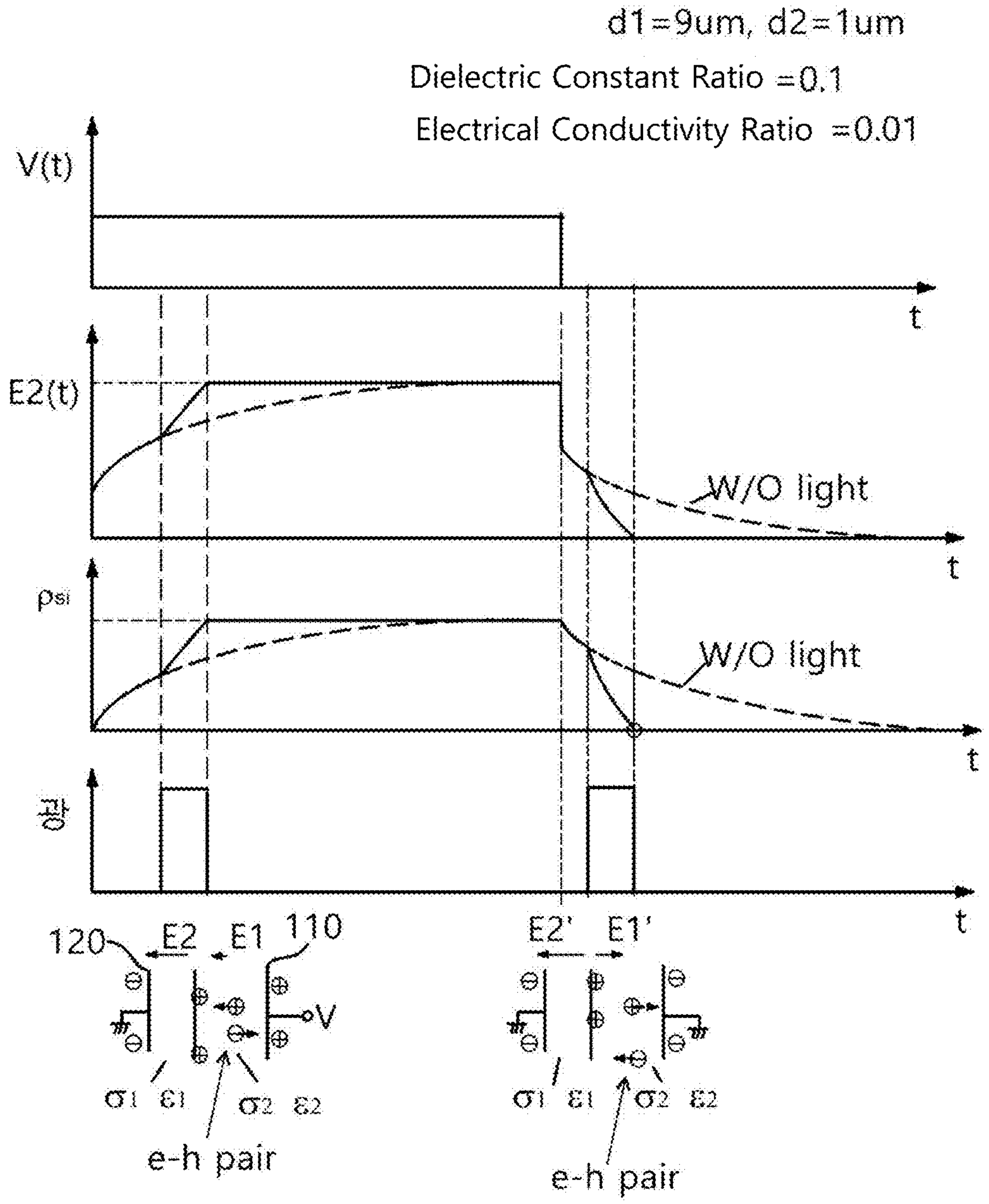
FIG. 25B is a conceptual diagram illustrating an operation of the electrostatic device of FIG. 25A.

FIG. 25B is a conceptual diagram illustrating an operation of the electrostatic device of FIG. 25A.

Figure 25C:
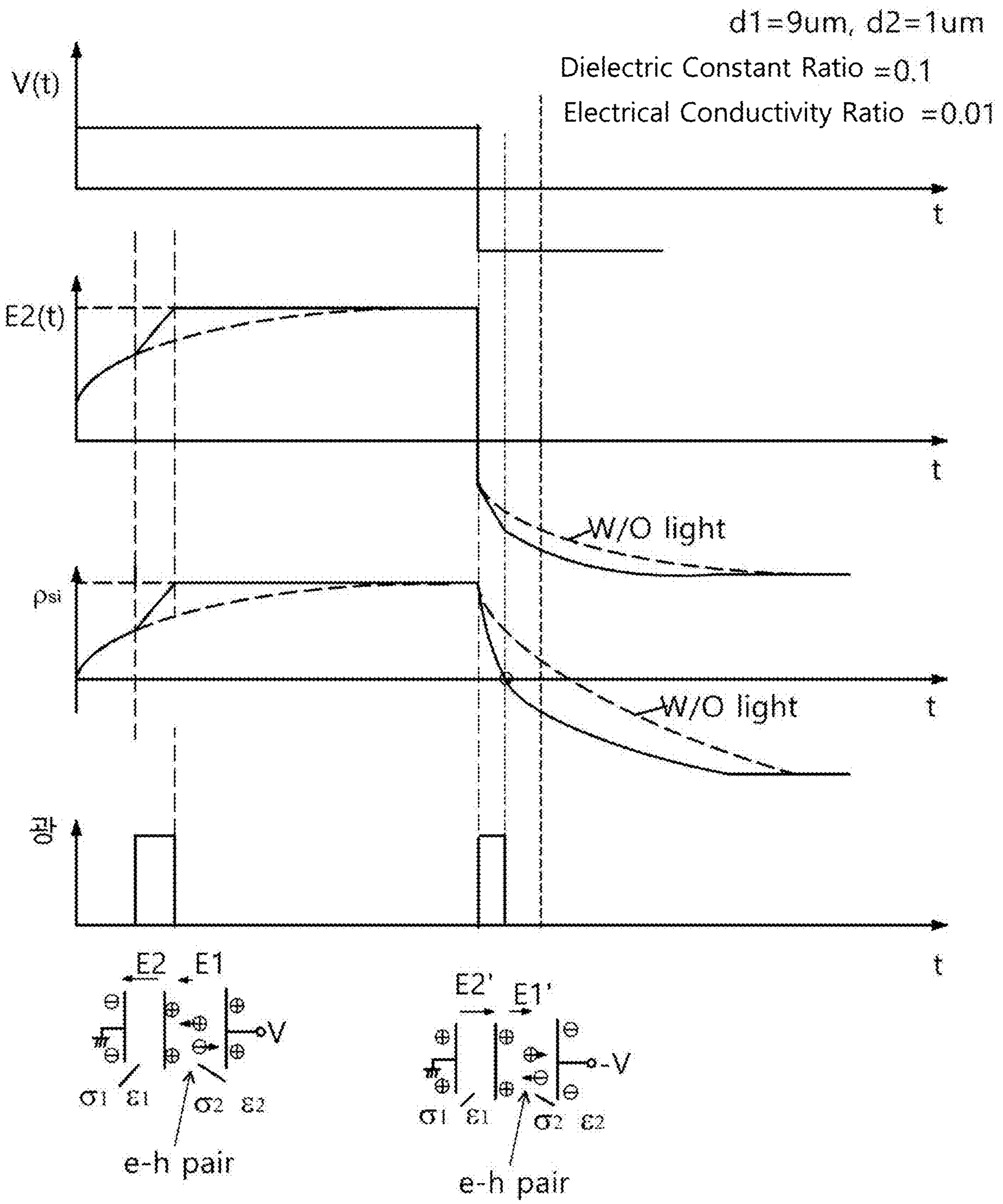
FIG. 25C is a conceptual diagram illustrating an operation of the electrostatic device of FIG. 25A.

FIG. 25C is a conceptual diagram illustrating an operation of the electrostatic device of FIG. 25A.

Figure 25D:
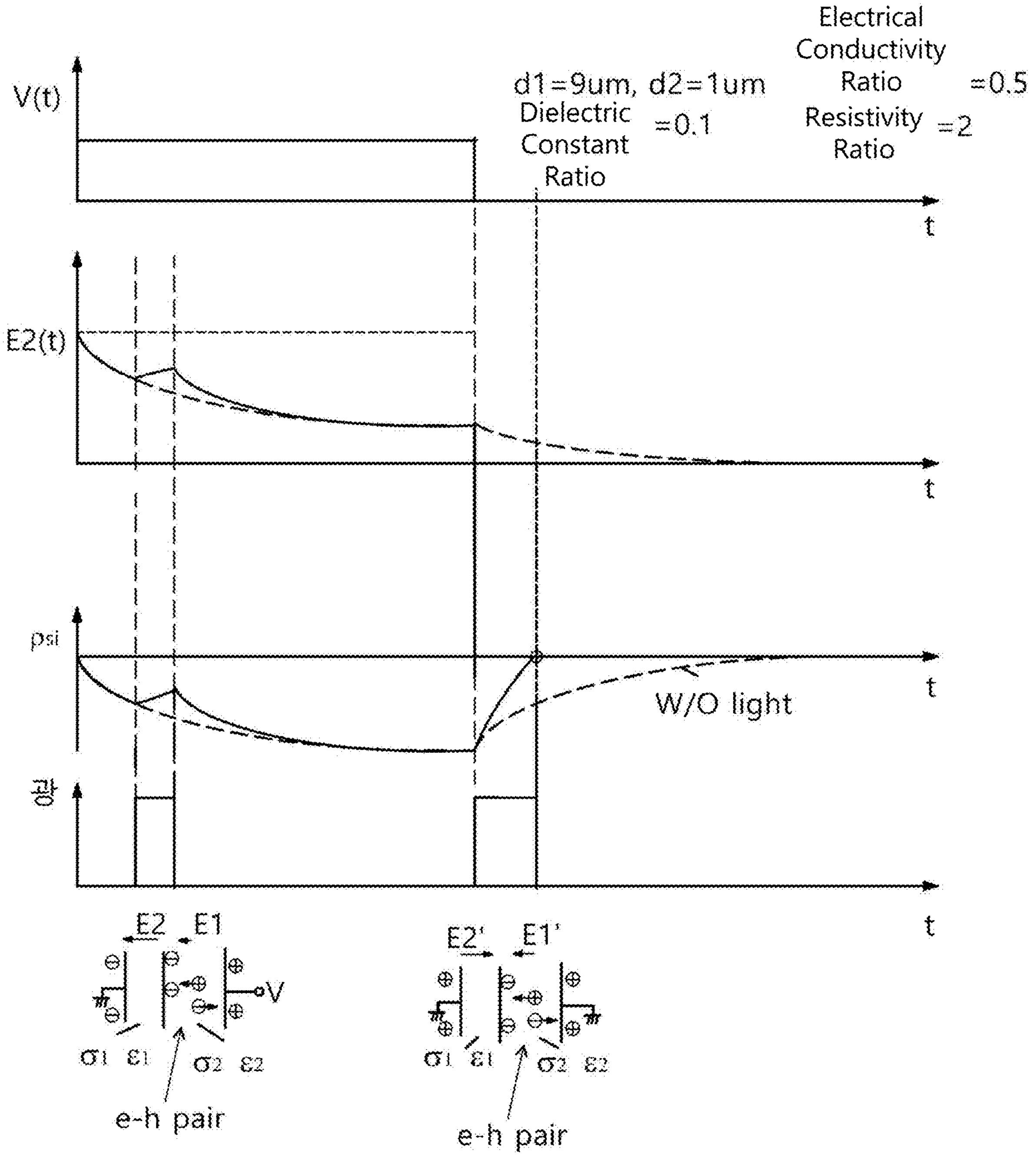
FIG. 25D is a conceptual diagram illustrating an operation of the electrostatic device of FIG. 25A.

FIG. 25D is a conceptual diagram illustrating an operation of the electrostatic device of FIG. 25A.

Figure 26:
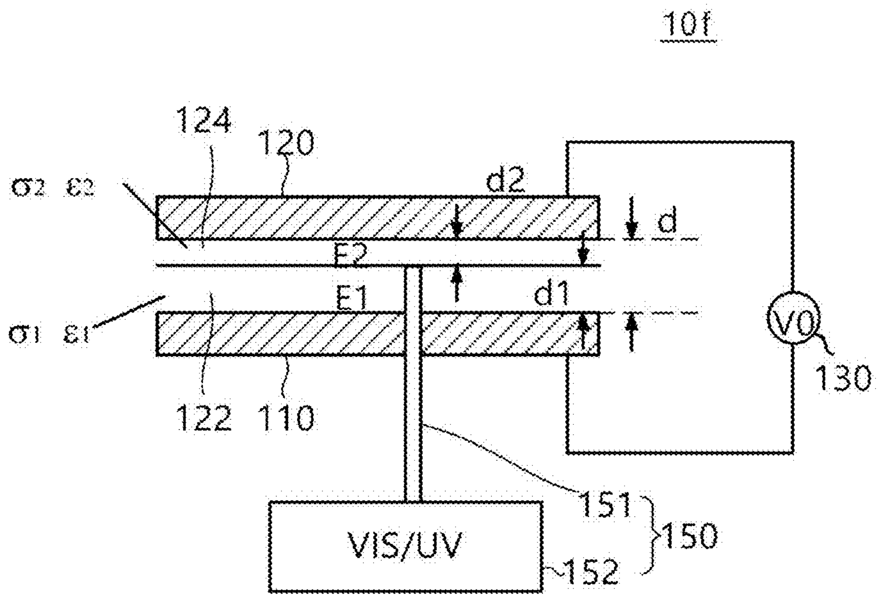
FIG. 26 is a conceptual diagram illustrating an electrostatic device according to an embodiment of the present disclosure.

FIG. 26 is a conceptual diagram illustrating an electrostatic device according to an embodiment of the present disclosure.

Referring to FIGS. 25A to 25D and FIG. 26, a first dielectric layer 122 and a second dielectric layer 124 may be stacked between a first electrode 110 and a second electrode 120. A first region may be formed as the first dielectric layer 122, have a first dielectric constant ε1 and first electrical conductivity 61, and have a thickness d1. A second region may be formed as the second dielectric layer 124, have a second dielectric constant ε2 and second electrical conductivity σ2, and have a thickness d2. The electrostatic device may include a light-providing part 150 controlling an interface surface charge density.

The light-providing part 150 may provide ultraviolet/visible light to an interface between the first dielectric layer and the second dielectric layer. The ultraviolet/visible light may generate electrons-holes in the first dielectric layer or the second dielectric layer to control the interface surface charge density. A wavelength of a light irradiation means may be greater than or similar to bandgap energy of the dielectric. Alternatively, the wavelength of the light irradiation means may be an ultraviolet range.

The light-providing part 150 may include an optical fiber 151 and an ultraviolet light source 152. The optical fiber may be formed of quartz, capable of transmitting ultraviolet. The optical fiber 150 may be disposed through the first electrode and the dielectric layer to be exposed to the second dielectric layer. Preferably, the second dielectric layer may be an air gap. A surface of the dielectric layer, providing a lower surface of the gap space, may be roughened for diffusion.

Referring to FIG. 25B, a first voltage is applied between the first electrode and the second electrode. In this case (Johnson-Rahbek type), the second dielectric layer may be an air gap. The interface charge may have a positive value and may be saturated with a relaxation time. An optical pulse may be irradiated to the first dielectric layer 122 and the second dielectric layer 124 before a saturated state (or a steady state). In this case, the second dielectric layer 124 may be an air gap. The optical pulse may generate electron-hole pairs to reduce the relaxation time and reach the saturated state rapidly.

When a positive voltage is applied to the first electrode 110 and the second electrode is grounded, the first electrode may be charged with positive charges and the second electrode may be charged with negative charges. An interface charge may have a positive value. When external light is irradiated, electron-hole pairs generated in the first dielectric layer may be generated. Electrons may move in a direction of the first electrode, and holes may move in a direction of the interface. Accordingly, the interface charge density may reach the saturated state within a short time. It is assumed that the physical properties of the air gap are not changed by light irradiation.

Then, the first voltage between the first electrode and the second electrode is removed. In this case, the interface charge may be removed with a relaxation time. The first electrode may be grounded and the second electrode may be grounded. Accordingly, the interface charge has a positive value, so that the first electrode may be charged with negative charges and the second electrode may be charged with negative charges. A first electric field E1' of the first region may be in a direction of the first electrode, and the second electric field E2' of the second region may be in a direction of the second electrode. When an optical pulse is irradiated, the first dielectric layer may generate electron-hole pairs. Electrons may move towards the interface, and holes may move towards the first electrode. Accordingly, the interface charge may be removed at a higher speed.

On the other hand, when electrical conductivity of each dielectric is changed by light irradiation, a new equilibrium state (a steady state) may be reached.

Referring to FIG. 25C, a first voltage may be applied between a first electrode and a second electrode. In this case (Johnson-Rahbek type), a second dielectric layer may be an air gap. An interface charge may have a positive value and may be saturated with a relaxation time. An optical pulse may be irradiated to the dielectric before a saturated state. In this case, the optical pulse may generate charges-holes to reduce the relaxation time.

Then, a second voltage of polarity opposite to polarity of the first voltage may be applied between the first electrode and the second electrode. The first electrode may be charged with negative charges, and the second electrode may be charged with positive charges. An interface charge may have a positive value. Light may be irradiated to generate electron-hole pairs in the first dielectric layer. Electrons may move towards the interface, and holes may move towards the first electrode. In this case, the interface charge may be charged with charges of opposite polarity with a relaxation time. When an optical pulse is irradiated, the interface charge may be charged with charges of opposite polarity at a higher speed. That is, for dechucking, when a second voltage of opposite polarity is applied and light is irradiated, the interface charge reaches zero more rapidly. While the light and/or second voltage are removed when the interface charge is at zero, the interface charge may be removed.

Referring to FIG. 25D, a first voltage may be applied between a first electrode and a second electrode. In this case (Coulomb type), a second dielectric layer may be an air gap. An interface charge may have a negative value and may be saturated with a relaxation time. An optical pulse may be irradiated to the dielectric before a saturated state. In this case, the optical pulse may generate charge-holes to remove the interface charge.

Then, the first voltage between the first electrode and the second electrode may be removed. In this case, the interface charge may be removed with a relaxation time. When an optical pulse is irradiated, the interface charge may be removed at a higher speed. That is, when light is irradiated for dechucking, the interface charge may reach zero more rapidly.

Referring to FIG. 26, an electrostatic device 10*e*/10*f* includes an electrostatic electrode layer 110; a dielectric layer 122/124 disposed on the electrostatic electrode layer; and a light-providing part 150 providing visible light/ultraviolet to the dielectric layer. The light-providing part 150 may include an optical fiber 151 and a light source 152.

At least one optical fiber 151 may include at least one optical fiber disposed in an air gap 124 through the electrostatic electrode layer 110 and the dielectric layer 122. The optical fiber may transmit ultraviolet. A core and cladding of the optical fiber 151 may be formed of quartz. A surface of the dielectric layer providing a lower surface of the air gap 124 may be roughened for diffusion. The light-providing part 150 may generate electrons-holes in the dielectric layer to remove the interface charge.

Referring to FIGS. 25 and 26, an electrostatic device 10*e*/10*f* includes an electrostatic electrode layer 110; a dielectric layer 122/124 disposed on the electrostatic electrode layer; and a light-providing part 150 providing ultraviolet to the dielectric layer 122 and 124. A method of dechucking the electrostatic device includes applying a first voltage to the electrostatic electrode layer 110; removing the first voltage applied to the electrostatic electrode layer 110; providing light to the dielectric layer 122/124 through the light-providing part 150; and removing charges accumulated on a rear surface of the dielectric layer 122/124 or the substrate 120 disposed on the dielectric layer by the light.

Removing the first voltage applied to the electrostatic electrode layer and providing the light may be simultaneously performed. The light may be provided after the first voltage applied to the electrostatic electrode layer is removed. A counter pulse of opposite polarity and the light may be provided sequentially or simultaneously after the first voltage applied to the electrostatic electrode layer is removed.

[Electric Field in Plasma Situation]

An electrostatic device may operate in a situation in which plasma is generated. Specifically, the second electrode may be a semiconductor substrate that is being processed, and plasma may be generated on the semiconductor substrate. The plasma may be considered to be electrically grounded. The electrostatic device may be a substrate adsorption device of a plasma substrate processing device processing a substrate with plasma.

[Case of Depositing Dielectric on Rear Surface of the Substrate]

The operating principle of an electrostatic device having a three-layer structure according to an example embodiment will now be described.

FIG. 27 is a conceptual diagram illustrating a structure of an electrostatic device according to an embodiment of the present disclosure.

Referring to FIG. 27, a first dielectric layer 122, a second dielectric layer 124, and a third dielectric layer 126 may be stacked between a first electrode 110 and a second electrode 120. A first region may be formed as the first dielectric layer 122, have a first dielectric constant ε1 and a first electrical conductivity 61, and have a thickness d1. A second region may be formed as the second dielectric layer 124, have a second dielectric constant ε2 and a second electrical conductivity 62, and have a thickness d2. A third region may be formed as the third dielectric layer 126, have a third dielectric constant ε3 and a third electrical conductivity 63, and have a thickness d3. A total thickness may be d. The third dielectric layer 126 may be a material coated on the second electrode 120. A voltage V0 is applied between the first electrode 110 and the second electrode 120.

An interface surface charge density between the first dielectric layer and the second dielectric layer is ρsa. An interface surface charge density between the second dielectric layer and the third dielectric layer is $\rho_{sb}$. An electric field of the first dielectric is E1, an electric field of the second dielectric is E2, and an electric field of the third dielectric is E3.

When the interface charge is ignored, the electric field E1, the electric field E2, and the electric field E3 of the first region, the second region, and the third region are given as follows.

$$E_1 = \frac{\varepsilon_2\varepsilon_3 V_0}{\varepsilon_1\varepsilon_2 d_3 + \varepsilon_1\varepsilon_3 d_2 + \varepsilon_2\varepsilon_3 d_1}$$ [Equation 10]

$$E_2 = \frac{\varepsilon_1\varepsilon_3 V_0}{\varepsilon_1\varepsilon_2 d_3 + \varepsilon_1\varepsilon_3 d_2 + \varepsilon_2\varepsilon_3 d_1}$$

$$E_3 = \frac{\varepsilon_1\varepsilon_2 V_0}{\varepsilon_1\varepsilon_2 d_3 + \varepsilon_1\varepsilon_3 d_2 + \varepsilon_2\varepsilon_3 d_1}$$

The electric fields E1, E2, and E3 may depend only on a dielectric constant in each region in an initial state. The electric field E3 of the third region may be the same as an electric field in the case in which third dielectric layer 126 is absent when a thickness of the third dielectric layer 126 is relatively significantly small.

When electrical conductivity is taken into consideration, the electric field E1, the electric field E2, and the electric field E3 of the first region, the second region, and the third region are given in the steady state, as follows.

$$E_1 = \frac{\sigma_2\sigma_3 V_0}{(\sigma_1\sigma_2 d_3 + \sigma_1\sigma_3 d_2 + \sigma_2\sigma_3 d_1)};$$ [Equation 11]

$$E_2 = \frac{\sigma_1\sigma_3 V_0}{(\sigma_1\sigma_2 d_3 + \sigma_1\sigma_3 d_2 + \sigma_2\sigma_3 d_1)};$$

$$E_3 = \frac{\sigma_1\sigma_2 V_0}{(\sigma_1\sigma_2 d_3 + \sigma_1\sigma_3 d_2 + \sigma_2\sigma_3 d_1)};$$

The electric fields E1, E2, and E3 may depend only on the electrical conductivity, rather than the dielectric constant, in each region in the steady state. The electric field E3 of the third region may be the same as an electric filed in the case in which the third dielectric layer 126 is absent when a thickness of the third dielectric layer 126 is relatively significantly small.

The interface surface charge densities $\rho_{sa}$ and $\rho_{sb}$ are given in the steady state, as follows.

$$\rho_{sa} = \frac{(\varepsilon_2\sigma_1\sigma_2 - \varepsilon_1\sigma_2\sigma_3)V_0}{(\sigma_1\sigma_2 d_3 + \sigma_1\sigma_3 d_2 + \sigma_2\sigma_3 d_1)};$$ [Equation 12]

$$\rho_{sb} = \frac{(\varepsilon_3\sigma_1\sigma_2 - \varepsilon_2\sigma_1\sigma_3)V_0}{(\sigma_1\sigma_2 d_3 + \sigma_1\sigma_3 d_2 + \sigma_2\sigma_3 d_1)}$$

When a ratio of the electrical conductivities at adjacent interfaces is the same as a ratio of the dielectric constants, the interface charge density becomes zero.

In the third region, an electrostatic pressure f of the second electrode is given, as follows.

$$f = \frac{1}{2}\varepsilon_3 E_3^2$$ [Equation 13]

The electric fields E1, E2, and E3 of the first region, the second region, and the third region are given in a transient state, as follows.

$$E_1(t) = \frac{(-\varepsilon_2 d_3 - \varepsilon_3 d_2)\rho_{sa}(t) - s_3 d_3\rho_{sb}(t) + \varepsilon_2\varepsilon_3 V_0}{(\varepsilon_1\varepsilon_2 d_3 + \varepsilon_1\varepsilon_3 d_2 + \varepsilon_2\varepsilon_3 d_1)};$$ [Equation 14]

$$E_2(t) = \frac{\varepsilon_3 d_1\rho_{sa}(t) - \varepsilon_1 d_3\rho_{sb}(t) + \varepsilon_1\varepsilon_3 V_0}{(\varepsilon_1\varepsilon_2 d_3 + \varepsilon_1\varepsilon_3 d_2 + \varepsilon_2\varepsilon_3 d_1)};$$

-continued $$E_3(t) = \frac{\varepsilon_2 d_1\rho_{sa}(t) + (\varepsilon_2 d_1 + \varepsilon_1 d_1)\rho_{sb}(t) + \varepsilon_1\varepsilon_2 V_0}{(\varepsilon_1\varepsilon_2 d_3 + \varepsilon_1\varepsilon_3 d_2 + \varepsilon_2\varepsilon_3 d_1)};$$

The interface surface charge densities $\rho_{sa}$ and $\rho_{sb}$ are given in the transient state, as follows.

[Equation 15]

$$\begin{pmatrix} \frac{\partial\rho_{sa}}{\partial t} \\ \frac{\partial\rho_{sb}}{\partial t} \end{pmatrix} = \frac{1}{DetA} \begin{pmatrix} -\sigma_1(\varepsilon_2 d_2 + \varepsilon_3 d_2) - \sigma_2\varepsilon_3 d_1 & -\sigma_1\varepsilon_3 d_3 - \sigma_2\varepsilon_1 d_3 \\ \sigma_2\varepsilon_3 d_1 - \sigma_3\varepsilon_2 d_1 & -\varepsilon_1 d_3\sigma_2 - \sigma_3(\varepsilon_2 d_1 + \varepsilon_1 d_2) \end{pmatrix} + \frac{1}{DetA}\begin{pmatrix} (\sigma_1\varepsilon_2 d_3 - \sigma_2\varepsilon_1\varepsilon_3) \\ (\sigma_2\varepsilon_1 d_2 - \sigma_3\varepsilon_1\varepsilon_2) \end{pmatrix}$$

$$DetA = (\varepsilon_1\varepsilon_2 d_3 + \varepsilon_1\varepsilon_3 d_2 + \varepsilon_2\varepsilon_3 d_1)$$

An eigenvalue k of the above equation is given, as follows.

[Equation 16]

$$\begin{pmatrix} \frac{\partial\rho_{sa}}{\partial t} \\ \frac{\partial\rho_{sb}}{\partial t} \end{pmatrix} = \begin{pmatrix} a_{11} - \lambda & a_{12} \\ a_{21} & a_{22} - \lambda \end{pmatrix} + \frac{1}{DetA}\begin{pmatrix} (\sigma_1\varepsilon_2\varepsilon_3 - \sigma_2\varepsilon_1\varepsilon_3) \\ (\sigma_2\varepsilon_1\varepsilon_2 - \sigma_3\varepsilon_1\varepsilon_2) \end{pmatrix}$$

$$a_{11} = \frac{-\sigma_1(\varepsilon_2 d_2 + \varepsilon_3 d_2) - \sigma_2\varepsilon_3 d_1}{DetA}$$

$$a_{12} = \frac{-\sigma_1\varepsilon_3 d_3 + \sigma_2\varepsilon_1 d_3}{DetA}$$

$$a_{21} = \frac{\sigma_2\varepsilon_3 d_1 + \sigma_3\varepsilon_2 d_1}{DetA}$$

$$a_{22} = \frac{-\varepsilon_1 d_3\sigma_2 - \sigma_3(\varepsilon_2 d_1 + \varepsilon_1 d_2)}{DetA}$$

$$\lambda_{1,2} = \frac{(a_{11} + a_{22}) \pm \sqrt{(a_{11} + a_{22})^2 - 4(a_{11}a_{22} - a_{12}a_{21})}}{2}$$

$$\tau_1 = \mathrm{abs}(1/\lambda_1)$$

$$\tau_2 = \mathrm{abs}(1/\lambda_2)$$

Here, the relaxation times τ1 and τ2 are reciprocals of absolute values of the eigenvalues.

An eigenvector may be given, as follows.

$$\chi_1 = \begin{pmatrix} \lambda_1 - a_{22} \\ a_{21} \end{pmatrix};\ \chi_2 = \begin{pmatrix} \lambda_2 - a_{22} \\ a_{21} \end{pmatrix}$$ [Equation 17]

The interface surface charge densities $\rho_{sa}$ and $\rho_{sb}$ are given, as follows.

[Equation 18]

$$\begin{pmatrix} \rho_{sa}(t) \\ \rho_{sa}(t) \end{pmatrix} = C_1\chi_1 e^{\lambda_1 t} + C_2\chi_2 e^{\lambda_2 t} + \begin{pmatrix} \frac{(\varepsilon_2\sigma_1\sigma_3 - \varepsilon_1\sigma_2\sigma_3)V_0}{(\sigma_1\sigma_2 d_3 + \sigma_1\sigma_3 d_2 + \sigma_2\sigma_3 d_1)} \\ \frac{(\varepsilon_3\sigma_1\sigma_2 - \varepsilon_2\sigma_1\sigma_3)V_0}{(\sigma_1\sigma_2 d_3 + \sigma_1\sigma_3 d_2 + \sigma_2\sigma_3 d_1)} \end{pmatrix}$$

By applying initial conditions to the equation, coefficients C1 and C2 may be obtained.

Accordingly, the electric fields E1, E2, and E3) may be given by Equation 14.

[Comparison of Multilayer Characteristics

TABLE 6

| Case V | | |
|---|---|---|
| d1 = 90 [um] | d2 = 10 [um] | d3 = 0.1 [um] |
| ε1 = 10 [$\varepsilon_0$] | ε2 = 1 [$\varepsilon_0$] | ε3 = 4 [$\varepsilon_0$] |
| σ1 = 100 [10^(−12)/Ωm] | σ2 = 1 [10^(−12)/Ωm] | σ3 = 0.01 [10^(−12)/Ωm] |

TABLE 7

| Case VI | | |
|---|---|---|
| d1 = 90 [um] | d2 = 10 [um] | d3 = 0.1 [um] |
| ε1 = 10 [$\varepsilon_0$] | ε2 = 1 [$\varepsilon_0$] | ε3 = 4 [$\varepsilon_0$] |
| σ1 = 10^(−4) [10^(−12)/Ωm] | σ2 = 1 [10^(−12)/Ωm] | σ3 = 10^(−4) [10^(−12)/Ωm] |

TABLE 8

| Case VII | | |
|---|---|---|
| d1 = 90 [um] | d2 = 10 [um] | d3 = 0.1 [um] |
| ε1 = 10 [$\varepsilon_0$] | ε2 = 1 [$\varepsilon_0$] | ε3 = 4 [$\varepsilon_0$] |
| σ1 = 10 [10^(−12)/Ωm] | σ2 = 1 [10^(−12)/Ωm] | σ3 = 10^(−4) [10^(−12)/Ωm] |

TABLE 9

| Steady State | Case V | Case VI | Case VII |
|---|---|---|---|
| E3 | 4.78 [V MV/m] | 0.01 [V MV/m] | 10 [V MV/m] |
| $\rho_{sa}$ | 0.043 [V 10^(−5)C/m^2] | −0.1 [V 10^(−5)C/m^2] | 0 [V 10^(−5)C/m^2] |
| $\rho_{sb}$ | 19 [V 10^(−5)C/m^2] | 0.033 [V 10^(−5)C/m^2] | 40 [V 10^(−5)C/m^2] |
| τ1 | 10 [sec] | 21 [sec] | 16 [sec] |
| τ2 | 668 [sec] | 131,700 [sec] | 66,600 [sec] |

When the third dielectric layer 126 is present, the thickness d3 of the third dielectric layer is significantly small (0.1 μm), but the relaxation time τ increases significantly. In this case, the second dielectric constant ε2 of the second dielectric layer 124 was a dielectric constant ε0 of vacuum and second resistivity of the second dielectric layer 124 was 10^12 Ωm.

In Case V, in the steady state, the first interface surface charge density ρsa is about 0.043 and a second interface surface charge density ρsb is about 19. Therefore, in the steady state, relaxation time (τ=τ1+τ2) is 678 seconds, which is a large value.

In Case VI, in the steady state, the first interface surface charge density $\rho_{sa}$ is about −0.1 and the second interface surface charge density $\rho_{sb}$ is about 0.033. Therefore, in the steady state, a relaxation time (τ=τ1+τ2) is about 131,700 seconds, which is a significantly large value.

In Case VII, in the steady state, the first interface surface charge density $\rho_{sa}$ is about 0 and the second interface surface charge density $\rho_{sb}$ is about 40. Therefore, in the steady state, a relaxation time (τ=τ1+τ2) is about 66,600 seconds, which is a significantly large value.

Case V has a relaxation time of about 678 seconds and a high interface charge in the steady state. Due to the relation time of about 678 seconds, when an adsorption time (a few seconds to tens of seconds) is shorter than the relaxation time (678 seconds), the steady state may not be reached. Adsorption force may be changed depending on the adsorption time, so that an unstable operation is likely to occur. In addition, when dechucking, the large relaxation time may lead to difficulty in removing the interface charge.

In Case VI, when a third dielectric layer 126 having high resistivity is provided, electrostatic force may be maintained at the initial value during adsorption time (typically a few seconds to hundreds of seconds) due to a significantly large relaxation time (131,700 seconds). Accordingly, a stable operation may be performed.

In Case VI, the interface charge density is relatively low in a steady state. An initial value of the third electric field E3 is 0.013, and a value of the third electric field E3 in the steady state is 0.01. The change is about 20%, which is small. Accordingly, due to the large relaxation time (131,700 seconds), the initial value of the third electric field E3 may be maintained during an adsorption time (typically, a few seconds to hundreds of seconds).

In Case VII, a largest third electric field is provided. When the adsorption time (a few seconds to hundreds of seconds) is shorter than a relaxation time (about 66,600 seconds), an initial third electric field E3 may be used. Due to the large relaxation time, an initial value of the third electric field E3 may be maintained during the adsorption time (typically, a few seconds to hundreds of seconds).

In the Johnson-Rahbek type (Case V), when a third dielectric layer 126 is present, another means for accumulating interface surface charges, such as ultraviolet, may be required to increase the electrostatic force by accumulating the interface surface charge density more rapidly than the relaxation time when an external voltage is applied.

In the Johnson-Rahbek type (Case V), when a third dielectric layer 126 is present, another means for removing interface surface charge, such as ultraviolet, may be required to remove the interface surface charge density more rapidly than the relaxation time when an external voltage is removed.

When a ratio of electrical conductivities between adjacent dielectrics is equal to a ratio of dielectric constants, the interface surface charge density is zero. Accordingly, stable adsorption and desorption operations may be performed regardless of the relaxation time.

For example, when a material (a third dielectric layer) deposited on a rear surface of the substrate is a silicon oxide, the second dielectric layer 124 may be a material having the same properties as the silicon oxide. The first dielectric layer 122 may be an aluminum oxide having a high dielectric constant. When a ratio of the electrical conductivity of the second dielectric layer to the electrical conductivity of the first dielectric layer (σ2/σ1) is equal to a ratio of the dielectric constants (ε2/ε1), the interface charge density may be zero. Accordingly, the interface charge may be removed even in a multilayer structure.

Electrical conductivity of a dielectric depends on a temperature. Therefore, when the temperature is changed, the interface charges may be controlled.

According to a modified embodiment of the present invention, when the second dielectric layer is an air gap (or a vacuum gap) and an air gap cavity is formed between the first dielectric layer and a thin third dielectric layer, the relaxation time may be significantly increased and the third electric field may be relatively increased by a characteristic (high third resistivity) of the third dielectric layer.

Referring to FIG. 27, an electrostatic device 10*g* according to an embodiment of the present disclosure includes: an electrostatic electrode layer 110; a first dielectric layer 122 disposed on the electrostatic electrode layer 110; a second dielectric layer 124 disposed on the first dielectric layer; a substrate 120 disposed on the second dielectric layer; and a third dielectric layer 126 disposed between the lower surface of the substrate and the second dielectric layer.

The first dielectric layer 122 has a first dielectric constant ε1 and first electrical conductivity 61, the second dielectric layer 124 has a second dielectric constant ε2 and second electrical conductivity σ2, and the third dielectric layer 126 has a third dielectric constant 3 and third electrical conductivity σ3.

A ratio of the second dielectric constant to the first dielectric constant (ε2/ε1) may be equal to a ratio of the second electrical conductivity to the first electrical conductivity (σ2/σ1). Accordingly, an interface charge between the first dielectric layer 122 and the second dielectric layer 124 may be zero.

A ratio of the third dielectric constant to the second dielectric constant (ε3/ε2) is equal to the ratio of the third electrical conductivity to the second electrical conductivity (σ3/σ2). Accordingly, the interface charge between the second dielectric layer 124 and the third dielectric layer 126 may be zero.

[Serial and Parallel Connection Structures of Multilayer Structures]

Figure 28:
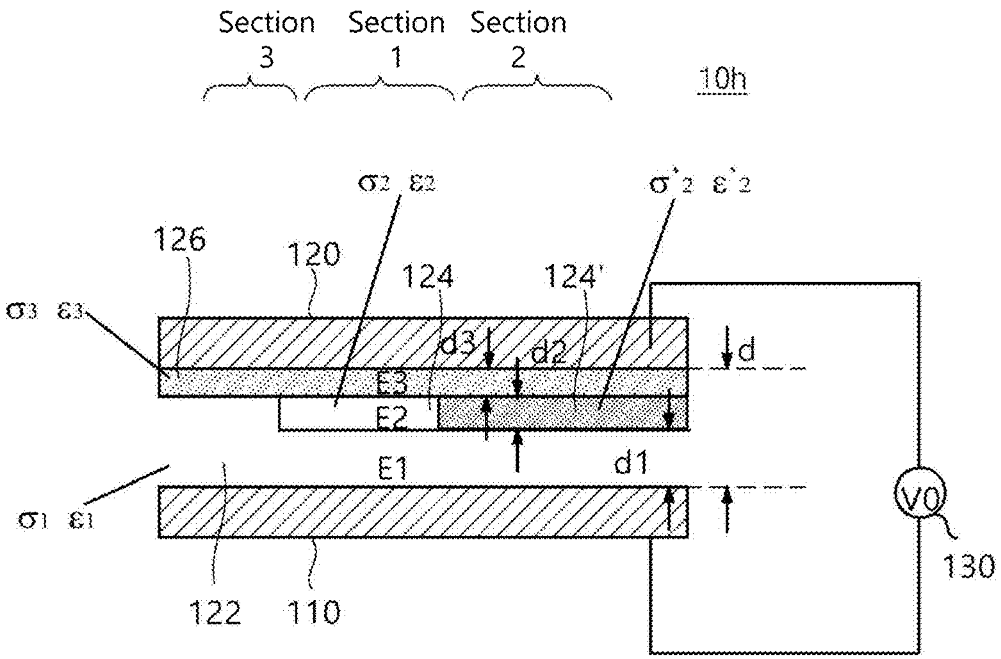
FIG. 28 is a conceptual diagram illustrating a structure of an electrostatic device according to an embodiment of the present disclosure.

FIG. 28 is a conceptual diagram illustrating a structure of an electrostatic device according to an embodiment of the present disclosure.

Referring to FIG. 28, in an electrostatic device 10*h*, a first dielectric layer 122, a second dielectric layer 124, and a third dielectric layer 126 may be stacked between a first electrode 110 and a second electrode 120. A first region may be formed as the first dielectric layer 122, have a first dielectric constant ε1 and first electrical conductivity 61, and have a thickness d1. A second region may be formed as the second dielectric layer 124, have a second dielectric constant ε2 and second electrical conductivity σ2, and have a thickness d2. A third region may be formed as a third dielectric layer 126, have a third dielectric constant 3 and third electrical conductivity σ3, and have a thickness d3. The total thickness may be d. The third dielectric layer 126 may be a material coated on the second electrode 120.

For example, the second dielectric layer 124 may be divided into three sections.

The first section may have a second main dielectric constant ε2 and second main electrical conductivity σ2. The second section may have a second preliminary dielectric constant ε'2 and second sub electrical conductivity σ'2. The third section may have the same physical properties as the first dielectric layer.

Characteristics for each section of a second dielectric may affect an overlying electric field of a third dielectric connected in series. Accordingly, characteristics of the third electric field of the third dielectric may change for each section.

For example, when only the first section and the third section are used, the first section may be an air gap. In this case, the electric field E3 of the third dielectric corresponding to the first section may be relatively increased compared to the electric field of the third dielectric corresponding to the third section.

When a third dielectric layer is deposited on the rear surface of the substrate, the electrostatic device needs to maintain a high electrostatic force on an edge of the substrate to prevent leakage of a cooling gas flowing in the air gap. In this case, the second section may have a second preliminary dielectric constant ε'2 and second preliminary electrical conductivity σ'2. When the second section is formed in a ring shape having a low dielectric constant or high electrical conductivity, high electrostatic force may be provided in a location corresponding to the second section.

[Bipolar Electrostatic Device]

A bipolar static device may have two electrostatic electrodes, and may operate by applying a voltage between a pair of electrostatic electrodes. Preferably, an adsorbate may have conductivity. An operating principle of a unipolar static device may be equally applied to the bipolar static device. In the case of a bipolar device having the same area and symmetry, the electrostatic force may be ¼ with respect to the unipolar device compared to the same voltage difference.

Figure 29:
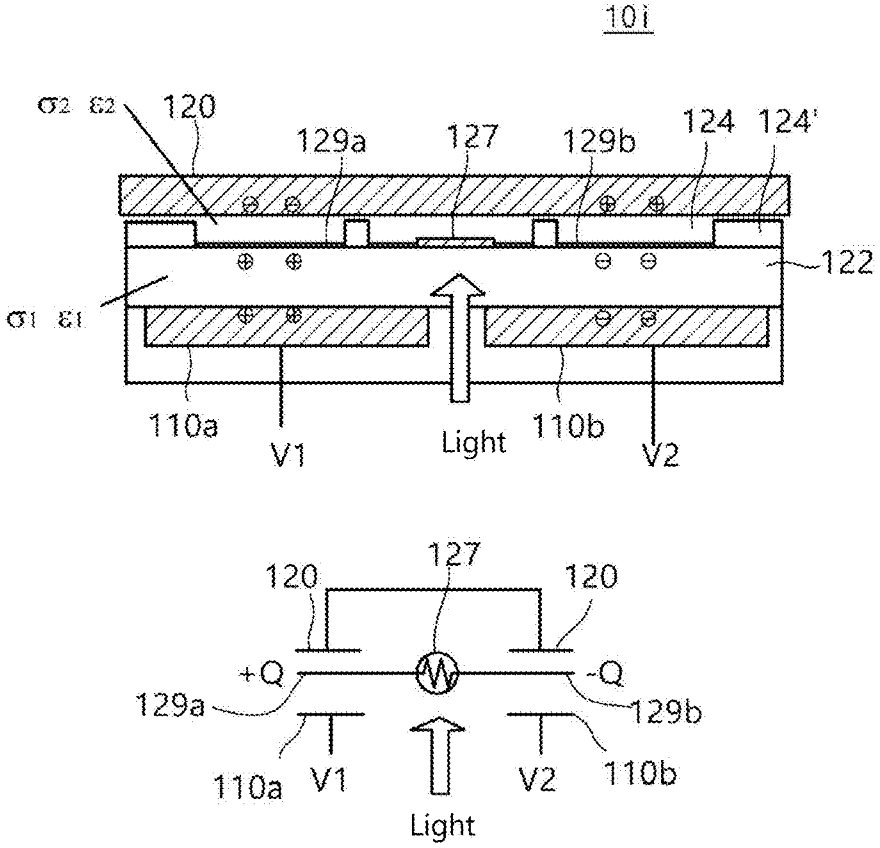
FIG. 29 is a conceptual diagram illustrating an electrostatic device according to an embodiment of the present disclosure.

FIG. 29 is a conceptual diagram illustrating an electrostatic device according to an embodiment of the present disclosure.

Referring to FIG. 29, a first dielectric layer 122 and a second dielectric layer 124 may be stacked between a first electrode 110 and a second electrode 120. A first region may be formed as the first dielectric layer 122, have a first dielectric constant ε1 and first electrical conductivity 61, and have a thickness d1.

A second region may be formed as the second dielectric layer 124, have a second dielectric constant ε2 and second electrical conductivity σ2, and have a thickness d2. The second dielectric layer may include a second preliminary dielectric layer 124'. The second preliminary dielectric layer may have a second sub dielectric constant ε'2 and second preliminary electrical conductivity σ'2, and have a thickness d'2. The second dielectric layer 124 and the second preliminary dielectric layer 124' may be disposed in parallel. For example, the second dielectric layer 124 may be an air gap, and the second preliminary dielectric layer 124' may be the same material as the first dielectric layer 122.

The first electrode 110 may be an electrostatic electrode layer connected to an external power supply, and include a first electrostatic electrode 110*a* and a second electrostatic electrode 110*b* disposed adjacent to each other to form a pair. The first electrostatic electrode 110*a* and the second electrostatic electrode 110*b* may have the same area.

A first conductive layer 129*a* may be disposed between the first dielectric layer 122 and the second dielectric layer 124 on the first static electrode 110*a*. The first conductive layer 129*a* may be charged with positive charges.

A second conductive layer 129*b* may be disposed between the first dielectric layer 122 and the second dielectric layer 124 on the second static electrode 120*b*. The second conductive layer 129*b* may be charged with negative charges.

Charges +Q charging the first conductive layer 129*a* and charges −Q charging the second conductive layer 129*b* have different signs and may have the same value. Accordingly, when the first conductive layer 129*a* and the second conductive layer 129*a* may be electrically connected to each other, charges accumulated on the first conductive layer 129*a* may be removed, and the charges accumulated on the second conductive layer 129*b* may be removed.

A resistance layer 127 may be disposed to connect the first conductive layer and the second conductive layer to each other. The resistance layer 127 may be the same material as the first conductive layer and the second conductive layer, or the resistance layer 127 may be a material having electrical conductivity changed when receiving light from the outside. For example, the resistance layer 127 may be CdS.

In the case of Coulomb type, the electrostatic force may be reduced when interface charges are generated. When the first conductive layer and the second conductive layer are directly connected to each other, the interface charges may cancel each other out, so that the electrostatic force may be maintained in the initial state.

On the other hand, in the Johnson-Rahbek type, high electrostatic force may be generated by accumulating interface charges. After an adsorption operation is performed by accumulating the interface charges, resistance of the resistance layer may be reduced by light during a charge removing operation (a dechucking operation). Accordingly, the resistance layer 127 may change in electrical conductivity when receiving light from the outside, and the interface charges may move to each other without being connected to an external circuit and reach an erase state.

Referring to FIG. 29, an electrostatic device 10*i* according to an embodiment of the present disclosure includes: electrostatic electrode layers 110*a* and 110*b*; a first dielectric layer 122 disposed on the electrostatic electrode layers; resistance layers 129*a*, 129*b*, and 127 disposed on the first dielectric layer; and an air layer 124 disposed on the resistance layers 129*a*, 129*b*, and 127. A protrusion part 124' formed on the first dielectric layer 122 may form an air layer between an adsorbate 120 and the first dielectric layer 122, and the resistance layer 127 may increase in electrical conductivity by light. The resistance layer 129*a*, 129*b*, and 127 may be CdS.

The resistance layers 129*a* and 129*b* may serve as layers on which interface charges are accumulated. In the case in which the interface charges intend to be removed, the resistance layers 129*a* and 129*b* may serve as conductors to remove charges when light is irradiated.

Referring to FIG. 29, an electrostatic device 10*i* according to an embodiment of the present disclosure includes: a first static electrode 110*a* receiving a first voltage; a second static electrode 110*b* receiving a second voltage; a first dielectric layer 122 disposed on the first static electrode 110*a* and the second static electrode 110*b*; a first conductive layer 129*a* disposed on a first dielectric layer in a location corresponding to the first static electrode 110*a*; a second conductive layer 129*b* disposed on the first dielectric layer in a location corresponding to the second static electrode 110*b*; and a photoresist layer 127 connecting the first conductive layer 129*a* and the second conductive layer 129*b* to each other.

The electrostatic device 10*i* may include an air layer 124 disposed on the first conductive layer 129*a* and the second conductive layer 129*b*, a protrusion part 124' formed on the first dielectric layer may form an air layer between the adsorbate and the first dielectric layer, and the photoresist layer 127 may increase in electrical conductivity by light. That is, light may not be irradiated to the photoresist layer 127 in an adsorption state, but may be irradiated to the photoresist layer 127 and the interface charge in a state in which the first voltage and the second voltage are removed for desorption. The photoresist layer 127 may be CdS.

Figure 30:
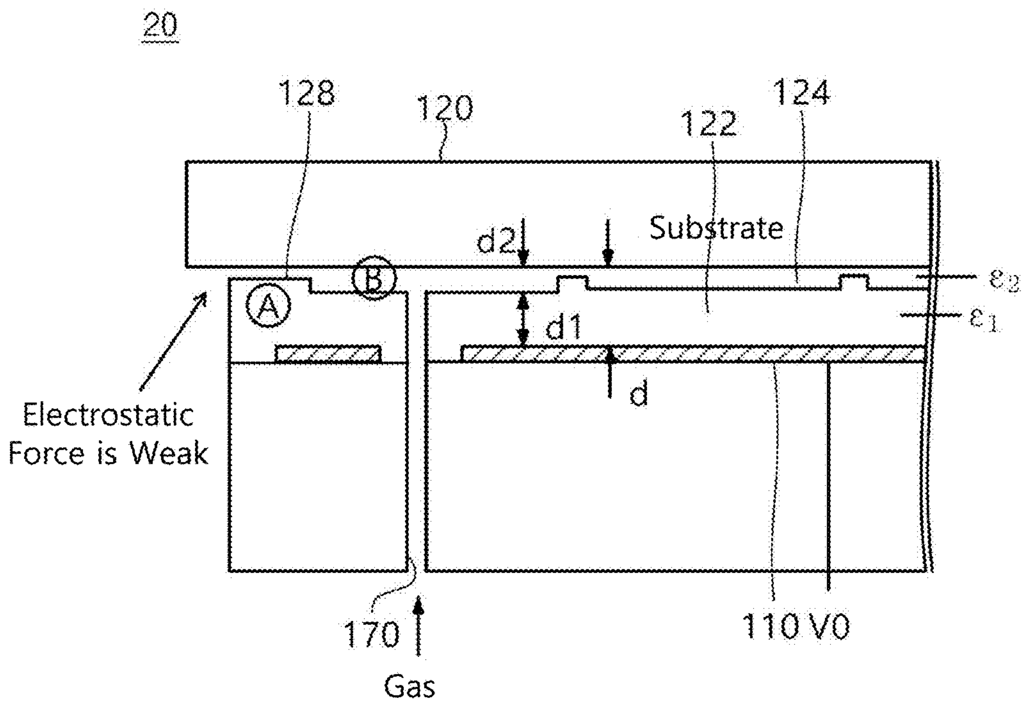
FIG. 30 is a conceptual diagram illustrating a conventional electrostatic device.
Figure 30:
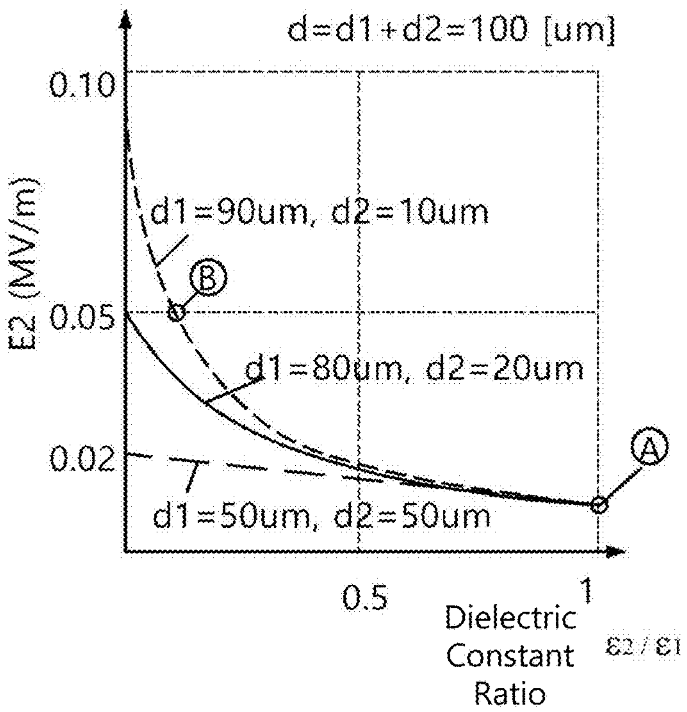

FIG. 30 is a conceptual diagram illustrating a conventional electrostatic device.

Referring to FIG. 30, in an electrostatic device 20, a first dielectric layer 122 and a second dielectric layer 124 may be disposed between a first electrode 110 and a second electrode 120. The second dielectric layer 124 may be an air gap. In addition, the first dielectric layer 122 may protrude on an edge of the first dielectric layer 122. The protrusion part 128 may prevent a gas, supplied through a gas line 170, from leaking to the outside. The second electrode 120 may be a semiconductor substrate.

However, a magnitude of an electric field at the protrusion part may correspond to point A, and may be a value obtained by dividing an applied voltage by a distance d and be relatively small. Accordingly, an electric field (point A) at the protrusion part may be lower than the electric field in a gap space (point B), so that adsorption force may be low due to a low electric field. As a result, a gas may leak through the protrusion part.

Even when the protrusion part 128 is subjected to a roughening treatment, the roughening treatment may reduce a thickness of the gap space to locally increase the electric field and electrostatic force. However, stable electrostatic force may not be provided in all areas. In addition, the roughening treatment may provide a path through which a cooling gas, such as helium, leaks out. On the other hand, when a roughened area is increased to suppress gas leakage, the cooling performance of the gas may be reduced. In addition, the roughening treatment is susceptible to contamination. In addition, due to wearing, it may be difficult to provide stable characteristics.

While the Coulomb type has been described above, but similar issues occur in the Johnson-Rahbek type.

Figure 31:
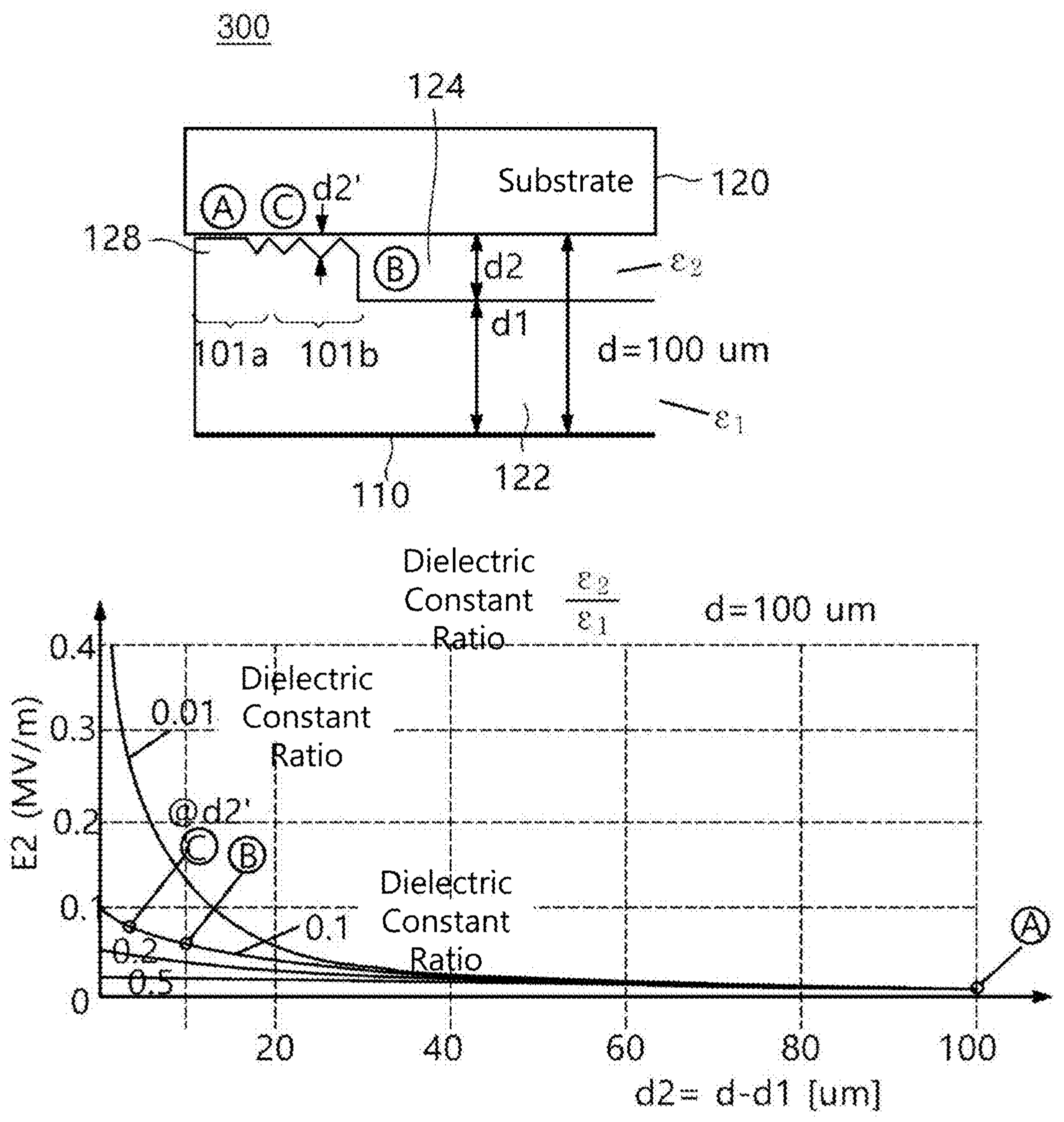
FIGS. 31 to 33 are conceptual diagrams illustrating an electrostatic device according to an embodiment of the present disclosure.
Figure 32:
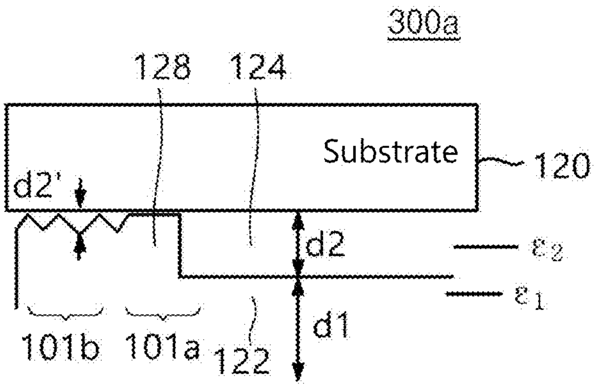
Figure 33:
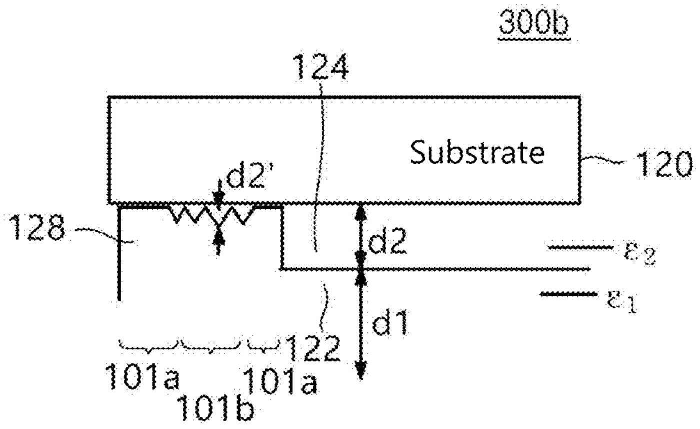

FIGS. 31 to 33 are conceptual diagrams illustrating an electrostatic device according to an embodiment of the present disclosure.

Referring to FIG. 31, an electrostatic device 300 includes an electrostatic electrode layer 110; a dielectric layer 122 disposed on the electrostatic electrode layer 100; and a ring-shaped protrusion part 128 disposed on an edge of the dielectric layer 122. The protrusion part 128 may form a concave area, and the concave area may be filled with a cooling gas. The protrusion part 128 may include a flat area 101*a* and a surface treatment area 101*b* to which a roughening treatment has been performed.

The dielectric layer 122 may include an embossed area inside the protrusion part 128, and the embossed area may be maintained at a constant distance from a second electrode or a substrate.

A magnitude of an electric field in the flat area 101*a* may correspond to point A, an electric field in the surface treatment area may correspond to point C, and an electric field in the concave area may correspond to point B.

The surface treatment area 101*b* with a roughened surface may provide a high electric field (electrostatic force), and the flat area 101*a* may perform a gas sealing function to prevent gas leakage.

The flat area 101*a* may be disposed on an outer side and the surface treatment area 101*b* may be disposed on an inner side. Accordingly, deposition of contaminants on the surface treatment area may be suppressed.

A width of the surface treatment area may be greater than a width of the flat area. Accordingly, the electrostatic force may increase.

A roughness of the surface treatment area may be 0.1 μm to 1 μm. A ratio of a maximum height d2' of the roughness to a total thickness d (d2'/d) in the roughening treatment may be 0.001 to 0.01.

When a dielectric constant ratio ε2/ε1 is 0.1 and the total thickness d of the dielectric layer is 100 μm, a change in gap d2' caused by the roughness is not large. Accordingly, a fine roughening treatment may be easily affected by contamination.

When the total thickness d of the dielectric layer is 100 μm, the height d2 of the protrusion part may be 5 μm to 20 μm. The height d2 of the protrusion part may depend on a pressure of the cooling gas and the type of gas. As the height d2 of the protrusion part increases, the magnitude of the electric field may be reduced to reduce electrostatic force. A ratio of the height d2 of the protrusion part to the total thickness d of the dielectric layer may be less than 0.2.

In the case of Coulomb type, in the case in which the electrical conductivity ratio is taken into consideration (for example, in the case in which the electrical conductivity ratio is 10), a relaxation time may be reduced when a ratio of the maximum height d2' of the roughness (d2'/d) is significantly small. A short relaxation time may reduce the magnitude of the electric field over time. Accordingly, the ratio of the maximum height d2' (d2'/d) of the roughness may be 0.001 to 0.01.

While the Coulomb type has been described above, but it may be similarly applied to the Johnson-Rahbek type.

In the Johnson-Rahbek type, in the case in which the electrical conductivity ratio is less than 0.1 (for example, in the case in which the electrical conductivity ratio is 0.01), referring to FIG. 5, a magnitude of the electric field may rapidly change depending on the air gap d2'. Such a characteristic may reduce stability depending on a surface roughness of the adsorbate, or the like. In addition, when the surface roughness decreases, the electric field may be increased, so that fine discharging may be increased to reduce stability. On the other hand, referring to FIG. 9, when the maximum height ratio d2'/d is less than 0.01, the relaxation time may increase. Accordingly, when a rapid relaxation time is taken into consideration, the maximum height ratio d2'/d may be 0.01 or more. Based on d=100 μm, d2' may be 1 μm or more.

Referring to FIG. 32, an electrostatic device 300*a* includes an electrostatic electrode layer 110; a dielectric layer 122 disposed on the electrostatic electrode layer 100; and a ring-shaped protrusion part 128 disposed on an edge of the dielectric layer 122. The protrusion part 128 may form a concave area, and the concave area may be filled with a cooling gas. The protrusion part 128 may include a flat area 101*a* and a surface treatment area 101*b* to which a roughening treatment has been performed.

The flat area 101*a* may be disposed on an inner side and the surface treatment area 101*b* may be disposed on the outside Referring to FIG. 33, an electrostatic device 300*b* includes an electrostatic electrode layer 110; a dielectric layer 122 disposed on the electrostatic electrode layer 100; and a ring-shaped protrusion part 128 disposed on an edge of the dielectric layer 122. The protrusion part 128 may form a concave area, and the concave area may be filled with a cooling gas. The protrusion part 128 may include a flat area 101*a* and a surface treatment area 101*b* to which a roughening treatment has been performed.

The flat area 101*a* may include a first flat area and a second flat area, and the surface treatment area 101*b* may be disposed between the first flat area and the second flat area. Accordingly, balance of forces may be maintained.

Figure 34:
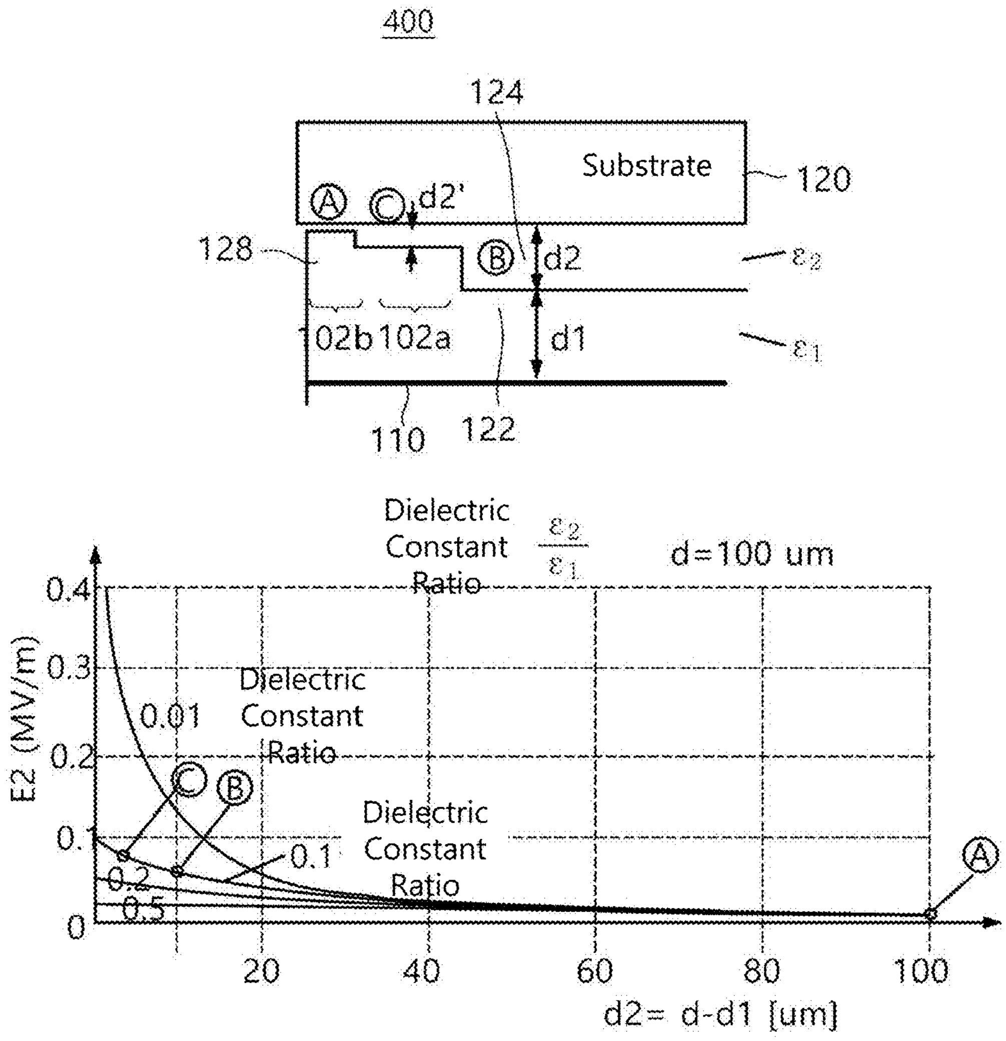
FIGS. 34 to 36 are conceptual diagrams illustrating an electrostatic device according to an embodiment of the present disclosure.
Figure 35:
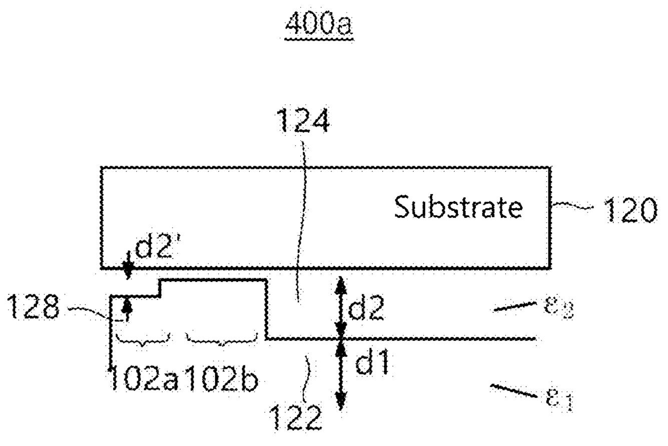
Figure 36:
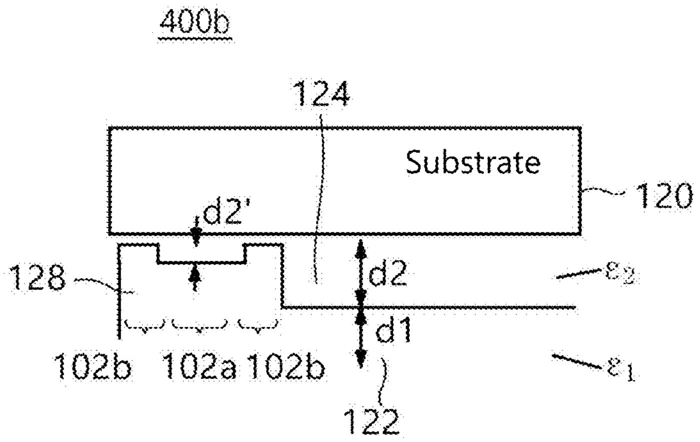

FIGS. 34 to 36 are conceptual diagrams illustrating an electrostatic device according to an embodiment of the present disclosure.

Referring to FIG. 34, an electrostatic device 400 includes an electrostatic electrode layer 110; a dielectric layer 122 disposed on the electrostatic electrode layer; and a ring-shaped first protrusion part 102*a* disposed on the edge of the dielectric layer 122 and a ring-shaped second protrusion part 102*b* further protruding from the first protrusion part 102*a*. The second protrusion part or the first protrusion part may form a concave area, and the concave area may be filled with a cooling gas.

When a dielectric constant ratio ε2/ε1 is 0.1, an electric field of the second protrusion part 102*b* may correspond to point A, an electric field of the first protrusion part 102*a* may correspond to point C, and an electric field of the concave area may correspond to point B. Accordingly, the first protrusion part may stably provide a high electric field to locally increase electrostatic force. Such a step structure is more resistant to contamination than a roughening treatment and thus may have improved reproducibility.

The second protrusion part 102*b* may be disposed on an outer side to surround the first protrusion part 102*a*. A width of the first protrusion part 102*a* may be greater than a width of the second protrusion part 102*a*.

A height of the first protrusion part 102*a* may be ½ to 19/20 of a height of the second protrusion part 102*b*. For example, when the height of the second protrusion part 102*b* is 10 μm, a gap d2' may be 5 μm to 0.5 μm. When the gap d2' is significantly small, susceptibility to contamination may occur.

When a thickness of the dielectric layer 122 is 100 μm, the height d2 of the second protrusion part may be 5 μm to 20 μm.

While the Coulomb type has been described above, but it may similarly applied to the Johnson-Rahbek type.

Referring to FIG. 35, an electrostatic device 400*a* includes an electrostatic electrode layer 110; a dielectric layer 122 disposed on the electrostatic electrode layer; and a ring-shaped first protrusion part 102*a* disposed on the edge of the dielectric layer 122 and a ring-shaped second protrusion part 102*b* more protruding than the first protrusion part 102*a*. The second protrusion part or the first protrusion part may form a concave area, and the concave area may be filled with a cooling gas.

The first protrusion part 102*a* may be disposed on an outer side to surround the second protrusion part 102*b*.

Referring to FIG. 36, an electrostatic device 400*b* includes an electrostatic electrode layer 110; a dielectric layer 122 disposed on the electrostatic electrode layer; and a ring-shaped first protrusion part 102*a* disposed on the edge of the dielectric layer 122 and a ring-shaped second protrusion part 102*b* more protruding than the first protrusion part 102*a*. The second protrusion part or the first protrusion part may form a concave area, and the concave area may be filled with a cooling gas.

The second protrusion part 102*a* may include a second inner protrusion parts and second outer protrusion part spaced apart from each other. The first protrusion part 102*a* may be disposed between the second inner protrusion part and the second outer protrusion part.

FIGS. 37 to 44 are conceptual diagrams illustrating an electrostatic device according to an embodiment of the present disclosure.

Figure 37:
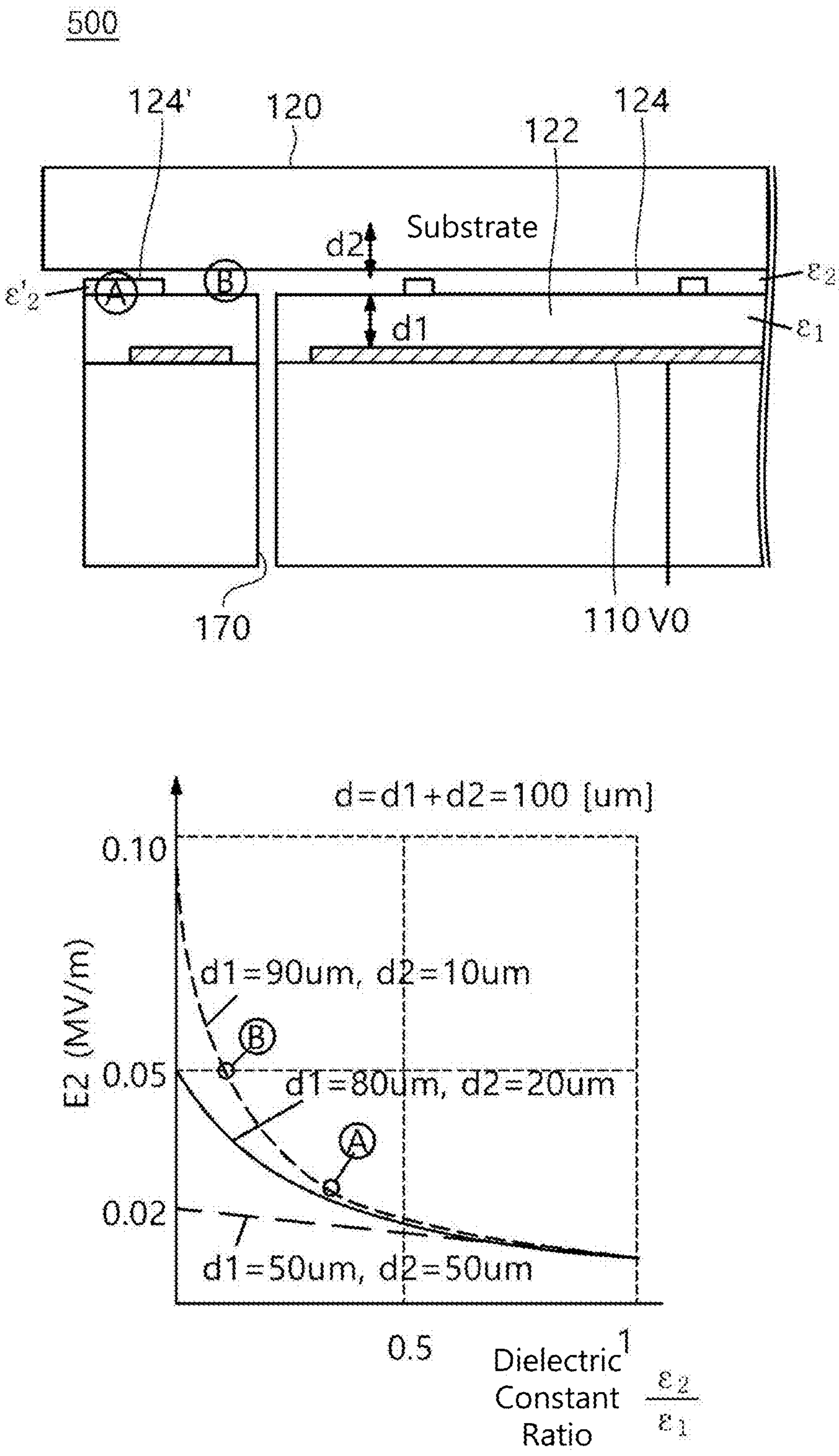
FIGS. 37 to 44 are conceptual diagrams illustrating an electrostatic device according to an embodiment of the present disclosure.

Referring to FIG. 37, an electrostatic device 500 includes an electrostatic electrode layer; a first dielectric layer 122 disposed on the electrostatic electrode layer; and a ring-shaped second dielectric layer 124' disposed on an edge of the first dielectric layer 122. The second dielectric layer 124' may form a concave area 124 in the form of an air gap. The concave area may be filled with a cooling gas.

The cooling gas may be connected to the air gap through a flow path 170 penetrating through the first dielectric layer 122.

A second dielectric constant ε2' of the second dielectric layer 124' may be smaller than a first dielectric constant ε1 of the first dielectric layer 122. The concave area, as the air gap, may have a second main dielectric constant ε2 as the air gap. The second dielectric constant ε2' of the second dielectric layer 124' may be greater than the second main dielectric constant ε2 of the air gap.

When the dielectric constant ratio ε2/ε1 is 0.1, an electric field of the second dielectric layer 124' may corresponds to point A. Also, an electric field of the concave area may correspond to point B. Accordingly, the electric field of the second dielectric layer 124' may be relatively increased to provide strong electrostatic force.

For example, when the first dielectric constant ratio ε2/ε1 is 0.1, a second dielectric constant ε2' of the second dielectric layer 124' may be set to be smaller than the first dielectric constant ε1 of the first dielectric layer 122. Accordingly, when a second dielectric constant ratio ε2'/ε1 is changed to about 0.4, a magnitude of the electric field of the second dielectric layer 124' may be relatively increased. That is, the first dielectric layer may be an aluminum oxide, the second dielectric layer 124' may be a silicon oxide, and the second main dielectric layer 124 may be an air gap. A thickness d2 of the second dielectric layer 124' may be 0.01 to 0.2 with respect to a total thickness d of the dielectric.

Figure 38:
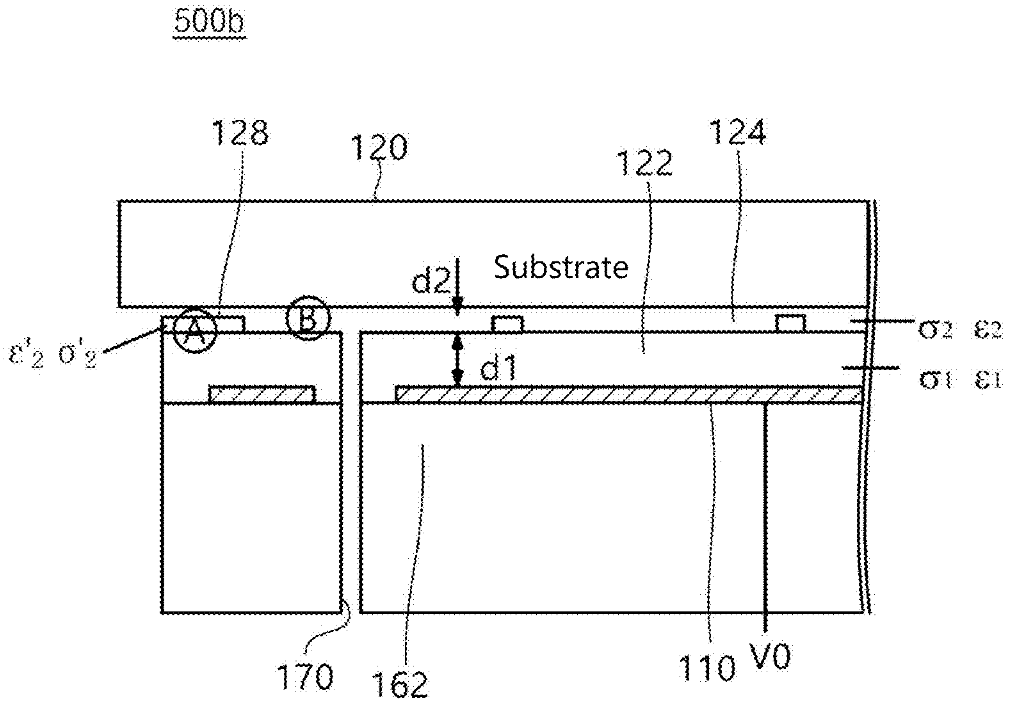
Figure 38:
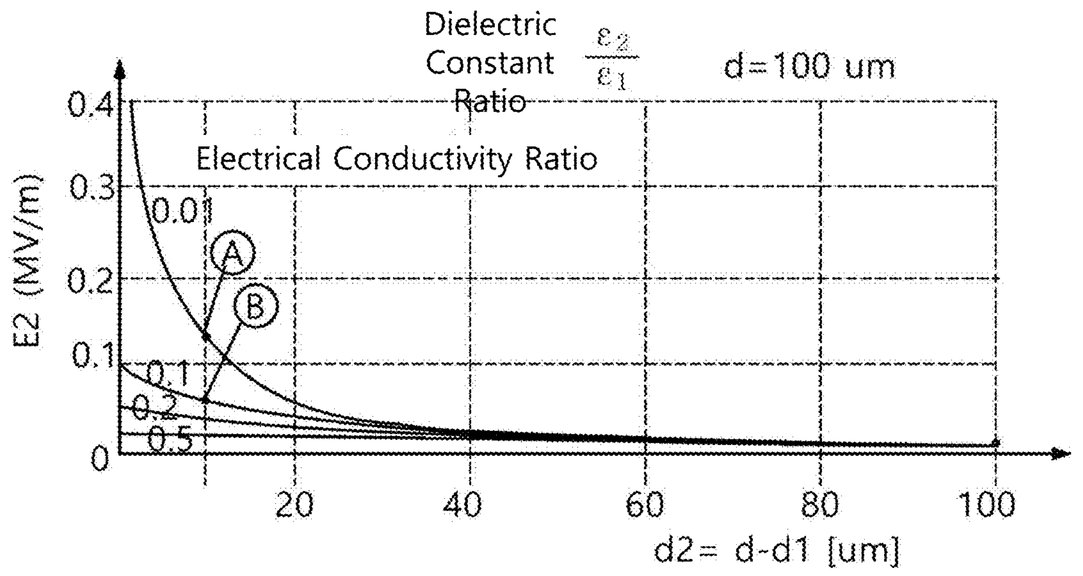

Referring to FIG. 38, an electrostatic device **500*b* includes an electrostatic electrode layer; a first dielectric layer 22 disposed on the electrostatic electrode layer; and a ring-shaped second dielectric layer 124' disposed on an edge of the first dielectric layer 122. The second dielectric layer 124' may form a concave area 124** in the form of an air gap. The concave area may be filled with a cooling gas.

The cooling gas may be connected to the air gap through a flow path 170 penetrating through the first dielectric layer 122.

The second dielectric layer 124' may have second electrical conductivity σ2' and a second dielectric constant ε2'. The concave area 124 may have second main electrical conductivity σ2 and a second main dielectric constant ε2. The first dielectric layer 122 may have first electrical conductivity σ1 and a first dielectric constant ε1.

The second main electrical conductivity σ2 may be smaller than the first electrical conductivity 61. In addition, the second electrical conductivity σ2' may be smaller than the first electrical conductivity σ1.

When an electrical conductivity ratio σ2/σ1 is 0.01, an electric field in the second dielectric layer may be point A. When an electrical conductivity ratio σ2'/σ1 is 0.1, an electric field in the concave area may be point B.

Accordingly, the ring-shaped second dielectric layer 124' may have a higher electric field than the concave area (air gap). Accordingly, gas leakage may be suppressed.

Figure 39:
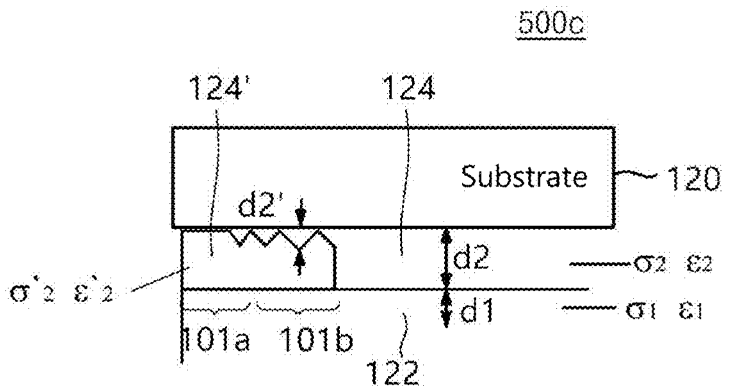

Referring to FIG. 39, in an electrostatic device **500*c*, a second dielectric layer 124' may include a flat area 101*a* and a surface treatment area 101*b* to which a roughening treatment has been performed. The flat area 101*a*** may be disposed outside the surface treatment area.

In the case of Coulomb type, a magnitude of an electric field may increase when a second dielectric constant ε2' of the second dielectric layer 124' is reduced more than a first dielectric constant ε1 of the first dielectric layer 122 and an air gap is formed by the roughening treatment.

In the case of Johnson-Rahbek type, a magnitude of an electric field may increase when second electrical conductivity σ2' of the second dielectric layer 124 is reduced more than the first electrical conductivity σ1 of the first dielectric layer 122 and an air gap is formed by the roughening treatment.

Figure 40:
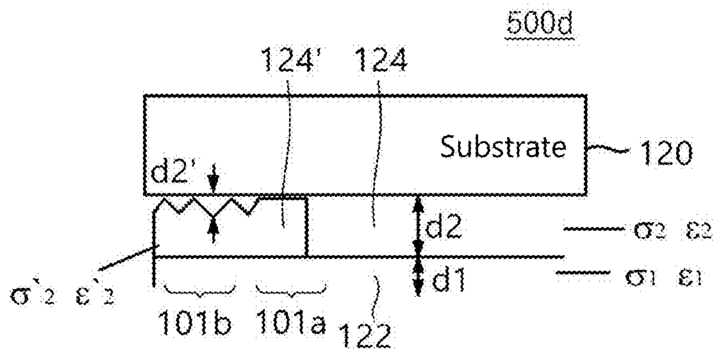

Referring to FIG. 40, in an electrostatic device **500*d*, a flat area 101*a*** may be disposed on an outer side of a surface treatment area.

In the case of Coulomb type, a magnitude of an electric field may increase when a second dielectric constant ε2' of the second dielectric layer 124' is reduced more than a first dielectric constant ε1 of the first dielectric layer 122 and an air gap is formed by a roughening treatment.

In the case of Johnson-Rahbek type, a magnitude of an electric field may increase when a second electrical conductivity σ2' of the second dielectric layer 124 is reduced more than first electrical conductivity σ1 of the first dielectric layer 122 and an air gap is formed by a roughening treatment.

Figure 41:
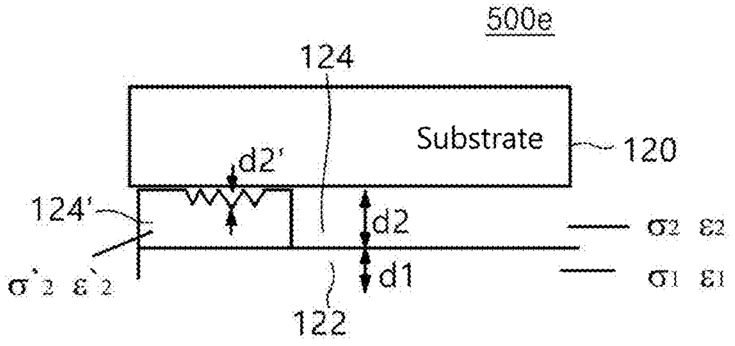

Referring to FIG. 41, in an electrostatic device **500*e*, a flat area 101*a* may be disposed on an outer side of a surface treatment area. A second dielectric layer 124' may include a flat area 101*a* and a surface treatment area 101*b* to which a roughening treatment has been performed. The flat area 101*a* may be disposed between surface treatment areas 101*b*** spaced apart from each other.

In the case of Coulomb type, a magnitude of an electric field may increase when a second dielectric constant ε2' of the second dielectric layer 124' is reduced more than a first dielectric constant ε1 of the first dielectric layer 122 and an air gap is formed by a roughening treatment.

In the case of Johnson-Rahbek type, a magnitude of an electric field may increase when second electrical conductivity σ2' of the second dielectric layer 124 is reduced more than first electrical conductivity σ1 of the first dielectric layer 122 and an air gap is formed by the roughening treatment.

Figure 42:
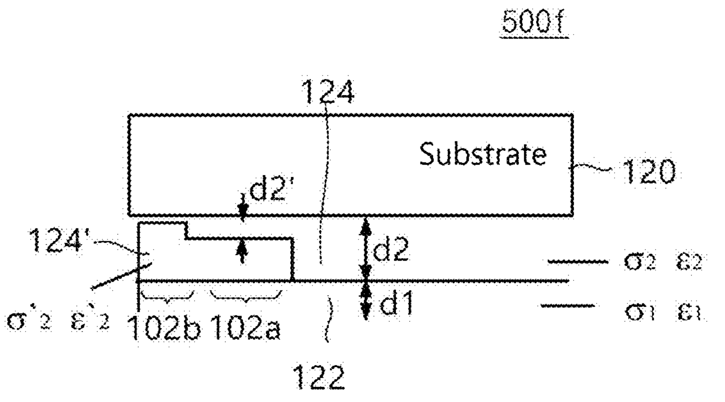

Referring to FIG. 42, an electrostatic device **500*f* includes an electrostatic electrode layer; a first dielectric layer 22 disposed on the electrostatic electrode layer; and a ring-shaped second dielectric layer 124' disposed on an edge of the first dielectric layer 122. The second dielectric layer 124' may form a concave area 124** in the form of an air gap. The concave area may be filled with a cooling gas.

The second dielectric layer 124' may include a first protrusion area **102*a* and a second protrusion area 102*b*** more protruding than the first protrusion area. The second protrusion area may be disposed outside the first protrusion area.

In the case of Coulomb type, a magnitude of an electric field may increase when a second dielectric constant ε2' of the second dielectric layer 124' is reduced more than a first dielectric constant ε1 of the first dielectric layer 122 and an air gap is formed by a step treatment.

In the case of Johnson-Rahbek type, a magnitude of an electric field may increase when second electrical conductivity σ2' of the second dielectric layer 124 is reduced more than first electrical conductivity σ1 of the first dielectric layer 122 and an air gap is formed by a step treatment.

Figure 43:
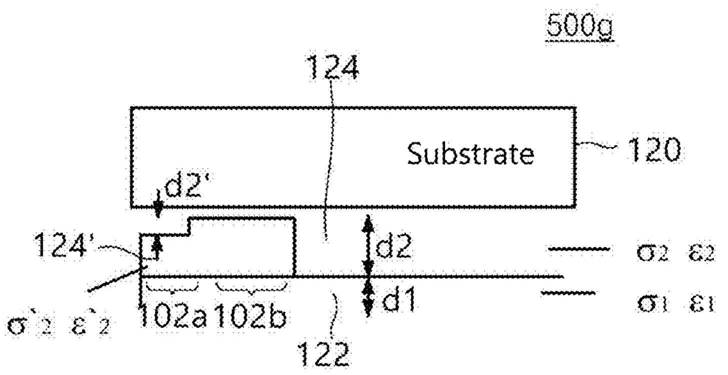

Referring to FIG. 43, in an electrostatic device **500*g*, a second dielectric layer 124' may include a first protrusion area 102***a* and a second protrusion area 102*b* more protruding than the first protrusion area. The first protrusion area may be disposed outside the second protrusion area.

Figure 44:
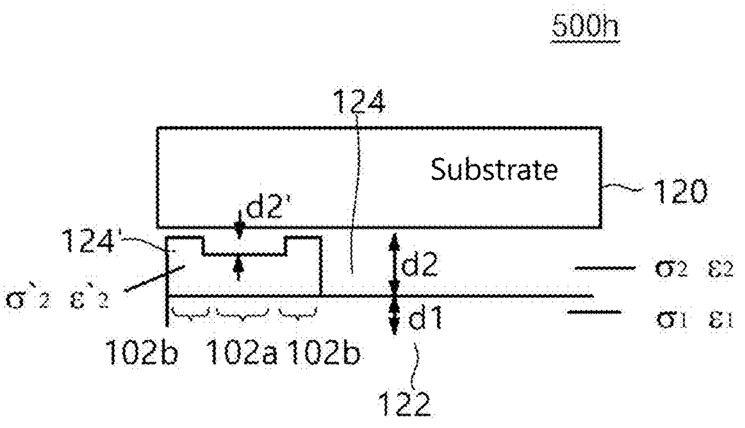

Referring to FIG. 44, in an electrostatic device 500*h*, a second dielectric layer 124' may include a first protrusion area 102*a* and a second protrusion area 102*b* more protruding than the first protrusion area. The second protrusion areas may be spaced apart from each other, and the first protrusion area may be disposed between the second protrusion areas.

Figure 45:
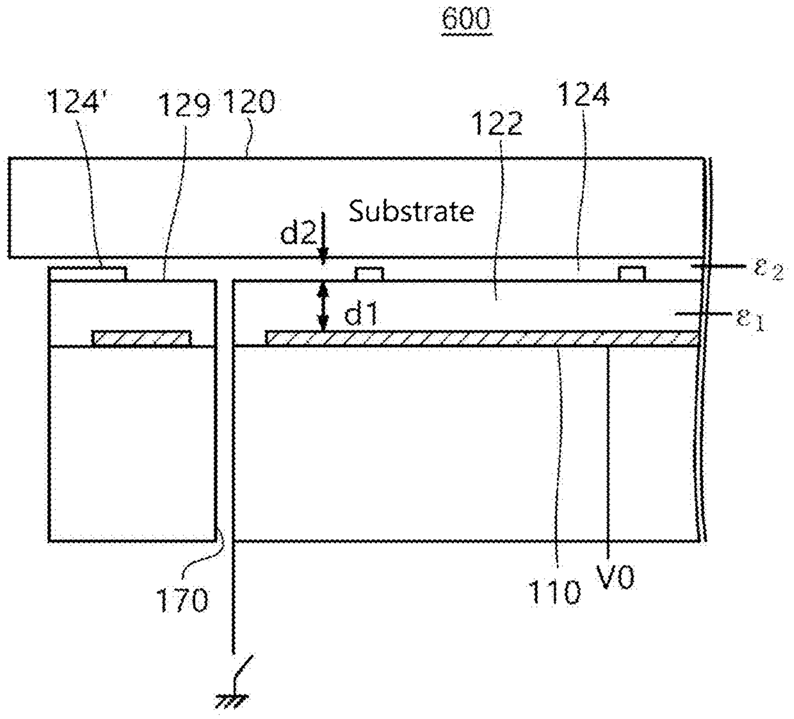
FIG. 45 is a conceptual diagram illustrating an electrostatic device according to an embodiment of the present disclosure.

FIG. 45 is a conceptual diagram illustrating an electrostatic device according to an embodiment of the present disclosure.

Referring to FIG. 45, an electrostatic device 600 includes a first dielectric layer 122 and a second dielectric layer 124 stacked between a first electrode 110 and a second electrode 120. The first dielectric layer 122 may have a first dielectric constant ε1 and first electrical conductivity σ1 and have a thickness d1. The second dielectric layer 124 may have a second dielectric constant ε2 and second electrical conductivity σ2 and have a thickness d2. A second preliminary dielectric layer 124' may be a material that is identical to or different from a material of the first dielectric layer 122. The second dielectric layer 124 may be an air gap or a vacuum gap.

A conductive layer 129 may be disposed between the first dielectric layer 122 and the second dielectric layer 124. The conductive layer 129 is significantly thin compared to the first dielectric layer 122 or the second dielectric layer 122. Even when the conductive layer 129 is present, an electric field and the interface surface charge density may operate in the same manner.

The conductive layer 129 may be preferably exposed to an air gap. Referring to FIG. 27, when another dielectric layer 124 is present on the conductive layer 129, interface charges may be newly accumulated between the air gap 126 and the another dielectric layer 124.

Referring to FIG. 45 again, a flow path 170 may provide a cooling gas to the air gap through the first dielectric layer 122. An inner surface of the flow path 170 may be coated with a conductive material.

The conductive layer 129 may accumulate interface surface charges. The accumulated interface charges may be connected to ground through a conductive material and a switch of the flow path to be removed. The conductive layer 129 may be a semiconductor or a conductor. Parasitic discharging may be suppressed by coating the channel with a conductive material.

According to a modified embodiment of the present invention, a conductive layer may be a photoconductive layer (for example, CdS). Accordingly, when light is irradiated, resistance of the photoconductive layer may be reduced to remove interface degradation externally.

Figure 46:
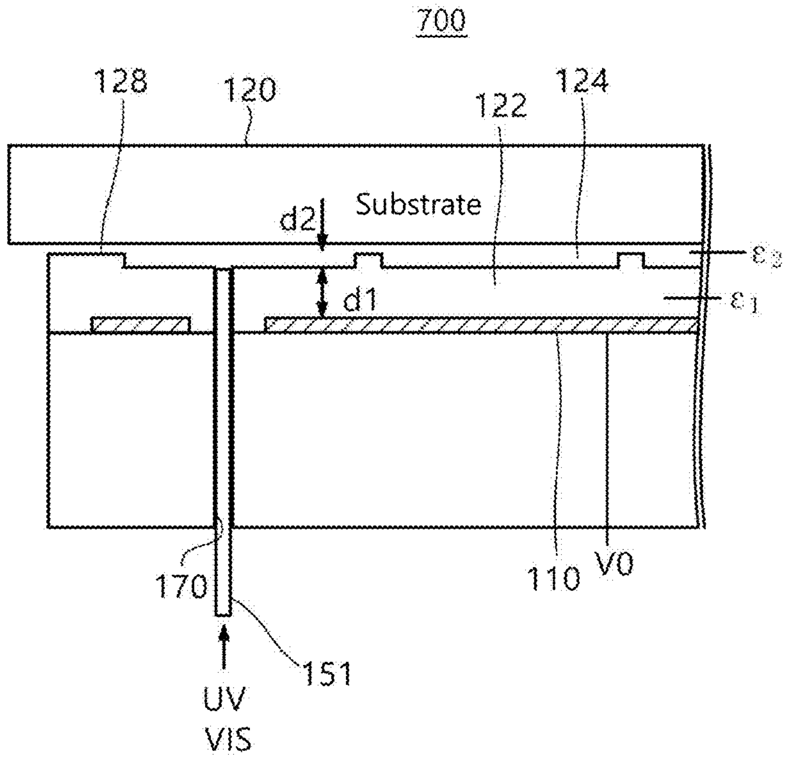
FIG. 46 is conceptual diagram illustrating an electrostatic device according to an embodiment of the present disclosure.

FIG. 46 is conceptual diagram illustrating an electrostatic device according to an embodiment of the present disclosure.

Referring to FIG. 46, an electrostatic device 700 includes a first dielectric layer 122 and a second dielectric layer 124 stacked between a first electrode 110 and a second electrode 120. The first dielectric layer 122 may have a first dielectric constant ε1 and first electrical conductivity σ1 and have a thickness d1. The second dielectric layer 124 may have a second dielectric constant ε2 and second electrical conductivity σ2 and have a thickness d2. A protrusion part 128 may be a material that is identical to or different from a material of the first dielectric layer. The second dielectric layer 124 may be an air gap or a vacuum gap.

A through-hole 170 may penetrate through the first dielectric layer 122 to be connected to the air gap. An optical fiber 151 may be disposed in the through-hole. The optical fiber 151 may provide visible light or ultraviolet to an interface of a dielectric. Accordingly, accumulated interface charges may be removed by the visible light or ultraviolet.

A surface of the first dielectric layer, providing a lower surface of a gap space, may be roughened for light diffusion.

An electrostatic device 700 according to an embodiment of the present disclosure includes an electrostatic electrode layer 110; dielectric layers 122 and 124 disposed on the electrostatic electrode layer; and a light-providing part 151 providing ultraviolet to the dielectric layers 122 and 124. A method of dechucking the electrostatic device includes applying a first voltage V0 to the electrostatic electrode layer; removing the first voltage applied to the electrostatic electrode layer; providing light to the dielectric layer through the light-providing part 151; and removing charges accumulated on the dielectric layer or a rear surface of the substrate 120 disposed on the dielectric layer by the light.

Removing the first voltage applied to the electrostatic electrode layer and providing the light may be simultaneously performed. Accordingly, interface charges may be canceled by a relaxation time and also canceled by generation of electrons-holes by light.

The light may be provided after removing the first voltage applied to the electrostatic electrode layer. For example, the interface charges may be reduced or removed using a voltage pulse having polarity opposite to polarity of the first voltage applied to the electrostatic electrode, and the remaining interface charges may then be further removed by the light.

After removing the first voltage applied to the electrostatic electrode layer, the light may be irradiated simultaneously with providing charges of opposite polarity to the electrostatic electrode layer using a voltage pulse of polarity opposite to polarity of the first voltage, thereby further removing the interface charges.

While the embodiments of the present disclosure have been described, they may be combined with each other.

Although the present disclosure and its advantages have been described in detail, it should be understood that various changes, substitutions and alterations can be made herein without departing from the spirit and scope of the disclosure as defined by the following claims.

The invention claimed is:

1. An electrostatic device comprising:
an electrostatic electrode layer;
a dielectric layer on the electrostatic electrode layer; and
a ring-shaped protrusion part on an edge of the dielectric layer,
wherein
the ring-shaped protrusion part forms a concave area,
the concave area is filled with a cooling gas, and
the ring-shaped protrusion part comprises a flat area and a surface treatment area on which a roughening treatment has been performed.

2. The electrostatic device as set forth in claim 1, wherein the flat area is disposed on an outer side and the surface treatment area is disposed on the inner side.

3. The electrostatic device as set forth in claim 1, wherein the flat area is disposed on an inner side and the surface treatment area is disposed on an outer side.

4. The electrostatic device as set forth in claim 1, wherein the flat area comprises a first flat area and a second flat area, and the surface treatment area is between the first flat area and the second flat area.

5. The electrostatic device as set forth in claim 1, wherein a roughness of the surface treatment area is 0.1 μm to 1 μm.

6. The electrostatic device as set forth in claim 1, wherein a width of the surface treatment area is greater than a width of the flat area.

7. The electrostatic device as set forth in claim 1, wherein a height of the ring-shaped protrusion part is 5 micrometers to 20 micrometers.

8. An electrostatic device comprising:

an electrostatic electrode layer;

a dielectric layer on the electrostatic electrode layer;

a ring-shaped first protrusion part on an edge of the dielectric layer; and a ring-shaped second protrusion part further protruding from the ring-shaped first protrusion part, wherein the ring-shaped first protrusion part or the ring-shaped second protrusion part forms a concave area, and the concave area is filled with a cooling gas; and the dielectric layer comprises an embossed area inside the ring-shaped first protrusion part or the ring-shaped second protrusion part, and the embossed area is maintained at a constant distance from a substrate.

9. The electrostatic device as set forth in claim 8, wherein the ring-shaped second protrusion part is on an outer side to surround the ring-shaped first protrusion part.

10. The electrostatic device as set forth in claim 8, wherein the ring-shaped first protrusion part is on an outer side to surround the ring-shaped second protrusion.

11. The electrostatic device as set forth in claim 8, wherein the ring-shaped second protrusion part comprises a second inner protrusion part and a second outer protrusion part spaced apart from each other, and the ring-shaped first protrusion part is between the second inner protrusion part and the second outer protrusion part.

12. The electrostatic device as set forth in claim 8, wherein a height of the ring-shaped first protrusion part is ½ to $\frac{19}{20}$ of a height of the ring-shaped second protrusion part.

13. The electrostatic device as set forth in claim 8, wherein a height of the ring-shaped second protrusion part is 5 micrometers to 20 micrometers.

14. An electrostatic device comprising:

an electrostatic electrode layer;

a first dielectric layer on the electrostatic electrode layer; and a second ring-shaped dielectric layer on an edge of the first dielectric layer, wherein the second ring-shaped dielectric layer forms a concave area in a form of an air gap, and the concave area is filled with a cooling gas; and a second dielectric constant of the second dielectric layer is smaller than a first dielectric constant of the first dielectric layer.

15. The electrostatic device as set forth in claim 14, wherein a second electrical conductivity of the second ring-shaped dielectric layer is smaller than a first electrical conductivity of the first dielectric layer, and a second electrical conductivity of the second ring-shaped dielectric layer is smaller than an electrical conductivity of the air gap.

* * * * *